US012787587B2

(12) United States Patent
Nakamura et al.

(10) Patent No.: US 12,787,587 B2
(45) Date of Patent: Nov. 3, 2026

(54) DISPLAY APPARATUS

(71) Applicant: Semiconductor Energy Laboratory Co., Ltd., Atsugi (JP)

(72) Inventors: Daiki Nakamura, Atsugi (JP); Kenichi Okazaki, Atsugi (JP); Nozomu Sugisawa, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 277 days.

(21) Appl. No.: 18/575,967

(22) PCT Filed: Jun. 29, 2022

(86) PCT No.: PCT/IB2022/056029
§ 371 (c)(1),
(2) Date: Jan. 2, 2024

(87) PCT Pub. No.: WO2023/285903
PCT Pub. Date: Jan. 19, 2023

(65) Prior Publication Data
US 2024/0341148 A1 Oct. 10, 2024

(30) Foreign Application Priority Data
Jul. 16, 2021 (JP) ................................. 2021-117962

(51) Int. Cl.
*H10K 59/35* (2023.01)
*H10K 50/17* (2023.01)
(Continued)

(52) U.S. Cl.
CPC ......... *H10K 59/353* (2023.02); *H10K 50/171* (2023.02); *H10K 59/873* (2023.02); *H10K 2102/351* (2023.02)

(58) Field of Classification Search
CPC .. H10K 59/353; H10K 50/171; H10K 59/873; H10K 2102/351; H10K 59/00;
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 001367938 A 9/2002
CN 109509765 A 3/2019
(Continued)

OTHER PUBLICATIONS

International Search Report (Application No. PCT/IB2022/056029) Dated Sep. 27, 2022.
(Continued)

*Primary Examiner* — Shahed Ahmed
(74) *Attorney, Agent, or Firm* — Eric J. Robinson; Robinson Intellectual Property Law Office, P.C.

(57) ABSTRACT

A display apparatus with high display quality is provided. The display apparatus includes a first light-emitting device and a second light-emitting device adjacent to each other and a first insulating layer. The first light-emitting device includes a first pixel electrode, a first EL layer over the first pixel electrode, and a common electrode over the first EL layer and the first insulating layer. The second light-emitting device includes a second pixel electrode, a second EL layer over the second pixel electrode, and the common electrode over the second EL layer and the first insulating layer. The first insulating layer is in contact with a side surface of the first EL layer and a side surface of the second EL layer. The thickness of the first pixel electrode is smaller than the thickness of the second pixel electrode and the thickness of
(Continued)

the first EL layer is larger than the thickness of the second EL layer.

13 Claims, 31 Drawing Sheets

(51) Int. Cl.
*H10K 59/80* (2023.01)
*H10K 102/00* (2023.01)

(58) Field of Classification Search
CPC .. H10K 59/8051; H10K 59/122; H10K 59/35; H10K 59/121; H10K 59/8052; H10K 59/10–221; H10K 50/00–88; H10K 50/81–818; H05B 33/12; H05B 33/22
See application file for complete search history.

(56) References Cited

U.S. PATENT DOCUMENTS

| | | | | |
|---|---|---|---|---|
| 6,791,261 | B1 * | 9/2004 | Shimoda | G02B 5/285 313/506 |
| 7,399,991 | B2 | 7/2008 | Seo et al. | |
| 7,663,149 | B2 | 2/2010 | Seo et al. | |
| RE43,759 | E | 10/2012 | Shimoda et al. | |
| RE44,164 | E | 4/2013 | Shimoda et al. | |
| RE45,442 | E | 3/2015 | Shimoda et al. | |
| 11,785,827 | B2 | 10/2023 | Yamazaki et al. | |
| 2002/0072139 | A1 | 6/2002 | Kashiwabara | |
| 2011/0148290 | A1 | 6/2011 | Oota | |
| 2011/0177640 | A1 * | 7/2011 | Han | H10K 59/8051 438/34 |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0280839 | A1 | 10/2013 | Sonoda et al. | |
| 2013/0295705 | A1 | 11/2013 | Sonoda et al. | |
| 2014/0004640 | A1 | 1/2014 | Hamaguchi et al. | |
| 2014/0004642 | A1 | 1/2014 | Otsuka et al. | |
| 2015/0060826 | A1 | 3/2015 | Matsumoto et al. | |
| 2015/0069360 | A1 | 3/2015 | Sato | |
| 2015/0076476 | A1 | 3/2015 | Odaka et al. | |
| 2016/0172595 | A1 | 6/2016 | Malinowski et al. | |
| 2016/0315133 | A1 | 10/2016 | Sato | |
| 2017/0141167 | A1 | 5/2017 | Naganuma | |
| 2017/0256754 | A1 | 9/2017 | Defranco et al. | |
| 2018/0190908 | A1 | 7/2018 | Ke et al. | |
| 2020/0057330 | A1 | 2/2020 | Yamazaki et al. | |
| 2020/0203662 | A1 | 6/2020 | Mollard et al. | |
| 2023/0354636 | A1 * | 11/2023 | Hao | H10K 50/18 |

FOREIGN PATENT DOCUMENTS

| | | | |
|---|---|---|---|
| EP | 1739763 | A | 1/2007 |
| JP | 2000-036385 | A | 2/2000 |
| JP | 2002-324673 | A | 11/2002 |
| JP | 2003-059663 | A | 2/2003 |
| JP | 2003-528421 | | 9/2003 |
| JP | 2004-139917 | A | 5/2004 |
| JP | 2008-098106 | A | 4/2008 |
| JP | 2008-147072 | A | 6/2008 |
| JP | 2008-251270 | A | 10/2008 |
| JP | 2009-259570 | A | 11/2009 |
| JP | 2014-022221 | A | 2/2014 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-162877 | A | 9/2016 |
| JP | 2016-197494 | A | 11/2016 |
| JP | 2019-179696 | A | 10/2019 |
| JP | 2020-160305 | A | 10/2020 |
| KR | 2002-0034088 | A | 5/2002 |
| KR | 2006-0013434 | A | 2/2006 |
| KR | 2017-0127954 | A | 11/2017 |
| WO | WO-2000/076010 | | 12/2000 |
| WO | WO-2018/087625 | | 5/2018 |

OTHER PUBLICATIONS

Written Opinion (Application No. PCT/IB2022/056029) Dated Sep. 27, 2022.
Zakhidov.A et al., "Orthogonal processing: A new strategy for organic electronics", Chem. Sci. (Chemical Science), Apr. 7, 2011, vol. 2, No. 6, pp. 1178-1182.
Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.
Papadopoulos.N et al., "AMOLED Displays with In-Pixel Photodetector", Liquid Crystals and Display Technology, Jul. 9, 2020, pp. 1-19.
Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.
Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.
Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.
Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

FIG. 25A
100G
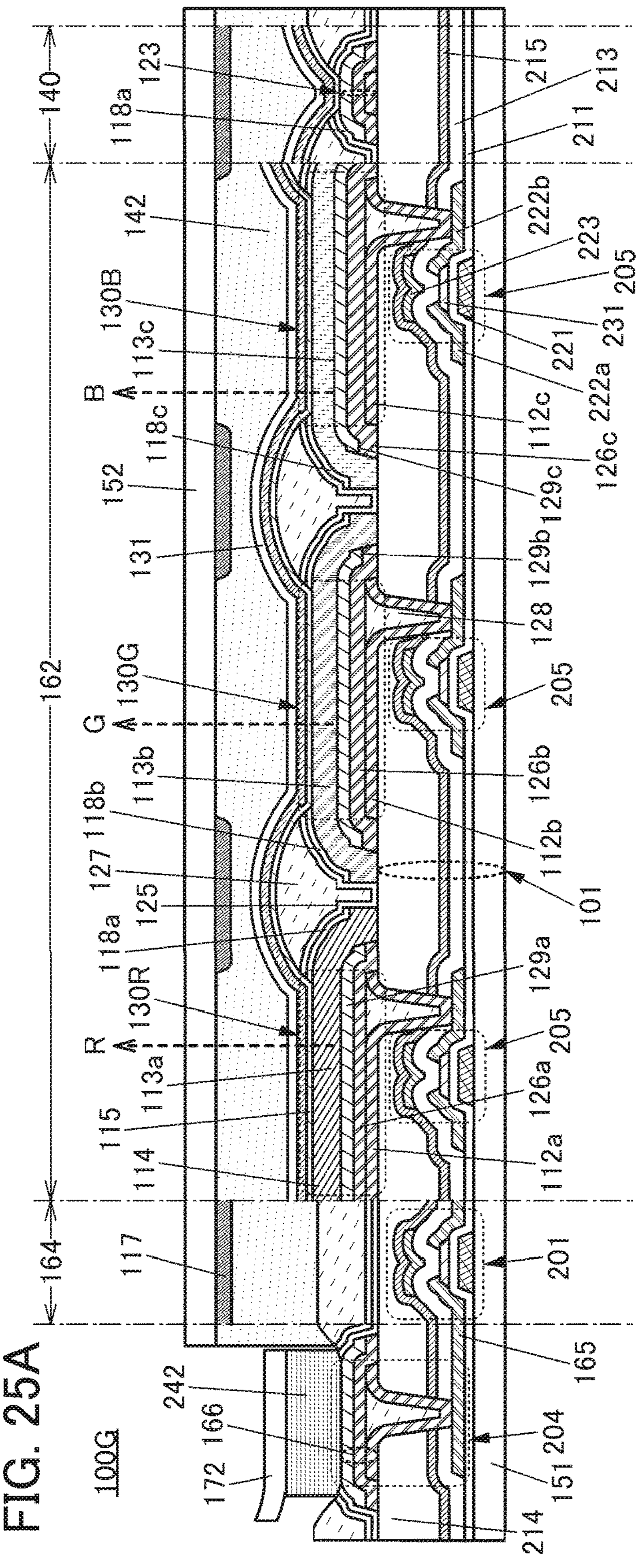
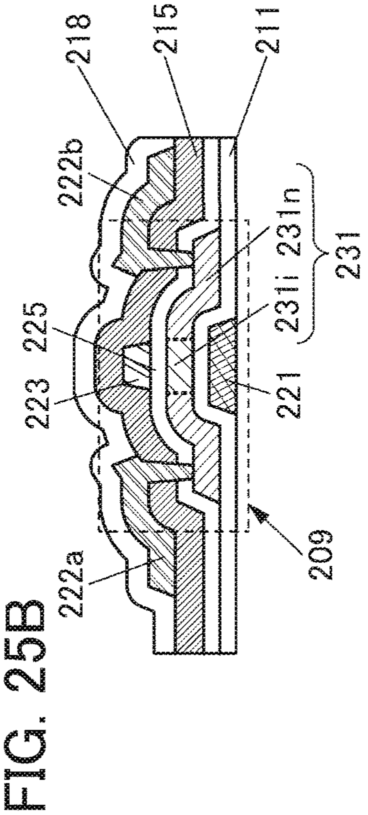
FIG. 25B
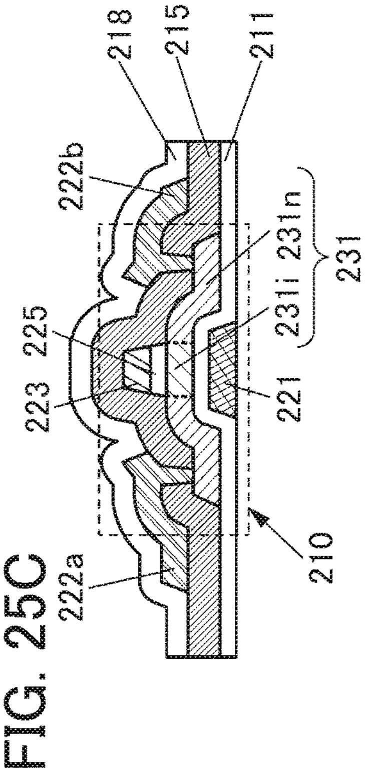
FIG. 25C

DISPLAY APPARATUS

TECHNICAL FIELD

One embodiment of the present invention relates to a display apparatus.

Note that one embodiment of the present invention is not limited to the above technical field. Examples of a technical field of one embodiment of the present invention disclosed in this specification and the like include a semiconductor device, a display apparatus, a light-emitting apparatus, a power storage device, a memory device, an electronic device, a lighting device, an input device, an input/output device, a driving method thereof, and a fabrication method thereof. A semiconductor device refers to any device that can function by utilizing semiconductor characteristics.

BACKGROUND ART

In recent years, higher-resolution display panels have been required. Examples of devices that require high-resolution display panels include a smartphone, a tablet terminal, and a notebook computer. Furthermore, higher resolution has been required for a stationary display apparatus such as a television device or a monitor device along with an increase in definition. An example of a device required to have the highest resolution is a device for virtual reality (VR) or augmented reality (AR).

Examples of a display apparatus that can be used for a display panel include, typically, a liquid crystal display apparatus, a light-emitting apparatus including a light-emitting element such as an organic EL (Electro Luminescence) element (also referred to as an organic EL device) or a light-emitting diode (LED), and electronic paper performing display by an electrophoretic method or the like.

For example, the basic structure of an organic EL element is a structure where a layer containing a light-emitting organic compound is interposed between a pair of electrodes. By voltage application to this element, light emission can be obtained from the light-emitting organic compound. A display apparatus using such an organic EL element does not need a backlight that is necessary for a liquid crystal display apparatus and the like; thus, a thin, lightweight, high-contrast, and low-power display apparatus can be achieved. Patent Document 1, for example, discloses an example of a display apparatus using an organic EL element.

Patent Document 2 discloses a display apparatus using an organic EL device for VR.

REFERENCE

Patent Document

[Patent Document 1] Japanese Published Patent Application No. 2002-324673

[Patent Document 2] PCT International Publication No. 2018/087625

SUMMARY OF THE INVENTION

Problems to be Solved by the Invention

An object of one embodiment of the present invention is to provide a display apparatus with high display quality. Another object of one embodiment of the present invention is to provide a highly reliable display apparatus. Another object of one embodiment of the present invention is to provide a display apparatus that can easily achieve a higher resolution. Another object of one embodiment of the present invention is to provide a display apparatus having both high display quality and a high resolution. Another object of one embodiment of the present invention is to provide a display apparatus with low power consumption.

An object of one embodiment of the present invention is to provide a display apparatus having a novel structure or a method for fabricating a display apparatus. Another object of one embodiment of the present invention is to provide a method for manufacturing the above-described display apparatus with high yield. Another object of one embodiment of the present invention is to at least reduce at least one of problems of the conventional technique.

Note that the description of these objects does not preclude the existence of other objects. Note that one embodiment of the present invention does not have to achieve all the objects. Note that objects other than these can be derived from the description of the specification, the drawings, the claims, and the like.

Means for Solving the Problems

One embodiment of the present invention is a display apparatus including a first light-emitting device, a second light-emitting device placed adjacent to the first light-emitting device, and a first insulating layer. The first light-emitting device includes a first pixel electrode, a first EL layer over the first pixel electrode, and a common electrode over the first EL layer and the first insulating layer. The second light-emitting device includes a second pixel electrode, a second EL layer over the second pixel electrode, and the common electrode over the second EL layer and the first insulating layer. The first insulating layer is in contact with a side surface of the first EL layer and a side surface of the second EL layer. A thickness of the first pixel electrode is smaller than a thickness of the second pixel electrode. A thickness of the first EL layer is larger than a thickness of the second EL layer. It is preferable that the first light-emitting device and the second light-emitting device each exhibit visible light. For example, the first light-emitting device exhibits one color selected from blue, violet, bluish violet, green, yellowish green, yellow, orange, and red, and the second light-emitting device exhibits another color selected from blue, violet, bluish violet, green, yellowish green, yellow, orange, and red.

In the above structure, when a total thickness of the first pixel electrode and the first EL layer is denoted by t1 and a total thickness of the second pixel electrode and the second EL layer is denoted by t2, a difference between the t1 and the t2 is preferably less than or equal to 100 nm and further preferably less than or equal to 50 nm.

When the difference between the t1 and the t2 is reduced, the difference between heights of a formation surface of the first insulating layer can be reduced. Thus, the thickness of the first insulating layer can be reduced. Accordingly, the shape of the first insulating layer can be a suitable shape in an entire plane. Specifically, variation in the thickness of the first insulating layer can be reduced in an entire plane, for example. Furthermore, variation in the thickness of the first insulating layer can be reduced in an entire plane, so that the thickness of the first insulating layer can be reduced.

When the thickness of the first insulating layer is reduced, a difference between the height of a top surface of the first insulating layer and the height of a top surface of the first EL layer can be reduced. Furthermore, a difference between the height of the top surface of the first insulating layer and the height of a top surface of the second EL layer can be reduced.

The difference between the height of the top surface of the first insulating layer and the height of the top surface of the first EL layer is preferably less than 200 nm, further preferably less than or equal to 100 nm.

In the above structure, it is preferable that the first light-emitting device exhibit red and the second light-emitting device exhibit green. Alternatively, in the above structure, it is preferable that the first light-emitting device exhibit green, and the second light-emitting device exhibit blue.

In the above structure, the display apparatus preferably includes a first resin layer over the first insulating layer. The first resin layer is preferably provided between the first light-emitting device and the second light-emitting device. The common electrode is preferably in contact with the top surface of the first EL layer, the top surface of the second EL layer, and a top surface of the first resin layer. Alternatively, in the above structure, the display apparatus preferably includes a first resin layer over the first insulating layer. The first EL layer preferably includes a first layer and a common layer over the first layer. The second EL layer preferably includes a second layer and the common layer over the second layer. The common layer preferably contains a material having a high electron-injection property. The first resin layer is preferably provided over the first insulating layer. The first resin layer is preferably provided between the first light-emitting device and the second light-emitting device. The common layer is preferably in contact with a top surface of the first layer, a top surface of the second layer, and a top surface of the first resin layer. The common electrode is preferably in contact with a top surface of the common layer.

Another embodiment of the present invention is a display apparatus including a first light-emitting device, a second light-emitting device placed adjacent to the first light-emitting device, a third light-emitting device placed adjacent to the second light-emitting device, and a first insulating layer. The first light-emitting device includes a first pixel electrode, a first EL layer over the first pixel electrode, and a common electrode over the first EL layer and the first insulating layer. The second light-emitting device includes a second pixel electrode, a second EL layer over the second pixel electrode, and the common electrode over the second EL layer and the first insulating layer. The third light-emitting device includes a third pixel electrode, a third EL layer over the third pixel electrode, and the common electrode over the third EL layer and the first insulating layer. The first insulating layer includes a first region in contact with a side surface of the first EL layer and a side surface of the second EL layer and a second region in contact with the side surface of the second EL layer and a side surface of the third EL layer. A thickness of the second pixel electrode is larger than a thickness of the first pixel electrode and smaller than a thickness of the third pixel electrode. A thickness of the second EL layer is smaller than the thickness of the first EL layer and larger than a thickness of the third EL layer. It is preferable that the first light-emitting device, the second light-emitting device, and the third light-emitting device each exhibit visible light. For example, the first light-emitting device exhibits one color selected from blue, violet, bluish violet, green, yellowish green, yellow, orange, and red, the second light-emitting device exhibits a second color which is different from a first color and selected from blue, violet, bluish violet, green, yellowish green, yellow, orange, and red, and the third light-emitting device exhibits a third color which is different from the first color and the second color and selected from blue, violet, bluish violet, green, yellowish green, yellow, orange, and red.

In the above structure, when a total thickness of the first pixel electrode and the first EL layer is denoted by t1, a total thickness of the second pixel electrode and the second EL layer is denoted by t2, and a total thickness of the third pixel electrode and the third EL layer is denoted by t3, a difference between the t1 and the t2 is preferably less than or equal to 100 nm and further preferably less than or equal to 50 nm. Furthermore, a difference between the t1 and the t3 is preferably less than or equal to 100 nm and further preferably less than or equal to 50 nm.

In the above structure, it is preferable that the first light-emitting device exhibit red, the second light-emitting device exhibit green, and the third light-emitting device exhibit blue.

In the above structure, the display apparatus preferably includes a first resin layer. The first resin layer preferably includes a third region over the first region in the first insulating layer and a fourth region over the second region in the first insulating layer. The third region is preferably provided between the first light-emitting device and the second light-emitting device. The fourth region is preferably provided between the second light-emitting device and the third light-emitting device. The common electrode is preferably in contact with a top surface of the first EL layer, a top surface of the second EL layer, a top surface of the third region, and a top surface of the fourth region. Alternatively, in the above structure, the display apparatus preferably includes a first resin layer. The first resin layer preferably includes a third region over the first region in the first insulating layer and a fourth region over the second region in the first insulating layer. The first EL layer preferably includes a first layer and a common layer over the first layer. The second EL layer preferably includes a second layer and the common layer over the second layer. The third region is preferably provided between the first light-emitting device and the second light-emitting device. The fourth region is preferably provided between the second light-emitting device and the third light-emitting device. The common layer is preferably in contact with a top surface of the first layer, a top surface of the second layer, a top surface of the third region, and a top surface of the fourth region. The common electrode is preferably in contact with a top surface of the common layer.

Effect of the Invention

According to one embodiment of the present invention, a display apparatus with high display quality can be provided. A highly reliable display apparatus can be provided. A display apparatus that can easily achieve a higher resolution can be provided. A display apparatus with both high display quality and a high resolution can be provided. A display apparatus with low power consumption can be provided.

According to one embodiment of the present invention, a display apparatus having a novel structure or a method for fabricating a display apparatus can be provided. A method for manufacturing the above-described display apparatus with high yield can be provided. According to one embodiment of the present invention, at least one of problems of the conventional technique can be at least reduced.

Note that the description of these effects does not preclude the existence of other effects. Note that one embodiment of the present invention does not need to have all the effects.

Note that effects other than these can be derived from the description of the specification, the drawings, the claims, and the like.

BRIEF DESCRIPTION OF THE DRAWINGS

FIG. 25A is a cross-sectional view illustrating an example of a display apparatus. FIG. 25B and FIG. 25C are cross-sectional views illustrating examples of transistors.

MODE FOR CARRYING OUT THE INVENTION

Figure 1A:
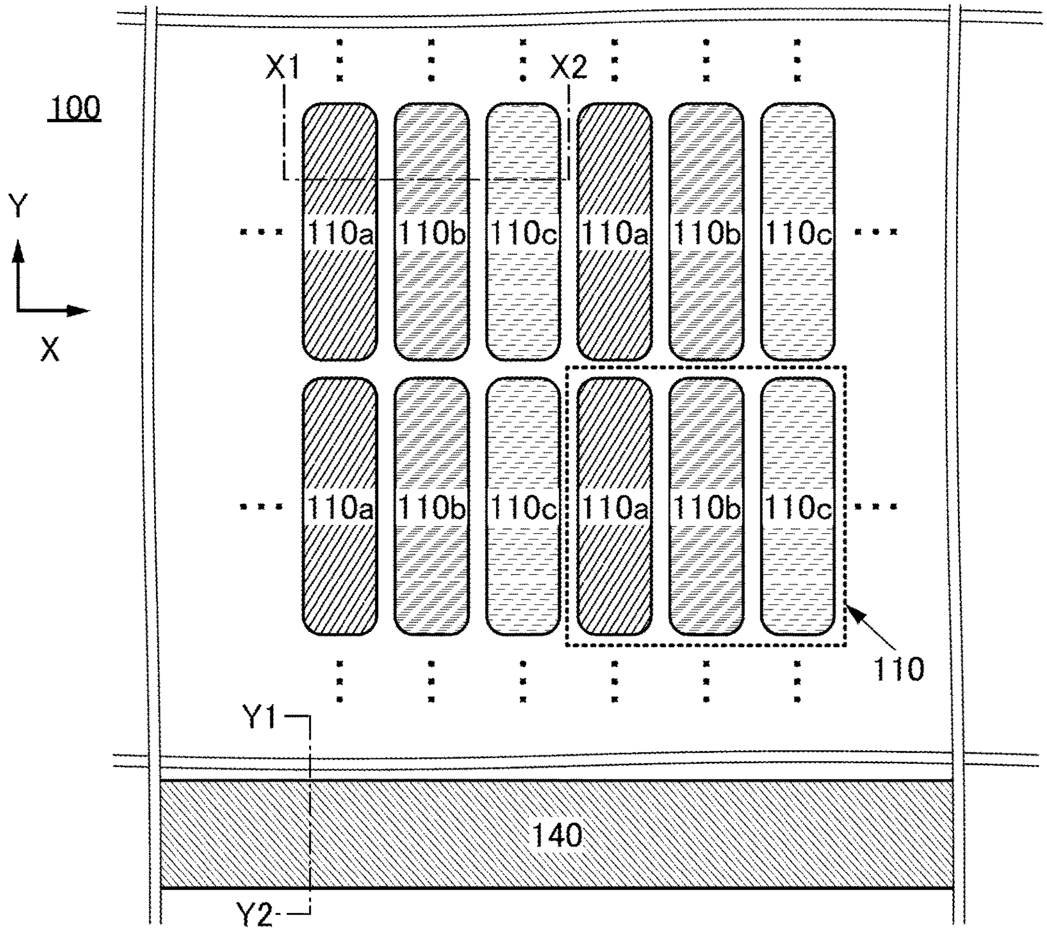
FIG. 1A is a top view illustrating an example of a display apparatus.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

Note that in structures of the invention described below, the same reference numerals are commonly used for the same portions or portions having similar functions in different drawings, and a repeated description thereof is omitted. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, ordinal numbers such as “first” and “second” are used in order to avoid confusion among components and do not limit the number.

In this specification and the like, a display apparatus may be rephrased as an electronic device.

In this specification and the like, a display apparatus that is one embodiment of a display apparatus has a function of displaying (outputting) an image or the like on (to) a display surface. Therefore, the display apparatus is one embodiment of an output device.

In this specification and the like, a substrate of a display apparatus to which a connector such as an FPC (Flexible Printed Circuit) or a TCP (Tape Carrier Package) is attached, or a substrate on which an IC is mounted by a COG (Chip On Glass) method or the like is referred to as a display module in some cases. In this specification and the like, a display apparatus is referred to as a display panel in some cases.

In this specification and the like, the term “film” and the term “layer” can be interchanged with each other. For example, in some cases, the term “conductive layer” and the term “insulating layer” can be interchanged with the term “conductive film” and the term “insulating film”, respectively.

Note that in this specification and the like, an EL layer means a layer containing at least a light-emitting substance (also referred to as a light-emitting layer) or a stacked-layer body including the light-emitting layer provided between a pair of electrodes of a light-emitting device (also referred to as a light-emitting element).

In this specification and the like, a device fabricated using a metal mask or an FMM (fine metal mask) is sometimes referred to as a device having an MM (metal mask) structure. In addition, in this specification and the like, a device fabricated without using a metal mask or an FMM is sometimes referred to as a device having an MML (metal maskless) structure.

In this specification and the like, a hole or an electron is sometimes referred to as a "carrier". Specifically, a hole-injection layer or an electron-injection layer may be referred to as a "carrier-injection layer", a hole-transport layer or an electron-transport layer may be referred to as a "carrier-transport layer", and a hole-blocking layer or an electron-blocking layer may be referred to as a "carrier-blocking layer". Note that in some cases, the above-described carrier-injection layer, carrier-transport layer, and carrier-blocking layer cannot be distinguished from each other by the cross-sectional shape, properties, or the like. Furthermore, one layer may have two or three functions of the carrier-injection layer, the carrier-transport layer, and the carrier-blocking layer in some cases.

Embodiment 1

In this embodiment, a display apparatus of one embodiment of the present invention is described.

One embodiment of the present invention is a display apparatus including a display portion capable of full-color display. The display portion includes a first subpixel and a second subpixel that emit light of different colors. The first subpixel includes a first light-emitting device that emits light of a first color and the second subpixel includes a second light-emitting device that emits light of a color different from the first color of light emitted from the first light-emitting device. At least one material is different between the first light-emitting device and the second light-emitting device; for example, a light-emitting material in the first light-emitting device is different from a light-emitting material in the second light-emitting device. That is, light-emitting devices for different emission colors are separately formed in the display apparatus of one embodiment of the present invention.

A structure in which light-emitting layers in light-emitting devices of different colors (for example, blue (B), green (G), and red (R)) are separately formed or separately patterned is sometimes referred to as an SBS (Side By Side) structure. The SBS structure allows optimization of materials and structures of light-emitting devices and thus can extend freedom of choice of the materials and the structures, which makes it easy to improve the luminance and the reliability.

In the case of fabricating a display apparatus including a plurality of light-emitting devices emitting light of different colors, light-emitting layers emitting light of different colors each need to be formed into an island shape. Note that in this specification and the like, the term "island shape" refers to a state where two or more layers formed using the same material in the same step are physically separated from each other. For example, "island-shaped light-emitting layer" means a state where the light-emitting layer and its adjacent light-emitting layer are physically separated from each other.

For example, an island-shaped light-emitting layer can be deposited by a vacuum evaporation method using a metal mask (also referred to as a shadow mask). However, this method causes a deviation from the designed shape and position of an island-shaped light-emitting layer due to various influences such as the low accuracy of the metal mask, the positional deviation between the metal mask and a substrate, a warp of the metal mask, and the vapor-scattering-induced expansion of outline of the deposited film; accordingly, it is difficult to achieve high resolution and a high aperture ratio of the display apparatus. In addition, the outline of the layer may blur during vapor deposition, whereby the thickness of an end portion may be reduced. That is, the thickness of the island-shaped light-emitting layer may vary from area to area. In the case of manufacturing a display apparatus with a large size, high definition, or high resolution, the manufacturing yield might be reduced because of low dimensional accuracy of the metal mask and deformation due to heat or the like.

In a method for fabricating a display apparatus of one embodiment of the present invention, a first layer (also referred to as an EL layer or part of an EL layer) including a light-emitting layer emitting light of a first color is formed over the entire surface, and then a first mask layer is formed over the first layer. Then, a first resist mask is formed over the first mask layer and the first layer and the first mask layer are processed using the first resist mask, so that the first layer is formed into an island shape. Next, in a manner similar to that for the first layer, a second layer (also referred to as an EL layer or part of an EL layer) including a light-emitting layer emitting light of a second color is formed into an island shape using a second mask layer and a second resist mask.

As a way of processing the light-emitting layer into an island shape, the processing by a photolithography method directly on the light-emitting layer may be considered. In that case, damage to the light-emitting layer (e.g., processing damage) might significantly degrade the reliability. In view of the above, in the fabrication of the display apparatus of one embodiment of the present invention, a mask layer or the like is preferably formed over a layer above the light-emitting layer (e.g., a carrier-transport layer or a carrier-injection layer, specifically, an electron-transport layer or an electron-injection layer), followed by the processing of the light-emitting layer into an island shape. Such a method provides a highly reliable display apparatus.

As described above, an island-shaped EL layer or an island-shaped layer including part of an EL layer fabricated by a method for fabricating the display apparatus of one embodiment of the present invention is formed not by using a metal mask having a fine pattern but by depositing an EL layer or a film including part of an EL layer over the entire surface and then processing the EL layer or the film into an island shape. Accordingly, a high-resolution display apparatus or a display apparatus with a high aperture ratio, which has been difficult to achieve, can be achieved. Moreover, the island-shaped EL layer or the island-shaped layer including part of an EL layer can be formed separately for each color, enabling the display apparatus to perform extremely clear display with high contrast and high display quality. Moreover, providing the mask layer over the EL layer or the film including part of an EL layer can reduce damage to the EL layer or the film including part of an EL layer in the fabrication process of the display apparatus, resulting in an increase in reliability of the light-emitting device.

It is difficult to set the interval between adjacent light-emitting devices to be less than 10 μm with a formation method using a metal mask, for example; however, with the above method, the interval between adjacent light-emitting devices can be decreased to be less than 10 μm, less than or equal to 8 μm, less than or equal to 5 μm, less than or equal to 3 μm, less than or equal to 2 μm, or less than or equal to 1 μm. For example, with use of a light exposure tool for LSI, the interval between adjacent light-emitting devices can be decreased to be less than or equal to 500 nm, less than or equal to 200 nm, less than or equal to 100 nm, or less than or equal to 50 nm. Accordingly, the area of a non-light-emitting region that could exist between two light-emitting devices can be significantly reduced, and the aperture ratio can be close to 100%. For example, the aperture ratio higher than or equal to 50%, higher than or equal to 60%, higher than or equal to 70%, higher than or equal to 80%, or higher than or equal to 90% and lower than 100% can be achieved.

In addition, a pattern of the island-shaped EL layer or the island-shaped layer including part of an EL layer itself can be made much smaller than that in the case of using a metal mask. For example, in the case of using a metal mask for forming the island-shaped EL layers or the island-shaped layers including part of EL layers separately, a variation in the thickness of the pattern is caused between the center and the edge of the pattern, which causes a reduction in an effective area that can be used as a light-emitting region with respect to the entire pattern area. In contrast, in the above fabrication method, a film deposited to have a uniform thickness is processed, so that island-shaped EL layers or island-shaped layers including part of EL layers can be formed to have a uniform thickness. Accordingly, even in a fine pattern, almost the whole area can be used as a light-emitting region. Thus, a display apparatus having both a high resolution and a high aperture ratio can be fabricated.

In addition, in a method for fabricating a display apparatus of one embodiment of the present invention, it is preferable that a layer including a light-emitting layer (that can be referred to as an EL layer or part of an EL layer) be formed over the entire surface, and then a mask layer be formed over an island-shaped EL layer or an island-shaped layer including part of an EL layer. Then, it is preferable that a resist mask be formed over the mask layer and the EL layer or the film including part of an EL layer and the mask layer be processed using the resist mask to form the island-shaped EL layer or the island-shaped layer including part of an EL layer.

Moreover, providing the mask layer over an EL layer or a film including part of an EL layer can reduce damage to the EL layer or the film including part of an EL layer in the fabrication process of the display apparatus, resulting in an increase in reliability of the light-emitting device.

Here, each of the first layer and the second layer includes at least a light-emitting layer and preferably consists of a plurality of layers. Specifically, each of the first layer and the second layer preferably includes one or more layers over the light-emitting layer. A layer between the light-emitting layer and the mask layer can inhibit the light-emitting layer from being exposed on the outermost surface during the fabrication process of the display apparatus and can reduce damage to the light-emitting layer. Thus, the reliability of the light-emitting device can be increased. Thus, the first layer and the second layer each preferably include the light-emitting layer and a carrier-transport layer (an electron-transport layer or a hole-transport layer) over the light-emitting layer.

Note that it is not necessary to form all layers included in EL layers separately between light-emitting devices that exhibit different colors, and some layers of the EL layers can be formed in the same step. Examples of the layers in the EL layer include a light-emitting layer, carrier-injection layers (a hole-injection layer and an electron-injection layer), carrier-transport layers (a hole-transport layer and an electron-transport layer), and carrier-blocking layers (a hole-blocking layer and an electron-blocking layer). In the method for fabricating the display apparatus of one embodiment of the present invention, after some layers included in the EL layer are formed into an island shape separately for each color, at least part of the mask layer is removed; then, the other layers included in the EL layers (referred to as a common layer in some cases) and a common electrode (also referred to as an upper electrode) are formed (as a single film) to be shared by the light-emitting devices of different colors. For example, a carrier-injection layer and a common electrode can be formed so as to be shared by the light-emitting devices of the respective colors.

Meanwhile, the carrier-injection layer is often a layer having relatively high conductivity in the EL layer. Therefore, when the carrier-injection layer is in contact with a side surface of any layer of the EL layer formed into an island shape or a side surface of the pixel electrode, the light-emitting device might be short-circuited. Note that also in the case where the carrier-injection layer is provided in an island shape and the common electrode is formed to be shared by the light-emitting devices of different colors, the light-emitting device might be short-circuited when the common electrode is in contact with the side surface of the EL layer or the side surface of the pixel electrode.

Thus, the display apparatus of one embodiment of the present invention includes an insulating layer covering at least the side surface of the island-shaped light-emitting layer. The insulating layer may cover part of the top surface of the island-shaped light-emitting layer. Note that the side surface of the island-shaped light-emitting layer here refers to the plane that is not parallel to the substrate (or a formation surface of the light-emitting layer) among the interfaces between the island-shaped light-emitting layer and other layers. The side surface is not necessarily a flat plane or a curved plane in an exactly mathematical perspective.

This can inhibit at least some layers of the island-shaped EL layers and the pixel electrodes from being in contact with the carrier-injection layer or the common electrode. Hence, a short circuit of the light-emitting device is inhibited, and the reliability of the light-emitting device can be increased.

The insulating layer is preferably provided to be thin. Treatment such as heat treatment is performed on the insulating layer in the fabrication of the display apparatus of one embodiment of the present invention and the treatment causes shrinkage of the insulating layer in some cases. Stress caused by the shrinkage of the insulating layer is applied on layers included in the light-emitting device in some cases. When the insulating film is too thick in such a case, the stress becomes larger and separation might occur at the interface between the layers included in the light-emitting device. Providing the insulating layer to be thin can inhibit separation; thus, the reliability of the light-emitting device can be improved.

In the display apparatus of one embodiment of the present invention, the top surfaces of the island-shaped EL layers or the top surfaces of the island-shaped layers each including part of an EL layer are substantially level with each other in adjacent light-emitting devices, whereby unevenness of a formation surface of the insulating layer can be eliminated, and the thickness of the insulating layer can be uniformly thin.

In the display apparatus of one embodiment of the present invention, in the case where the thickness of an island-shaped EL layer or an island-shaped layer including part of an EL layer included in one of two adjacent light-emitting devices is larger than the thickness of an island-shaped EL layer or an island-shaped layer including part of an EL layer included in the other, the thickness of the pixel electrode included in the one of two adjacent light-emitting devices is made smaller than the thickness of the pixel electrode included in the other, whereby the difference between heights of the top surfaces of the island-shaped EL layers included in the two adjacent light-emitting devices can be small.

In the display apparatus of one embodiment of the present invention, it is preferable that the total thickness of the pixel electrode and the EL layer which are included in one of two adjacent light-emitting devices be substantially equal to the total thickness of the pixel electrode and the EL layer which are included in the other.

In the display apparatus of one embodiment of the present invention, it is preferable that the total thickness of the pixel electrode and an island-shaped EL layer or an island-shaped layer including part of an EL layer which are included in one of two adjacent light-emitting devices be substantially equal to the total thickness of the pixel electrode and an island-shaped EL layer or an island-shaped layer including part of an EL layer which are included in the other.

In addition, the insulating layer preferably has a function of a barrier insulating layer against at least one of water and oxygen. The insulating layer preferably has a function of inhibiting the diffusion of at least one of water and oxygen. The insulating layer preferably has a function of capturing or fixing (also referred to as gettering) at least one of water and oxygen.

Note that in this specification and the like, a barrier insulating layer refers to an insulating layer having a barrier property. A barrier property in this specification and the like refers to a function of inhibiting diffusion of a particular substance (also referred to as having low permeability). Alternatively, a barrier property refers to a function of capturing or fixing (also referred to as gettering) a particular substance.

When the insulating layer has a function of the barrier insulating layer or a gettering function, entry of impurities (typically, at least one of water and oxygen) that would diffuse into the light-emitting devices from the outside can be inhibited. With this structure, a highly reliable light-emitting device, furthermore, a highly reliable display apparatus can be provided.

The display apparatus of one embodiment of the present invention includes a pixel electrode functioning as an anode; an island-shaped hole-injection layer, an island-shaped hole-transport layer, an island-shaped light-emitting layer, and an island-shaped electron-transport layer that are provided in this order over the pixel electrode; an insulating layer provided to cover side surfaces of the hole-injection layer, the hole-transport layer, the light-emitting layer, and the electron-transport layer; an electron-injection layer provided over the electron-transport layer; and a common electrode that is provided over the electron-injection layer and functions as a cathode.

Alternatively, the display apparatus of one embodiment of the present invention includes a pixel electrode functioning as a cathode; an island-shaped electron-injection layer, an island-shaped electron-transport layer, an island-shaped light-emitting layer, and an island-shaped hole-transport layer that are provided in this order over the pixel electrode; an insulating layer provided to cover side surfaces of the electron-injection layer, the electron-transport layer, the light-emitting layer, and the hole-transport layer; a hole-injection layer provided over the hole-transport layer; and a common electrode that is provided over the hole-injection layer and functions as an anode. The hole-injection layer, the electron-injection layer, and the like often have relatively high conductivity in the EL layer. Since side surfaces of these layers are covered with the insulating layer in the display apparatus of one embodiment of the present invention, these layers can be inhibited from being in contact with the common electrode or the like. Hence, a short circuit of the light-emitting device is inhibited, and the reliability of the light-emitting device can be improved.

The insulating layer that covers side surface of the island-shaped EL layer or the island-shaped layer including part of an EL layer may have a single-layer structure or a stacked-layer structure.

For example, an insulating layer having a single-layer structure using an inorganic material can be used as a protective insulating layer for the island-shaped EL layer or the island-shaped layer including part of an EL layer. Thus, the reliability of the display apparatus can be improved. The protective insulating layer preferably covers part of the top surface of the island-shaped EL layer or the island-shaped layer including part of an EL layer. In such a structure, the above-described mask layer may remain between the protective insulating layer and the top surface of the island-shaped EL layer or the island-shaped layer including part of an EL layer. Furthermore, the mask layer is preferably an insulating layer in which the inorganic material same as the material for the protective insulating layer is used.

In the case where the insulating layer having a stacked-layer structure is used, the first layer of the insulating layer is preferably formed using an inorganic insulating material because it is formed in contact with the island-shaped EL layer or the island-shaped layer including part of an EL layer. In particular, the first insulating layer is preferably formed by an atomic layer deposition (ALD) method, by which damage due to deposition is small. Alternatively, an inorganic insulating layer is preferably formed by a sputtering method, a chemical vapor deposition (CVD) method, or a plasma-enhanced chemical vapor deposition (PECVD: Plasma Enhanced CVD) method, which have higher deposition speed than an ALD method. In that case, a highly reliable display apparatus can be manufactured with high productivity. The second layer of the insulating layer is preferably formed using an organic material to fill a depressed portion formed by the first layer of the insulating layer.

For example, an aluminum oxide film formed by an ALD method can be used as the first layer of the insulating layer, and an organic resin film can be used as the second layer of the insulating layer. For example, it is preferable to use a photosensitive acrylic resin as the organic resin.

In the case where the side surface of the EL layer and the organic resin film are in direct contact with each other, the EL layer might be damaged by an organic solvent or the like that might be contained in the organic resin film. When an inorganic insulating film such as an aluminum oxide film formed by an ALD method is used as the first layer of the insulating layer, a structure can be employed in which the organic resin film and the side surface of the EL layer are not in direct contact with each other. Thus, the EL layer can be inhibited from being dissolved by the organic solvent, for example.

In the display apparatus of one embodiment of the present invention, it is not necessary to provide an insulating layer that covers the end portion of the pixel electrode between the pixel electrode and the EL layer; thus, the interval between adjacent light-emitting devices can be made extremely small. Thus, a display apparatus with higher resolution or higher definition can be achieved. In addition, a mask for forming the insulating layer is not needed, which leads to a reduction in manufacturing cost of the display apparatus.

Furthermore, light emitted from the EL layer can be extracted efficiently with a structure where an insulating layer covering end portions of the pixel electrodes is not provided between the pixel electrode and the EL layer, i.e., a structure where an insulating layer is not provided between the pixel electrode and the EL layer. Therefore, the display apparatus of one embodiment of the present invention can significantly reduce the viewing angle dependence. A reduction in the viewing angle dependence leads to an increase in visibility of an image on the display apparatus. For example, in the display apparatus of one embodiment of the present invention, the viewing angle (the maximum angle with a certain contrast ratio maintained when the screen is seen from an oblique direction) can be greater than or equal to 100° and less than 180°, preferably greater than or equal to 150° and less than or equal to 170°. Note that the above viewing angle refers to that in both the vertical direction and the horizontal direction.

<Structure Example of Display Apparatus>

FIG. 1 to FIG. 5 and FIG. 11 to FIG. 12 illustrate a display apparatus of one embodiment of the present invention.

FIG. 1A is a top view of a display apparatus 100. The display apparatus 100 includes a display portion in which a plurality of pixels 110 are arranged, and a connection portion 140 outside the display portion. A plurality of subpixels are arranged in matrix in the display portion. FIG. 1A illustrates subpixels arranged in two rows and six columns, which form pixels in two rows and two columns. The connection portion 140 can also be referred to as a cathode contact portion.

The pixel 110 illustrated in FIG. 1A employs stripe arrangement. Each of the pixels 110 illustrated in FIG. 1A is made up of three subpixels 110*a*, 110*b*, and 110*c*. The subpixels 110*a*, 110*b*, and 110*c* include light-emitting devices that emit light of different colors. As the subpixels 110*a*, 110*b*, and 110*c*, subpixels of three colors of red (R), green (G), and blue (B) or subpixels of three colors of yellow (Y), cyan (C), and magenta (M) can be given, for example. The number of types of subpixels is not limited to three, and four or more types of subpixels may be used. As the four subpixels, subpixels of four colors of R, G, B, and white (W), subpixels of four colors of R, G, B, and Y, or four subpixels of R, G, B, and infrared light (IR) can be given, for example.

In this specification and the like, the row direction and the column direction are sometimes referred to as the X direction and the Y direction, respectively. The X direction and the Y direction intersect with each other and are, for example, orthogonal to each other (see FIG. 1A).

FIG. 1A illustrates an example in which subpixels of different colors are arranged in the X direction and subpixels of the same color are arranged in the Y direction.

Although the top view of FIG. 1A illustrates an example in which the connection portion 140 is positioned in the lower side of the display portion, one embodiment of the present invention is not limited thereto. The connection portion 140 may be provided in at least one of the upper side, the right side, the left side, and the lower side of the display portion in the top view, and may be provided so as to surround the four sides of the display portion. The top surface shape of the connection portion 140 can be a band-like shape, an L shape, a U shape, a frame-like shape, or the like. The number of the connection portions 140 can be one or more.

Figure 1B:
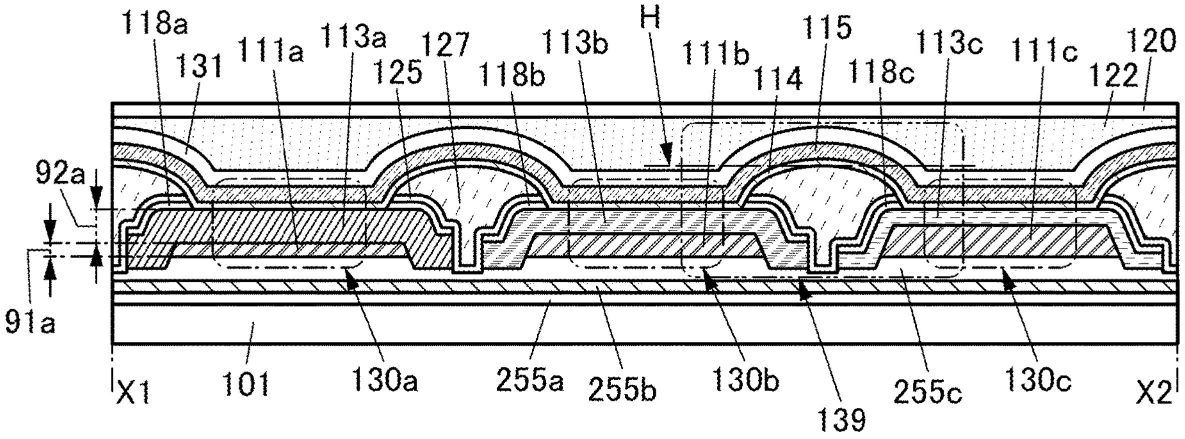
FIG. 1B is a cross-sectional view illustrating an example of the display apparatus.
Figure 2A:
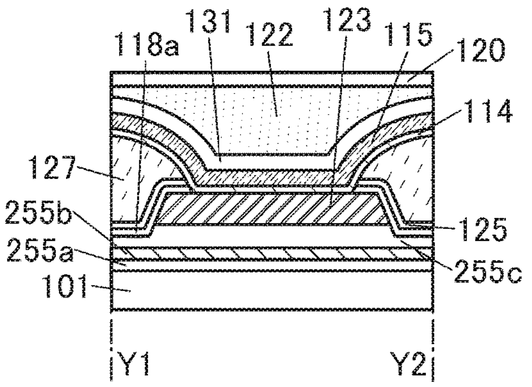
FIG. 2A to FIG. 2C are cross-sectional views illustrating examples of a display apparatus.
Figure 2B:
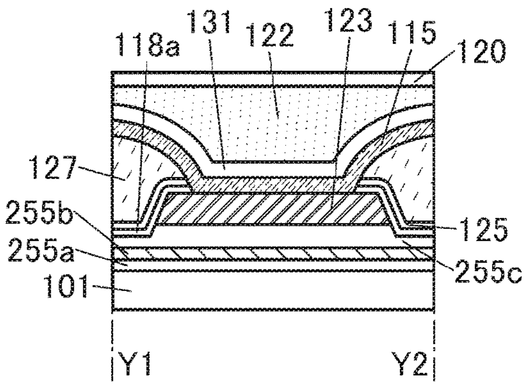

FIG. 1B is a cross-sectional view taken along dashed-dotted line X1-X2 in FIG. 1A. FIG. 2A is a cross-sectional view taken along the dashed-dotted line Y1-Y2 in FIG. 1A. FIG. 2B illustrates a structure example different from that in FIG. 2A.

As illustrated in FIG. 1B, in the display apparatus 100, insulating layers 255*a*, 255*b*, and 255*c* are provided over a layer 101 including transistors, light-emitting devices 130*a*, 130*b*, and 130*c* are provided over the insulating layers, and a protective layer 131 is provided to cover these light-emitting devices. The light-emitting device 130*a* is a light-emitting device corresponding to the subpixel 110*a*, the light-emitting device 130*b* is a light-emitting device corresponding to the subpixel 110*b*, and the light-emitting device 130*c* is a light-emitting device corresponding to the subpixel 110*c*, for example. A substrate 120 is attached to the protective layer 131 with a resin layer 122. In a region between adjacent light-emitting devices, an insulating layer 125 and an insulating layer 127 over the insulating layer 125 are provided.

In the display apparatus of one embodiment of the present invention, it is preferable that the total thickness of a pixel electrode 111 and a layer 113 be substantially the same among the plurality of light-emitting devices 130. FIG. 1B illustrates a thickness 91*a* of a pixel electrode 111*a* and a thickness 92*a* of a layer 113*a* included in the light-emitting device 130*a*.

Although FIG. 1B and the like illustrate a plurality of cross sections of the insulating layers 125 and the insulating layers 127, when the display apparatus 100 is seen from above, the insulating layers 125 and the insulating layers 127 are each one continuous layer. In other words, the display apparatus 100 can have a structure in which one insulating layer 125 and one insulating layer 127 are provided, for example. Note that the display apparatus 100 may include a plurality of insulating layers 125 which are separated from each other and a plurality of insulating layers 127 which are separated from each other.

The display apparatus of one embodiment of the present invention can have any of the following structures: a top-emission structure in which light is emitted in a direction opposite to the substrate where the light-emitting device is formed, a bottom-emission structure in which light is emitted toward the substrate where the light-emitting device is formed, and a dual-emission structure in which light is emitted toward both surfaces.

The layer 101 including a transistor can employ a stacked-layer structure in which a plurality of transistors are provided over a substrate and an insulating layer is provided to cover these transistors, for example. The insulating layer over the transistors may have a single-layer structure or a stacked-layer structure. In FIG. 1B and the like, an insulating layer 255*a*, an insulating layer 255*b* over the insulating layer 255*a*, and an insulating layer 255*c* over the insulating layer 255*b* are illustrated as the insulating layer over the transistors. These insulating layers may have a depressed portion between adjacent light-emitting devices. In the example illustrated in FIG. 1B and the like, the insulating layer 255*c* is provided with a depressed portion.

As each of the insulating layer 255*a*, the insulating layer 255*b*, and the insulating layer 255*c*, a variety of inorganic insulating films such as an oxide insulating film, a nitride insulating film, an oxynitride insulating film, and a nitride oxide insulating film can be suitably used. As each of the insulating layer 255*a* and the insulating layer 255*c*, an oxide insulating film or an oxynitride insulating film, such as a silicon oxide film, a silicon oxynitride film, or an aluminum oxide film, is preferably used. As the insulating layer 255*b*, a nitride insulating film or a nitride oxide insulating film, such as a silicon nitride film or a silicon nitride oxide film, is preferably used. More specifically, it is preferable that a silicon oxide film be used as the insulating layer 255*a* and the insulating layer 255*c* and a silicon nitride film be used as the insulating layer 255*b*. The insulating layer 255*b* preferably has a function of an etching protective film.

Note that in this specification and the like, oxynitride refers to a material that contains more oxygen than nitrogen, and nitride oxide refers to a material that contains more nitrogen than oxygen. For example, in the case where silicon oxynitride is described, it refers to a material that contains more oxygen than nitrogen in its composition; in the case where silicon nitride oxide is described, it refers to a material that contains more nitrogen than oxygen in its composition.

Structure examples of the layer 101 including a transistor will be described in Embodiment 3 and Embodiment 4.

The light-emitting devices 130*a*, 130*b*, and 130*c* emit light of different colors. It is preferable that the light-emitting devices 130*a*, 130*b*, and 130*c* emit light of three colors, red (R), green (G), and blue (B), for example.

As the light-emitting devices 130*a*, 130*b*, and 130*c*, an EL device such as an OLED (Organic Light Emitting Diode) or a QLED (Quantum-dot Light Emitting Diode) is preferably used. Examples of a light-emitting substance contained in the EL device include a substance that exhibits fluorescence (a fluorescent material), a substance that exhibits phosphorescence (a phosphorescent material), an inorganic compound (a quantum dot material or the like), and a substance that exhibits thermally activated delayed fluorescence (a thermally activated delayed fluorescent (TADF) material). As the TADF material, a material in which the singlet and triplet excited states are in thermal equilibrium may be used. Since such a TADF material has a short emission lifetime (excitation lifetime), it inhibits a reduction in the emission efficiency of a light-emitting device in a high-luminance region.

The light-emitting device includes an EL layer between a pair of electrodes. The EL layer includes at least a light-emitting layer. In this specification and the like, one of the pair of electrodes may be referred to as a pixel electrode and the other may be referred to as a common electrode.

One of the pair of electrodes of the light-emitting device functions as an anode and the other electrode functions as a cathode. The case where the pixel electrode functions as an anode and the common electrode functions as a cathode is described below as an example in some cases.

The light-emitting device 130*a* includes a pixel electrode 111*a* over the insulating layer 255*c*, an island-shaped layer 113*a* over the pixel electrode 111*a*, a common layer 114 over the island-shaped layer 113*a*, and a common electrode 115 over the common layer 114. In the light-emitting device 130*a*, the layer 113*a* and the common layer 114 can be collectively referred to as an EL layer.

The light-emitting device 130*b* includes a pixel electrode 111*b* over the insulating layer 255*c*, an island-shaped layer 113*b* over the pixel electrode 111*b*, the common layer 114 over the island-shaped layer 113*b*, and the common electrode 115 over the common layer 114. In the light-emitting device 130*b*, a layer 113*b* and the common layer 114 can be collectively referred to as an EL layer.

The light-emitting device 130*c* includes a pixel electrode 111*c* over the insulating layer 255*c*, an island-shaped layer 113*c* over the pixel electrode 111*c*, the common layer 114 over the island-shaped layer 113*c*, and the common electrode 115 over the common layer 114. In the light-emitting device 130*c*, a layer 113*c* and the common layer 114 can be collectively referred to as an EL layer.

There is no particular limitation on the structure of the light-emitting device in this embodiment, and the light-emitting device can have a single structure or a tandem structure.

Note that hereafter, in the description common to the light-emitting device 130*a*, the light-emitting device 130*b*, and the light-emitting device 130*c*, the alphabets are omitted from the reference numerals and described using the term "light-emitting device 130" in some cases. Similarly, the layer 113*a*, the layer 113*b*, and the layer 113*c* are described using the term "layer 113" in some cases. Similarly, the pixel electrode 111*a*, the pixel electrode 111*b*, and the pixel electrode 111*c* are also described using the term "pixel electrode 111" in some cases.

In this embodiment, in the EL layers included in the light-emitting devices, the island-shaped layer provided in each light-emitting device is referred to as the layer 113*a*, the layer 113*b*, and the layer 113*c*, and the layer shared by the plurality of light-emitting devices is referred to as the common layer 114. Note that in this specification and the like, the layer 113*a*, the layer 113*b*, and the layer 113*c* are each sometimes referred to as an EL layer, which does not include the common layer 114.

The layer 113*a*, the layer 113*b*, and the layer 113*c* each include at least a light-emitting layer. It is preferable that the layer 113*a* include a red-light-emitting layer, the layer 113*b* include a green-light-emitting layer, and the layer 113*c* include a blue-light-emitting layer, for example.

The layer 113*a*, the layer 113*b*, and the layer 113*c* may each include one or more of a hole-injection layer, a hole-transport layer, a hole-blocking layer, a charge-generation layer, an electron-blocking layer, an electron-transport layer, and an electron-injection layer.

The layer 113*a*, the layer 113*b*, and the layer 113*c* may each include a hole-injection layer, a hole-transport layer, a light-emitting layer, and an electron-transport layer, for example. In addition, an electron-blocking layer may be provided between the hole-transport layer and the light-emitting layer. Furthermore, an electron-injection layer may be provided over the electron-transport layer.

The layer 113*a*, the layer 113*b*, and the layer 113*c* may each include an electron-injection layer, an electron-transport layer, a light-emitting layer, and a hole-transport layer in this order, for example. In addition, a hole-blocking layer may be provided between the electron-transport layer and the light-emitting layer. Furthermore, a hole-injection layer may be provided over the hole-transport layer.

The layer 113*a*, the layer 113*b*, and the layer 113*c* each preferably include a light-emitting layer and the carrier-transport layer (electron-transport layer or hole-transport layer) over the light-emitting layer. Since surfaces of the layer 113*a*, the layer 113*b*, and the layer 113*c* are exposed in the fabrication process of the display apparatus in some cases, providing the carrier-transport layer over the light-emitting layer inhibits the light-emitting layer from being exposed on the outermost surface, so that damage to the light-emitting layer can be reduced. Thus, the reliability of the light-emitting device can be increased.

Alternatively, the layer 113*a*, the layer 113*b*, and the layer 113*c* each include a first light-emitting unit, a charge-generation layer, and a second light-emitting unit, for example. It is preferable that the layer 113*a* include two or more light-emitting units that emit red light, the layer 113*b* include two or more light-emitting units that emit green light, and the layer 113$c$ include two or more light-emitting units that emit blue light, for example.

The second light-emitting unit preferably includes the light-emitting layer and a carrier-transport layer (an electron-transport layer or a hole-transport layer) over the light-emitting layer. Since a surface of the second light-emitting unit is exposed in the fabrication process of the display apparatus, providing the carrier-transport layer over the light-emitting layer inhibits the light-emitting layer from being exposed on the outermost surface, so that damage to the light-emitting layer can be reduced. Thus, the reliability of the light-emitting device can be increased.

The common layer 114 includes, for example, an electron-injection layer or a hole-injection layer. Alternatively, the common layer 114 may include a stack of an electron-transport layer and an electron-injection layer, and may include a stack of a hole-transport layer and a hole-injection layer. The common layer 114 is shared by the light-emitting devices 130$a$, 130$b$, and 130$c$.

In the display apparatus of one embodiment of the present invention, the thicknesses of the layer 113$a$ to the layer 113$c$ are preferably different from each other. The thicknesses may be set in accordance with optical path lengths that intensifies light emitted from the layer 113$a$ to the layer 113$c$. This achieves a microcavity structure, so that the color purity of each light-emitting device can be increased.

The thicknesses of the layer 113 and the like may be set so that the optical path length is $m\lambda/2$ (m is an integer greater than or equal to 1) or the vicinity thereof when the wavelength of the light obtained from the light-emitting layer of the light-emitting device is $\lambda$.

Note that in the case where three light-emitting devices exhibit red, green, and blue and have the same m of $m\lambda/2$, the layer 113$a$ emitting light whose wavelength is the longest may be thickest, and the layer 113$c$ emitting light whose wavelength is the shortest may be thinnest, for example. FIG. 1B illustrates an example where the layer 113$a$ has the largest thickness, the layer 113$c$ has the smallest thickness, and the layer 113$b$ is thinner than the layer 113$a$ and thicker than the layer 113$c$ among the layer 113$a$ to the layer 113$c$.

Figure 2C:
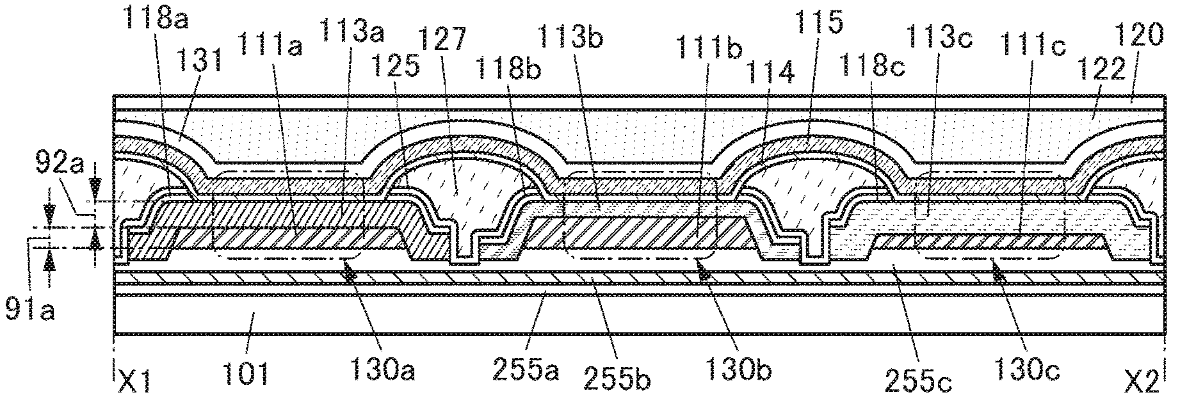

The same does not apply to the case where the value of m is different between each light-emitting device. For example, there is a case where the layer 113$c$ has the largest thickness. FIG. 2C illustrates an example of the cross section in FIG. 1B, in which the thickness of the layer 113$c$ is larger than those of the layer 113$a$ and the layer 113$b$.

Without limitation to this, the thicknesses of the layers 133 can be adjusted in consideration of the wavelengths of light emitted from the light-emitting devices, the optical characteristics of the layers included in the light-emitting devices, the electrical characteristics of the light-emitting devices, and the like.

Note that the optical path length of the light-emitting device can be adjusted not only by making the thicknesses of the layer 113$a$ to the layer 113$c$ different from each other but also by making the thicknesses of the pixel electrode 111$a$ to the pixel electrode 111$c$ different from each other. Specifically, when the pixel electrode 111 is a reflective electrode having a stacked-layer structure of a conductive material having a reflective property (a reflective conductive film) and a conductive material having a light-transmitting property (a transparent conductive film), for example, making the thickness of the transparent conductive film different between the light-emitting devices that emit light of different colors achieves the optical path lengths suitable for each color.

The optical path length in a light-emitting device is determined by the total thickness of the transparent conductive film, the layer 113, and the common layer 114 included in the pixel electrode 111, for example.

For simplicity, figures or the like in this specification do not clearly show the difference between thicknesses of the layer 113 and the pixel electrode 111 in the light-emitting device; however, the thicknesses are preferably adjusted as appropriate in each light-emitting device to intensify light with a wavelength corresponding to each light-emitting device.

Note that it is preferable that a difference between the heights of the top surfaces of the layer 113$a$ to the layer 113$c$ be smaller in the display apparatus 100. For example, a structure in which the top surfaces of the layer 113$a$ to the layer 113$c$ are substantially level with each other may be employed.

When the display apparatus 100 including a plurality of light-emitting devices arranged in a matrix is seen from above, the insulating layer 127 is provided to fill a depressed portion between the light-emitting devices. The depth of the depressed portion is determined depending on a difference between the height of the top surface of the layer 113 and the height of the top surface of the insulating layer 255$c$, for example.

When the difference between heights of the top surfaces of the layer 113$a$ to the layer 113$c$ is reduced, the in-plane distribution of unevenness can be reduced on the formation surface of the insulating layer 127. Thus, the shape of the insulating layer 127 can be a suitable shape in an entire plane. Specifically, variation in the thickness of the insulating layer 127 can be reduced in an entire plane, for example. Furthermore, variation in the thickness of the insulating layer 127 can be reduced in an entire plane, so that the thickness of the insulating layer 127 can be reduced.

When the thickness of the insulating layer 127 is reduced, a difference between the height of the top surface of the insulating layer 127 and the heights of the top surfaces of the layer 113$a$ to the layer 113$c$ can be reduced.

It is preferable that the difference between the height of the top surface of the insulating layer 127 and the heights of the top surfaces of the layer 113$a$ to the layer 113$c$ be reduced because separation and the like caused by a later-described shrinkage of a film is less likely to occur in some cases.

The difference between the height of the top surface of the insulating layer 127 and the heights of the top surfaces of the layer 113$a$ to the layer 113$c$ is preferably less than 200 nm, further preferably less than or equal to 100 nm. The difference between the height of the top surface of the insulating layer 127 and the height of the top surface of the layer 113$a$ is preferably less than 200 nm, further preferably less than or equal to 100 nm. The difference between the height of the top surface of the insulating layer 127 and the height of the top surface of the layer 113$b$ is preferably less than 200 nm, further preferably less than or equal to 100 nm. The difference between the height of the top surface of the insulating layer 127 and the height of the top surface of the layer 113$c$ is preferably less than 200 nm, further preferably less than or equal to 100 nm.

Here, in the case where the height of the top surface of a layer such as the pixel electrode 111, the layer 113, or the insulating layer 127 is measured and the top surface is not flat, the height of a portion having the largest height can be the height of the insulating layer 127, for example. An example of a height H of the insulating layer 127 is denoted by a dashed line in FIG. 1B, later-described FIG. 5A (an enlarged view of FIG. 1), and the like.

As the insulating layer 127, an insulating layer containing an organic material can be suitably used. An insulating layer including an organic material is deposited on a formation surface having unevenness, for example, whereby the unevenness can be eliminated.

When the insulating layer 127 is subjected to treatment such as heat treatment, shrinkage of the insulating layer 127 is caused in some cases. Such shrinkage applies stress to layers included in the light-emitting device 130 in some cases. Separation or the like occurs at the interface between the layers included in the light-emitting device in some cases.

Specifically, in a light-emitting device in which the height of the top surface of the layer 113 is small, for example, the insulating layer 127 provided adjacent to the layer 113 may have larger thickness than the insulating layer 127 in a light-emitting device in which the height of the top surface of the layer 113 is large. Thus, the thickness of the insulating layers 127 is varied. Furthermore, in the case where not only the thickness but also a film is uneven, variation in the top shape may be caused in addition to the thicknesses. In the region where the insulating layer 127 has a large thickness, stress due to heat treatment may be increased and separation may be caused at the interface between the insulating layer 127 and the insulating layer 125. Note that separation is not always caused between the insulating layer 127 and the insulating layer 125 and may be caused between the insulating layer 125 and the layer 113.

In the case where wet etching is used as etching of a later-described mask layer in a state where such separation is caused, a wet etching solution may enter the space generated by the separation and the separation may further proceed.

Reducing the variation in the thickness of the insulating layer 127 can reduce the variation in stress applied to each layer. In addition, the thickness of the insulating layer 127 can be uniformly small.

Furthermore, planarizing the formation surface of the insulating layer 127 in the plane can make the thickness of the insulating layer 127 uniformly small. By reducing the thickness of the insulating layer 127, stress applied to the layers included in the light-emitting device 130 can be uniformly small.

The top surface of the insulating layer 127 is preferably flat, but is gently curved in some cases. For example, the top surface of the insulating layer 127 may be a convex surface, a concave surface, or a flat surface.

The height of the top surface of the layer 113 is determined in accordance with the total thickness of the pixel electrode 111 and the layer 113, for example.

When the layer 113*a* to the layer 113*c* have different thicknesses, for example, the thicknesses of the pixel electrode 111*a* to the pixel electrode 111*c* are adjusted, whereby the difference between the heights of the top surfaces of the layer 113*a* to the layer 113*c* can be small. More specifically, for example, when each of the pixel electrode 111*a* to the pixel electrode 111*c* is a reflective electrode having a stacked-layer structure of a reflective conductive film and a transparent conductive film, the thickness of the reflective conductive film included in each of the pixel electrode 111*a* to the pixel electrode 111*c* is adjusted, whereby the difference between the heights of the top surfaces of the layer 113*a* to the layer 113*c* can be small.

Reflective conductive films having different thicknesses are preferably formed using the same material, for example. Alternatively, the reflective conductive films may be formed using different materials. Alternatively, some of the reflective conductive films may be formed using the same material.

Reflective conductive films having different thicknesses can be formed through the same deposition step, for example. Alternatively, the reflective conductive films may be formed through different deposition steps. Alternatively, some of the reflective conductive films may be formed through the same deposition step.

End portions of the pixel electrode 111*a*, pixel electrode 111*b*, and pixel electrode 111*c* each preferably have a tapered shape. When the end portions of these pixel electrodes have a tapered shape, the layer 113*a*, the layer 113*b*, and the layer 113*c* provided along the side surfaces of the pixel electrodes also have a tapered shape. When the side surface of the pixel electrode has a tapered shape, coverage with at least part of the EL layer provided along the side surface of the pixel electrode can be improved. Furthermore, when the side surface of the pixel electrode has a tapered shape, a foreign substance (also referred to as dust or a particle) in the fabrication process is easily removed by processing such as cleaning, which is preferable.

The common electrode 115 is shared by the light-emitting devices 130*a*, 130*b*, and 130*c*. The common electrode 115 shared by the plurality of light-emitting devices is electrically connected to a conductive layer 123 provided in the connection portion 140 (see FIG. 2A and FIG. 2B). For the conductive layer 123, it is preferable to use a conductive layer at least part of which is formed using the same material through the same step as at least one of the pixel electrode 111*a* to the pixel electrode 111*c*.

Note that FIG. 2A illustrates an example in which the common layer 114 is provided over the conductive layer 123 and the conductive layer 123 and the common electrode 115 are electrically connected to each other through the common layer 114. The common layer 114 is not necessarily provided in the connection portion 140. In FIG. 2B, the conductive layer 123 and the common electrode 115 are directly connected to each other. For example, by using a mask for specifying a deposition area (also referred to as an area mask or a rough metal mask to distinguish from a fine metal mask), the common layer 114 can be deposited in a region different from a region where the common electrode 115 is formed.

The protective layer 131 is preferably included over the light-emitting devices 130*a*, 130*b*, and 130*c*. Providing the protective layer 131 can improve the reliability of the light-emitting device. The protective layer 131 may have a single-layer structure or a stacked-layer structure of two or more layers.

There is no limitation on the conductivity of the protective layer 131. As the protective layer 131, at least one type of an insulating film, a semiconductor film, and a conductive film can be used.

The protective layer 131 including an inorganic film can inhibit deterioration of the light-emitting device by preventing oxidation of the common electrode 115 and inhibiting entry of impurities (e.g., moisture and oxygen) into the light-emitting device, for example; thus, the reliability of the display apparatus can be improved.

As the protective layer 131, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, the protective layer 131 preferably includes a nitride insulating film or a nitride oxide insulating film, and further preferably includes a nitride insulating film.

As the protective layer 131, an inorganic film containing In—Sn oxide (also referred to as ITO), In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

When light emitted from the light-emitting device is extracted through the protective layer 131, the protective layer 131 preferably has a high visible-light-transmitting property. For example, ITO, IGZO, and aluminum oxide are preferable because they are inorganic materials having a high visible-light-transmitting property.

The protective layer 131 can have, for example, a stacked-layer structure of an aluminum oxide film and a silicon nitride film over the aluminum oxide film, or a stacked-layer structure of an aluminum oxide film and an IGZO film over the aluminum oxide film. Such a stacked-layer structure can inhibit entry of impurities (e.g., water and oxygen) into the EL layers.

Furthermore, the protective layer 131 may include an organic film. For example, the protective layer 131 may include both an organic film and an inorganic film. Examples of an organic material that can be used for the protective layer 131 include organic insulating materials that can be used for the insulating layer 127 described later.

The protective layer 131 may have a stacked-layer structure of two layers which are formed by different deposition methods. Specifically, the first layer of the protective layer 131 may be formed by an ALD method, and the second layer of the protective layer 131 may be formed by a sputtering method.

In FIG. 1B and the like, an insulating layer covering an end portion of the top surface of the pixel electrode 111*a* is not provided between the pixel electrode 111*a* and the layer 113*a*. An insulating layer covering an end portion of the top surface of the pixel electrode 111*b* is not provided between the pixel electrode 111*b* and the layer 113*b*. Thus, the interval between adjacent light-emitting devices can be extremely shortened. Accordingly, the display apparatus can have high resolution or high definition.

In FIG. 1B and the like, a mask layer 118*a* is positioned over the layer 113*a* in the light-emitting device 130*a*, a mask layer 118*b* is positioned over the layer 113*b* in the light-emitting device 130*b*, and a mask layer 118*c* is positioned over the layer 113*c* in the light-emitting device 130*c*. The mask layer 118*a* is a remaining part of a mask layer provided in contact with the top surface of the layer 113*a* at the time of processing the layer 113*a*. Similarly, the mask layer 118*b* is a remaining part of the mask layer provided at the time of forming the layer 113*b*, and the mask layer 118*c* is a remaining part of the mask layer provided at the time of forming the layer 113*c*. Thus, a mask layer used to protect the EL layer in fabrication of the display apparatus of one embodiment of the present invention may partly remain in the display apparatus. For any two or all of the mask layer 118*a* to the mask layer 118*c*, the same material may be used or different materials may be used. Note that hereinafter the mask layer 118*a*, the mask layer 118*b*, and the mask layer 118*c* may be collectively referred to as a mask layer 118.

In FIG. 1B, one end portion of the mask layer 118*a* is aligned or substantially aligned with the end portion of the layer 113*a*, and the other end portion of the mask layer 118*a* is positioned over the layer 113*a*. Here, the other end portion of the mask layer 118*a* preferably overlaps with the layer 113*a* and the pixel electrode 111*a*. In that case, the other end portion of the mask layer 118*a* is likely to be formed on a substantially flat surface of the layer 113*a*. The same applies to the mask layer 118*b* and the mask layer 118*c*. The mask layer 118 remains, for example, between the insulating layer 125 and the top surface of any of the layer 113*a*, the layer 113*b*, or the layer 113*c* each processed into an island shape.

As the mask layer 118, one or more kinds of a metal film, an alloy film, a metal oxide film, a semiconductor film, an organic insulating film, and an inorganic insulating film can be used, for example. As the mask layer, a variety of inorganic insulating films that can be used as the protective layer 131 can be used. For example, an inorganic insulating material such as aluminum oxide, hafnium oxide, or silicon oxide can be used for the mask layer.

As illustrated in FIG. 1B, the insulating layer 125 and the insulating layer 127 preferably cover part of the top surface of any of the layer 113*a*, the layer 113*b*, and the layer 113*c* each processed into an island shape. When the insulating layer 125 and the insulating layer 127 cover not only a side surface but also the top surface of any of the layer 113*a*, the layer 113*b*, or the layer 113*c* each processed into an island shape, film separation of the layer 113*a*, the layer 113*b*, or the layer 113*c* can further be prevented and the reliability of the light-emitting device can be improved. In addition, the manufacturing yield of the light-emitting devices can be further increased. In the example illustrated in FIG. 1B, the layer 113*a*, the mask layer 118*a*, the insulating layer 125, and the insulating layer 127 are stacked over the end portion of the pixel electrode 111*a*. Similarly, the layer 113*b*, the mask layer 118*b*, the insulating layer 125, and the insulating layer 127 are stacked over the end portion of the pixel electrode 111*b*; and the layer 113*c*, the mask layer 118*c*, the insulating layer 125, and the insulating layer 127 are stacked over the end portion of the pixel electrode 111*c*.

FIG. 1B and the like illustrate an example where the end portion of the layer 113*a* is positioned outward from the end portion of the pixel electrode 111*a*. Note that although the pixel electrode 111*a* and the layer 113*a* are given as an example, the following description applies to the pixel electrode 111*b* and the layer 113*b*, and the pixel electrode 111*c* and the layer 113*c*.

In FIG. 1B and the like, the layer 113*a* is formed to cover the end portion of the pixel electrode 111*a*. Such a structure can increase the aperture ratio compared with the structure in which the end portions of the layer 113*a*, the layer 113*b*, and the layer 113*c* each having an island shape are positioned inward from the end portions of the pixel electrodes.

Covering the side surface of the pixel electrode with the layer 113*a*, the layer 113*b*, or the layer 113*c* inhibits contact between the pixel electrode and the common electrode 115, thereby inhibiting a short circuit in the light-emitting device. Furthermore, the distance between the light-emitting region (i.e., the region overlapping with the pixel electrode) in the EL layer and the end portion of the layer 113*a*, the layer 113*b*, or the layer 113*c* can be increased, resulting in higher reliability.

The side surfaces of the layer 113*a*, the layer 113*b*, and the layer 113*c* are each covered with the insulating layer 127 and the insulating layer 125. The top surfaces of the layer 113*a*, the layer 113*b*, and the layer 113*c* are partly covered with the insulating layer 127, the insulating layer 125, and the mask layer 118. Thus, the common layer 114 (or the common electrode 115) can be inhibited from being in contact with the side surfaces of the pixel electrodes 111*a*, 111*b*, and 111*c* and the side surfaces of the layer 113*a*, the layer 113*b*, and the layer 113*c*, whereby a short circuit of the light-emitting device can be inhibited. Thus, the reliability of the light-emitting device can be increased.

The insulating layer 125 preferably covers at least one of the side surfaces of the layer 113*a*, the layer 113*b*, and the layer 113*c* each having an island shape and further preferably covers the side surfaces of two of the layer 113*a*, the layer 113*b*, and the layer 113*c* each having an island shape. The insulating layer 125 can be in contact with the side surfaces of the layer 113*a*, the layer 113*b*, or the layer 113*c* each having an island shape.

In FIG. 1B and the like, the end portion of the pixel electrode 111*a* is covered with the layer 113*a* and the insulating layer 125 is in contact with the side surface of the layer 113*a*. Similarly, the end portion of the pixel electrode 111*b* is covered with the layer 113*b*, the end portion of the pixel electrode 111*c* is covered with the layer 113*c*, and the insulating layer 125 is in contact with the side surface of the layer 113*b* and the side surface of the layer 113*c*.

The insulating layer 127 is provided over the insulating layer 125 to fill a depressed portion formed in the insulating layer 125. The insulating layer 127 can overlap with the side surface and part of the top surface of each of the layer 113*a*, the layer 113*b*, and the layer 113*c*, with the insulating layer 125 therebetween.

The insulating layer 125 and the insulating layer 127 can fill a space between adjacent island-shaped layers, whereby large unevenness of the formation surface of a layer (e.g., the carrier-injection layer and the common electrode) provided over the island-shaped layers can be reduced and can be flatter. Thus, the coverage with the carrier-injection layer, the common electrode, and the like can be increased and disconnection of the common electrode can be prevented.

The common layer 114 and the common electrode 115 are provided over the layer 113*a*, the layer 113*b*, the layer 113*c*, the mask layer 118, the insulating layer 125, and the insulating layer 127. Before the insulating layer 125 and the insulating layer 127 are provided, a step due to a region where the pixel electrode and the layer 113*a*, the layer 113*b*, or the layer 113*c* are provided and a region where none of the pixel electrode, the layer 113*a*, the layer 113*b*, and the layer 113*c* are provided (a region between the light-emitting devices) is caused. In the display apparatus of one embodiment of the present invention, the step can be eliminated with the insulating layer 125 and the insulating layer 127, and the coverage with the common layer 114 and the common electrode 115 can be improved. Consequently, it is possible to inhibit a connection defect due to disconnection. Furthermore, an increase in electric resistance, which is caused by a reduction in thickness locally of the common electrode 115 due to a step, can be inhibited.

In order to improve the planarity of the formation surfaces of the common layer 114 and the common electrode 115, the top surface of the insulating layer 125 and the top surface of the insulating layer 127 are each preferably level or substantially level with the top surface of at least one end portion of the layer 113*a*, the layer 113*b*, and the layer 113*c*. The top surface of the insulating layer 127 preferably has higher flatness; however, it may include a projecting portion, a convex curved surface, a concave curved surface, or a depressed portion. For example, the top surface of the insulating layer 127 preferably has a smooth convex curved shape with high flatness.

The insulating layer 125 can be provided in contact with the layer 113*a*, the layer 113*b*, or the layer 113*c* each having an island shape. Thus, film separation of the layer 113*a*, the layer 113*b*, or the layer 113*c* each having an island shape can be prevented. When the insulating layer 125 is in close contact with the layer 113*a*, the layer 113*b*, or the layer 113*c*, adjacent island-shaped layers 113 can be fixed or bonded to each other by the insulating layer 125. Thus, the reliability of the light-emitting device can be improved. The manufacturing yield of the light-emitting device can be increased.

Here, the insulating layer 125 includes regions in contact with the side surface of the layer 113*a*, the layer 113*b*, or the layer 113*c* each having an island shape, and functions as a protective insulating layer for the layer 113*a*, the layer 113*b*, and the layer 113*c*. Providing the insulating layer 125 can inhibit impurities (e.g., oxygen and moisture) from entering the layer 113*a*, the layer 113*b*, or the layer 113*c* each having an island shape through their side surface, resulting in a highly reliable display apparatus.

Next, an example of a material and formation method of the insulating layer 125 and the insulating layer 127 are described.

The insulating layer 125 can be an insulating layer containing an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium-gallium-zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, aluminum oxide is preferably used because it has high selectivity with respect to the layer 113 in etching and has a function of protecting the layer 113 when the later-described insulating layer 127 is formed. An inorganic insulating film such as an aluminum oxide film, a hafnium oxide film, or a silicon oxide film is formed by an ALD method as the insulating layer 125, whereby the insulating layer 125 can have few pinholes and an excellent function of protecting the layer 113. The insulating layer 125 may have a stacked-layer structure of a film formed by an ALD method and a film formed by a sputtering method. The insulating layer 125 may have a stacked-layer structure of an aluminum oxide film formed by an ALD method and a silicon nitride film formed by a sputtering method, for example.

The insulating layer 125 preferably has a function of a barrier insulating layer against at least one of water and oxygen. Alternatively, the insulating layer 125 preferably has a function of inhibiting the diffusion of at least one of water and oxygen. Alternatively, the insulating layer 125 preferably has a function of capturing or fixing (also referred to as gettering) at least one of water and oxygen.

When the insulating layer 125 has a function of the barrier insulating layer or a gettering function, entry of impurities (typically, at least one of water and oxygen) that would diffuse into the light-emitting devices from the outside can be inhibited. With this structure, a highly reliable light-emitting device, furthermore, a highly reliable display apparatus can be provided.

The insulating layer 125 preferably has a low impurity concentration. Accordingly, degradation of the layer 113, which is caused by entry of impurities into the layer 113 from the insulating layer 125, can be inhibited. In addition, when the impurity concentration is reduced in the insulating layer 125, a barrier property against at least one of water and oxygen can be increased. For example, the insulating layer 125 preferably has one of a sufficiently low hydrogen concentration and a sufficiently low carbon concentration, desirably has both of them.

The insulating layer 125 can be formed by a sputtering method, a CVD method, a pulsed laser deposition (PLD) method, an ALD method, or the like. The insulating layer 125 is preferably formed by an ALD method achieving good coverage.

When the substrate temperature at the time when the insulating layer 125 is deposited is increased, the formed insulating layer 125, even with a small thickness, can have a low impurity concentration and a high barrier property against at least one of water and oxygen. Therefore, the substrate temperature is preferably higher than or equal to 60° C., further preferably higher than or equal to 80° C., still further preferably higher than or equal to 100° C., yet still further preferably higher than or equal to 120° C. Meanwhile, the insulating layer 125 is formed after formation of an island-shaped layer 113, it is preferable that the insulating layer 125 be formed at a temperature lower than the upper temperature limit of the layer 113. Therefore, the substrate temperature is preferably lower than or equal to 200° C., further preferably lower than or equal to 180° C., still further preferably lower than or equal to 160° C., still further preferably lower than or equal to 150° C., yet still further preferably lower than or equal to 140° C.

Examples of indicators of the upper temperature limit are the glass transition point, the softening point, the melting point, the thermal decomposition temperature, and the 5% weight loss temperature. The upper temperature limit of the layer 113 can be, for example, any of the above temperatures, preferably the lowest temperature thereof.

The insulating layer 125 is preferably formed to have a thickness greater than or equal to 3 nm, greater than or equal to 5 nm, or greater than or equal to 10 nm and less than or equal to 200 nm, less than or equal to 150 nm, less than or equal to 100 nm, or less than or equal to 50 nm.

The insulating layer 127 provided over the insulating layer 125 has a function of eliminating large unevenness of the insulating layer 125 formed between adjacent light-emitting devices for planarization. In other words, the insulating layer 127 has an effect of improving the planarity of the formation surface of the common electrode 115.

As the insulating layer 127, an insulating layer containing an organic material can be suitably used. As the organic material, a photosensitive organic resin is preferably used; for example, a photosensitive acrylic resin may be used. The viscosity of the material of the insulating layer 127 is greater than or equal to 1 cP and less than or equal to 1500 cP, and is preferably greater than or equal to 1 cP and less than or equal to 12 cP. By setting the viscosity of the material of the insulating layer 127 in the above range, the later-described insulating layer 127 having a tapered shape can be formed relatively easily. Note that in this specification and the like, an acrylic resin refers to not only a polymethacrylic acid ester or a methacrylic resin, but also all the acrylic polymer in a broad sense in some cases.

Note that the organic material usable for the insulating layer 127 is not limited to the above description as long as the insulating layer 127 has a taper-shaped side surface as described later. For the insulating layer 127, for example, an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like can be used in some cases. Alternatively, an organic material such as polyvinyl alcohol (PVA), polyvinylbutyral, polyvinylpyrrolidone, polyethylene glycol, polyglycerin, pullulan, water-soluble cellulose, an alcohol-soluble polyamide resin, or the like can be employed for the insulating layer 127 in some cases. As the photosensitive resin, a photoresist can be used in some cases. As the photosensitive resin, a positive material or a negative material can be used in some cases.

The insulating layer 127 may be formed using a material absorbing visible light. When the insulating layer 127 absorbs light emitted by the light-emitting device, leakage of light (stray light) from the light-emitting device to the adjacent light-emitting device through the insulating layer 127 can be inhibited. Thus, the display quality of the display apparatus can be improved. Since no polarizing plate is required to improve the display quality of the display apparatus, the weight and thickness of the display apparatus can be reduced.

Examples of the material absorbing visible light include a material containing a pigment of black or any other color, a material containing a dye, a light-absorbing resin material (e.g., polyimide), and a resin material that can be used for color filters (a color filter material). Using a resin material obtained by layering or mixing color filter materials of two or three or more colors is particularly preferable to enhance the effect of blocking visible light. In particular, mixing color filter materials of three or more colors enables the formation of a black or nearly black resin layer.

For example, the insulating layer 127 can be formed by a wet film formation method such as spin coating, dipping, spray coating, ink-jetting, dispensing, screen printing, offset printing, doctor blade coating, slit coating, roll coating, curtain coating, or knife coating. Specifically, an organic insulating film that is to be the insulating layer 127 is preferably formed by spin coating.

The insulating layer 127 is formed at a temperature lower than the upper temperature limit of the layer 113. The typical substrate temperature in formation of the insulating layer 127 is lower than or equal to 200° C., preferably lower than or equal to 180° C., further preferably lower than or equal to 160° C., still further preferably lower than or equal to 150° C., yet still further preferably lower than or equal to 140° C.

In the display apparatus of this embodiment, the distance between the light-emitting devices can be narrowed. Specifically, the distance between the light-emitting devices, the distance between the layers 113, or the distance between the pixel electrodes can be less than 10 μm, less than or equal to 8 μm, less than or equal to 5 μm, less than or equal to 3 μm, less than or equal to 2 μm, less than or equal to 1 μm, less than or equal to 500 nm, less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, the display apparatus of this embodiment includes a region where an interval between two island-shaped layers 113 adjacent to each other is less than or equal to 1 μm, preferably less than or equal to 0.5 μm (500 nm), further preferably less than or equal to 100 nm.

A light-blocking layer may be provided on the surface of the substrate 120 on the resin layer 122 side. A variety of optical members can be arranged on the outer surface of the substrate 120. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film suppressing the attachment of stain, a hard coat film inhibiting generation of a scratch caused by the use, an impact-absorbing layer, or the like may be provided as a surface protective layer on the outer surface of the substrate 120. For example, a glass layer or a silica layer ($SiO_x$ layer) is preferably provided as the surface protective layer to inhibit the surface contamination and generation of a scratch. The surface protective layer may be formed using DLC (diamond like carbon), aluminum oxide ($AlO_x$), a polyester-based material, a polycarbonate-based material, or the like. For the surface protective layer, a material having high visible-light transmittance is preferably used. The surface protective layer is preferably formed using a material with high hardness.

For the substrate 120, glass, quartz, ceramic, sapphire, a resin, a metal, an alloy, a semiconductor, or the like can be used. The substrate on the side from which light from the light-emitting device is extracted is formed using a material which transmits the light. When the substrate 120 is formed using a flexible material, the flexibility of the display apparatus can be increased. Furthermore, a polarizing plate may be used as the substrate 120.

For the substrate 120, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used as the substrate 120.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display apparatus might be changed, e.g., creases are generated. Thus, for the substrate, a film with a low water absorption rate is preferably used. For example, a film with a water absorption rate lower than or equal to 1% is preferably used, a film with a water absorption rate lower than or equal to 0.1% is further preferably used, and a film with a water absorption rate lower than or equal to 0.01% is still further preferably used.

For the resin layer 122, a variety of curable adhesives such as a photocurable adhesive like an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferable. Alternatively, a two-liquid-mixture-type resin may be used. An adhesive sheet or the like may be used.

Figure 5A:
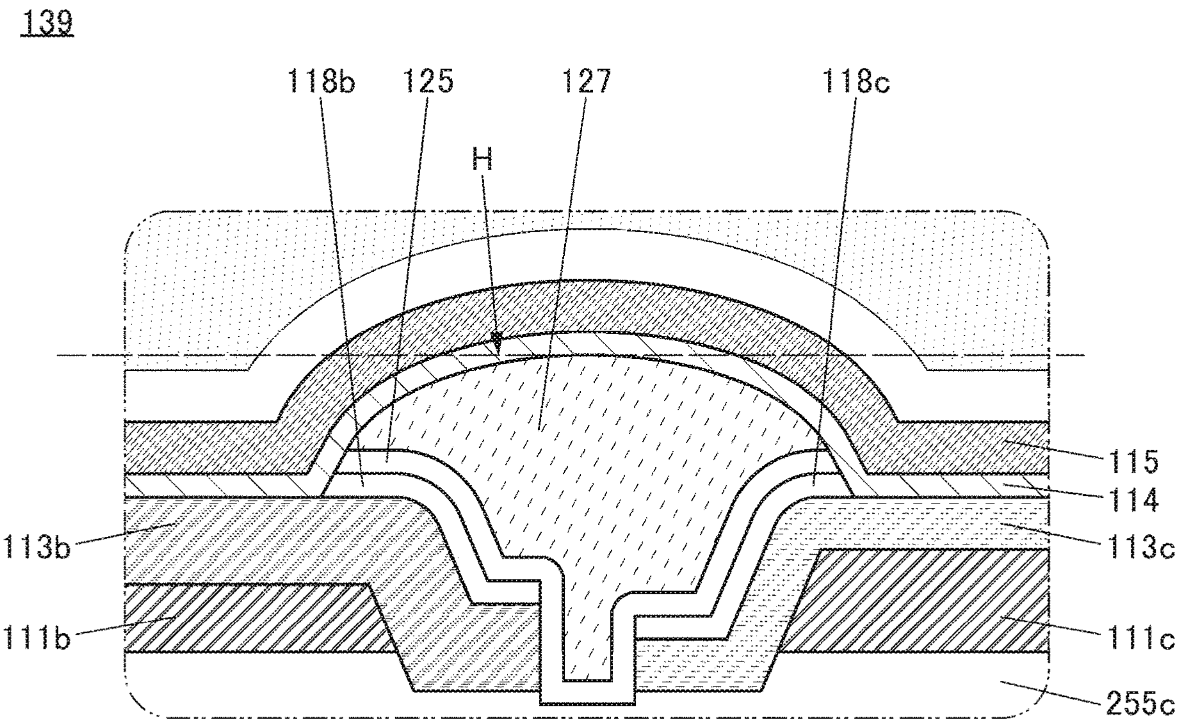
FIG. 5A and FIG. 5B are cross-sectional views illustrating examples of a display apparatus.
Figure 5B:
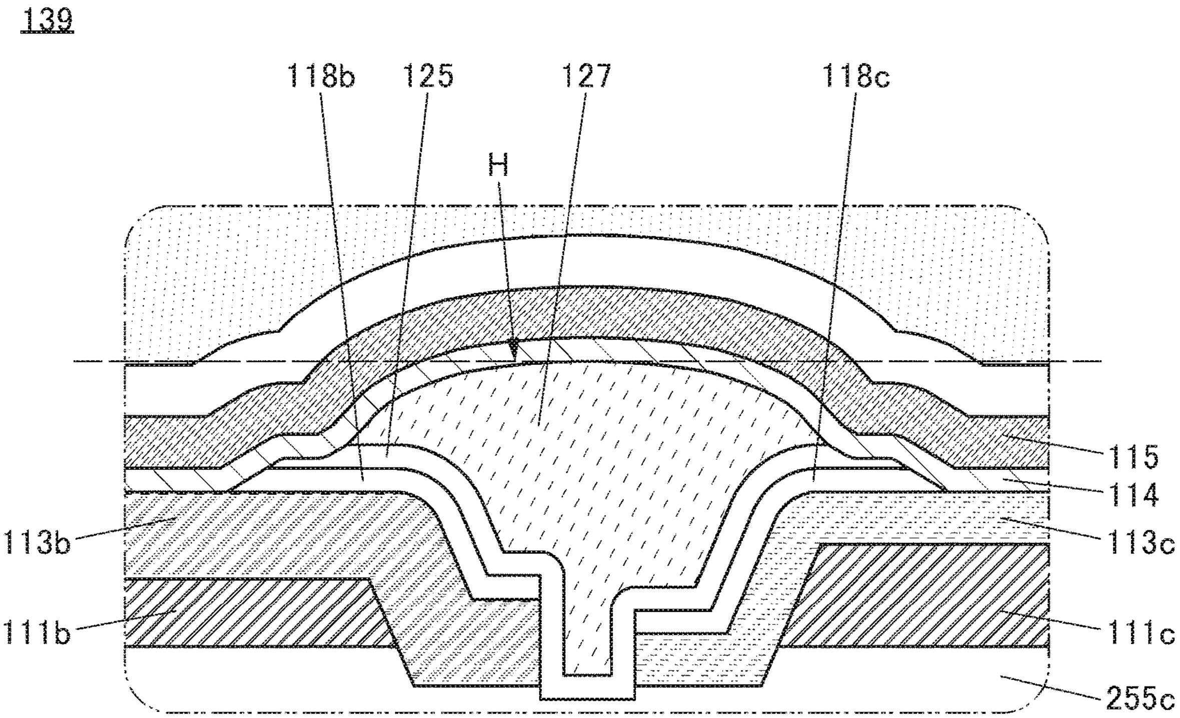
Figure 6A:
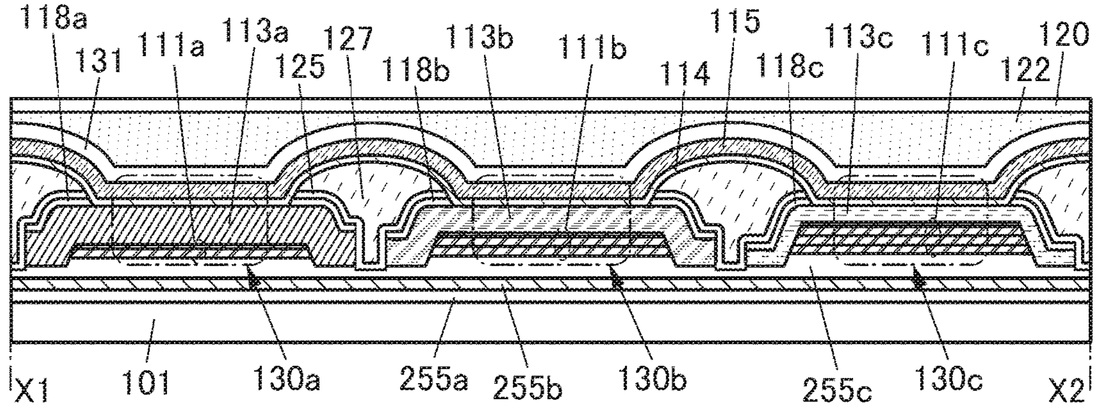
FIG. 6A is a cross-sectional view illustrating an example of a display apparatus.
Figure 6B:
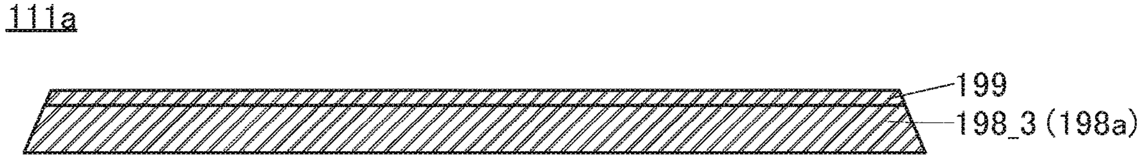
FIG. 6B to FIG. 6D are cross-sectional views illustrating examples of an electrode.
Figure 6C:
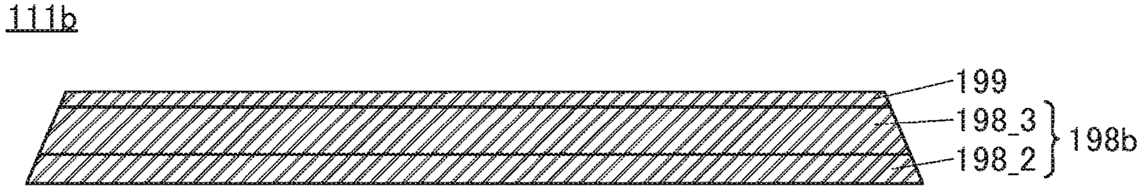
Figure 6D:
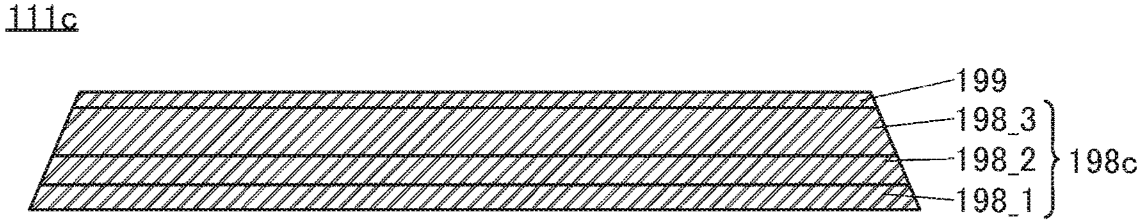

FIG. 5A illustrates an enlarged view of a region 139 surrounded by a dashed-double-dotted line in FIG. 1B. Note that the end portion of the insulating layer 125, the other end portion of the mask layer 118*b*, and the other end portion of the mask layer 118*c* may each have a projecting portion. FIG. 5B illustrates an example in which the insulating layer 125, the mask layer 118*b*, and the mask layer 118*c* each have a projecting portion positioned outward from the end portion of the insulating layer 127, as compared with those in FIG. 5A. The insulating layer 125, the mask layer 118*b*, and the mask layer 118*c* each have a projecting portion positioned outward from the end portion of the insulating layer 127, which improves the coverage with the common layer 114 and the common electrode 115 over and across the insulating layer 127 to the layer 113*b* and over and across the insulating layer 127 to the layer 113*c*, and the display quality of the display apparatus can be improved.

The display apparatus of one embodiment of the present invention may include a light-receiving device in the pixel. For example, one or more of a plurality of subpixels included in the pixel may be (a) light-emitting device(s) and one or more of a plurality of subpixels included in the pixel may be (a) light-receiving device(s).

As the light-receiving device, a pn photodiode or a pin photodiode can be used, for example. The light-receiving device functions as a photoelectric conversion device (also referred to as a photoelectric conversion element) that detects light entering the light-receiving device and generates electric charge. The amount of electric charge generated from the light-receiving devices depends on the amount of light entering the light-receiving devices.

It is particularly preferable to use an organic photodiode including a layer containing an organic compound as the light-receiving device. An organic photodiode, which is easily made thin, lightweight, and large in area and has a high degree of freedom for shape and design, can be used in a variety of display apparatuses.

In one embodiment of the present invention, an organic EL device is used as the light-emitting device, and an organic photodiode is used as the light-receiving device. The organic EL devices and the organic photodiode can be formed over the same substrate. Thus, the organic photodiode can be incorporated in the display apparatus including the organic EL devices.

The light-receiving device includes at least an active layer that functions as a photoelectric conversion layer between a pair of electrodes. In this specification and the like, one of the pair of electrodes may be referred to as a pixel electrode and the other may be referred to as a common electrode.

One of the pair of electrodes of the light-receiving device functions as an anode, and the other electrode functions as a cathode. The case where the pixel electrode functions as an anode and the common electrode functions as a cathode is described below as an example. When the light-receiving device is driven by application of reverse bias between the pixel electrode and the common electrode, light entering the light-receiving device can be detected and electric charge can be generated and extracted as current. Alternatively, the pixel electrode may function as a cathode and the common electrode may function as an anode.

By replacing the layer 113 with an active layer (also referred to as a photoelectric conversion layer) of a photoelectric conversion device, the light-emitting device 130 can function as a light-receiving device.

A fabrication method similar to that of the light-emitting device can be employed for the light-receiving device. An island-shaped active layer included in the light-receiving device is formed by depositing a film that is to be the active layer on the entire surface and then processing the layer, not by using a pattern of a metal mask; thus, the island-shaped active layer with a uniform thickness can be formed. In addition, a mask layer provided over the active layer can reduce damage to the active layer in the fabrication process of the display apparatus, increasing the reliability of the light-receiving device.

Here, a layer shared by the light-receiving device and the light-emitting device might have different functions in the light-emitting device and the light-receiving device. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer shared by the light-receiving device and the light-emitting device may have the same function in both the light-emitting device and the light-receiving device. The hole-transport layer functions as a hole-transport layer in both the light-emitting device and the light-receiving device, and the electron-transport layer functions as an electron-transport layer in both the light-emitting device and the light-receiving device.

In the display apparatus including light-emitting devices and a light-receiving device in each pixel, the pixel has a light-receiving function; thus, the display apparatus can detect a contact or approach of an object while displaying an image. For example, an image can be displayed by using all the subpixels included in the display apparatus; or light can be emitted by some of the subpixels as a light source and an image can be displayed by using the remaining subpixels.

In the display apparatus of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor or a touch sensor. That is, by detecting light with the display portion, an image can be captured or the proximity or contact of a target (e.g., a finger, a hand, or a pen) can be detected. Furthermore, in the display apparatus of one embodiment of the present invention, the light-emitting devices can be used as a light source of the sensor. Accordingly, a light-receiving portion and a light source do not need to be provided separately from the display apparatus; hence, the number of components of an electronic device can be reduced. For example, a fingerprint authentication device, a capacitive touch panel for scroll operation, or the like is not necessarily provided separately from the electronic device. Thus, with the use of the display apparatus of one embodiment of the present invention, the electronic device can be provided with reduced manufacturing cost.

In the display apparatus of one embodiment of the present invention, when an object reflects (or scatters) light emitted from the light-emitting device included in the display portion, the light-receiving device can detect reflected light (or scattered light); thus, image capturing or touch detection is possible even in a dark place.

When the light-receiving devices are used as an image sensor, the display apparatus can capture an image using the light-receiving devices. For example, the display apparatus of this embodiment can be used as a scanner.

For example, data on biological information such as a fingerprint or a palm print can be obtained with use of the image sensor. That is, a biometric authentication sensor can be incorporated in the display apparatus. When the display apparatus incorporates a biometric authentication sensor, the number of components of an electronic device can be reduced as compared to the case where a biometric authentication sensor is provided separately from the display apparatus; thus, the size and weight of the electronic device can be reduced.

In the case where the light-receiving devices are used as the touch sensor, the display apparatus can detect proximity or touch of an object with the use of the light-receiving devices. The display apparatus of one embodiment of the present invention can have one or both of an image capturing function and a sensing function in addition to an image displaying function. Thus, the display apparatus of one embodiment of the present invention can be regarded as highly compatible with the function other than the display function.

Next, materials that can be used for the light-emitting device will be described.

A conductive film transmitting visible light is used as the electrode through which light is extracted, which is either the pixel electrode or the common electrode. A conductive film that reflects visible light is preferably used as the electrode through which light is not extracted. In the case where the display apparatus includes a light-emitting device emitting infrared light, a conductive film which transmits visible light and infrared light is used as the electrode through which light is extracted, and a conductive film reflecting visible light and infrared light is preferably used as the electrode through which light is not extracted.

A conductive film transmitting visible light may be used also for an electrode through which light is not extracted. In that case, the electrode is preferably placed between a reflective layer and the EL layer. In other words, light emitted by the EL layer may be reflected by the reflective layer to be extracted from the display apparatus.

As a material that forms the pair of electrodes (the pixel electrode and the common electrode) of the light-emitting device, a metal, an alloy, an electrically conductive compound, a mixture thereof, and the like can be used as appropriate. Specific examples include indium tin oxide (In—Sn oxide, also referred to as ITO), In—Si—Sn oxide (also referred to as ITSO), indium zinc oxide (In—Zn oxide), In—W—Zn oxide, an alloy containing aluminum (an aluminum alloy) such as an alloy of aluminum, nickel, and lanthanum (Al—Ni—La), and an alloy of silver, palladium, and copper (Ag—Pd—Cu, also referred to as APC). In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not exemplified above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

The light-emitting device preferably employs a microcavity structure. Therefore, one of the pair of electrodes of the light-emitting device preferably has an electrode having properties of transmitting and reflecting visible light (a transflective electrode), and the other preferably has an electrode having a property of reflecting visible light (a reflective electrode). When the light-emitting device has a microcavity structure, light obtained from the light-emitting layer can be resonated between the electrodes, whereby light emitted from the light-emitting device can be intensified.

The transflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light at a wavelength longer than or equal to 400 nm and shorter than 750 nm) transmittance higher than or equal to 40% is preferably used in the light-emitting device. The visible light reflectivity of the transflective electrode is higher than or equal to 10% and lower than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity of $1\times10^{-2}$ Ωcm or lower.

The light-emitting layer contains a light-emitting material (also referred to as a light-emitting substance). The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (guest material). As one or more kinds of organic compounds, one or both of a hole-transport material and an electron-transport material can be used. Alternatively, as one or more kinds of organic compounds, a bipolar material or a TADF material may be used.

The light-emitting layer preferably includes a phosphorescent material and a combination of a hole-transport material and an electron-transport material that easily forms an exciplex, for example. Such a structure makes it possible to efficiently obtain light emission using ExTET (Exciplex-Triplet Energy Transfer), which is energy transfer from an exciplex to a light-emitting substance (a phosphorescent material). When a combination of materials is selected to form an exciplex that exhibits light emission whose wavelength is to be overlapped with the wavelength of the lowest-energy-side absorption band of the light-emitting substance, energy can be transferred smoothly and light emission can be obtained efficiently. With this structure, high efficiency, low-voltage driving, and a long lifetime of a light-emitting device can be achieved at the same time.

In addition to the light-emitting layer, the layer 113*a*, the layer 113*b*, and the layer 113*c* may each further include a layer containing any of a substance with a high hole-injection property, a substance with a high hole-transport property, a hole-blocking material, a substance with a high electron-transport property, a substance with a high electron-injection property, an electron-blocking material, a substance with a bipolar property (a substance with a high electron-transport property and a high hole-transport property), and the like.

Either a low molecular compound or a high molecular compound can be used in the light-emitting device, and an inorganic compound may also be included. Each layer included in the light-emitting device can be formed by a method such as an evaporation method (including a vacuum evaporation method), a transfer method, a printing method, an inkjet method, or a coating method.

For example, the layer 113*a*, the layer 113*b*, and the layer 113*c* may each include one or more of a hole-injection layer, a hole-transport layer, a hole-blocking layer, an electron-blocking layer, an electron-transport layer, and an electron-injection layer.

The common layer 114 can include one or more of a hole-injection layer, a hole-transport layer, a hole-blocking layer, an electron-blocking layer, an electron-transport layer, and an electron-injection layer. For example, a carrier-injection layer (a hole-injection layer or an electron-injection layer) may be formed as the common layer 114. Note that the light-emitting device does not necessarily include the common layer 114.

The layer 113*a*, the layer 113*b*, and the layer 113*c* each preferably include a light-emitting layer and a carrier-transport layer over the light-emitting layer. Accordingly, the light-emitting layer is inhibited from being exposed on the outermost surface in the fabrication process of the display apparatus 100, so that damage to the light-emitting layer can be reduced. Thus, the reliability of the light-emitting device can be increased.

The hole-injection layer is a layer injecting holes from an anode to the hole-transport layer, and a layer containing a material with a high hole-injection property. Examples of a material with a high hole-injection property include an aromatic amine compound and a composite material containing a hole-transport material and an acceptor material (electron-accepting material).

The hole-transport layer is a layer transporting holes, which are injected from the anode by the hole-injection layer, to the light-emitting layer. The hole-transport layer is a layer containing a hole-transport material. For the hole-transport material, a substance having a hole mobility higher than or equal to $1\times10^{-6}$ $cm^2/Vs$ is preferable. Note that other substances can also be used as long as they have a property of transporting more holes than electrons. As the hole-transport material, materials with a high hole-transport property, such as a Tc-electron rich heteroaromatic compound (e.g., a carbazole derivative, a thiophene derivative, and a furan derivative) and an aromatic amine (a compound having an aromatic amine skeleton), are preferable. The electron-transport layer is a layer transporting electrons, which are injected from a cathode by the electron-injection layer, to the light-emitting layer. The electron-transport layer is a layer containing an electron-transport material. As the electron-transport material, a substance having an electron mobility greater than or equal to $1\times10^{-6}$ $cm^2/Vs$ is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a Tc-electron deficient heteroaromatic compound such as a nitrogen-containing heteroaromatic compound.

The electron-injection layer is a layer injecting electrons from the cathode to the electron-transport layer and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (an electron-donating material) can also be used. Note that it is preferable that a material with a high electron-injection property be a material whose lowest unoccupied molecular orbital (LUMO) level value has a small difference from the work function value of a material used for the common electrode; for example, the difference of value is preferably lower than or equal to 0.5 eV.

As the electron-injection layer, an alkali metal, an alkaline earth metal, or a compound thereof, such as lithium, cesium, ytterbium, lithium fluoride (LiF), cesium fluoride (CsF), calcium fluoride ($CaF_x$, where x is a given number), 8-(quinolinolato)lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl) phenolatolithium (abbreviation: LiPPP), lithium oxide ($LiO_x$), or cesium carbonate can be used, for example. In addition, the electron-injection layer may have a stacked-layer structure of two or more layers. In the stacked-layer structure, for example, lithium fluoride can be used for the first layer and ytterbium can be used for the second layer.

Alternatively, the electron-injection layer may be formed using an electron-transport material. For example, a compound having an unshared electron pair and an electron deficient heteroaromatic ring can be used for the electron-transport material. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) level of the organic compound having an unshared electron pair is preferably higher than or equal to −3.6 eV and lower than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used for the organic compound having an unshared electron pair. Note that NBPhen has a higher glass transition temperature (Tg) than BPhen and thus has high heat resistance.

In the case of fabricating a tandem light-emitting device, a charge-generation layer (also referred to as an intermediate layer) is provided between two light-emitting units. The intermediate layer has a function of injecting electrons into one of the two light-emitting units and injecting holes to the other when voltage is applied between the pair of electrodes.

For the charge-generation layer, for example, a material that can be used for the electron-injection layer, such as lithium, can be suitably used. For the charge-generation layer, for example, a material that can be used for the hole-injection layer can be suitably used. For the charge-generation layer, a layer containing a hole-transport material and an acceptor material (electron-accepting material) can be used. For the charge-generation layer, a layer containing an electron-transport material and a donor material can be used. Forming such a charge-generation layer can inhibit an increase in the driving voltage that would be caused by stacking light-emitting units.

For the pixel electrode 111, for example, a metal material such as aluminum, gold, platinum, silver, nickel, tungsten, chromium, molybdenum, iron, cobalt, copper, or palladium or an alloy containing any of these metal materials can be used. Copper is preferably used because of its high reflectance with respect to visible light. Aluminum is preferable because an aluminum electrode is easily etched and thus is easily processed, and aluminum has high reflectance with respect to visible light and near-infrared light. Lanthanum, neodymium, germanium, or the like may be added to the above metal material or alloy. An alloy (an aluminum alloy) containing aluminum and titanium, nickel, or neodymium may be used. Alternatively, an alloy containing silver and copper, palladium, or magnesium may be used. An alloy containing silver and copper is preferable because of its high heat resistance.

Alternatively, for the pixel electrode 111, for example, indium oxide, indium tin oxide, indium zinc oxide, zinc oxide, or zinc oxide to which gallium is added can be used. Alternatively, a metal material such as gold, silver, platinum, magnesium, nickel, tungsten, chromium, molybdenum, iron, cobalt, copper, palladium, or titanium; an alloy containing any of these metal materials; a nitride of any of these metal materials (e.g., titanium nitride), or the like formed thin enough to have a light-transmitting property can be used. Furthermore, a stacked-layer film of the above materials can be used for a conductive layer. For example, a stacked-layer film of indium tin oxide and an alloy of silver and magnesium is preferably used, in which case conductivity can be increased. Further alternatively, graphene or the like may be used.

For the pixel electrode 111, a single-layer structure or a stacked-layer structure of a film containing the material exemplified above can be employed.

The pixel electrode 111 may have a structure in which a conductive metal oxide film is stacked over a conductive film that reflects visible light. Such a structure can inhibit the conductive film that reflects visible light from being oxidized or corroded. When a metal film or a metal oxide film is stacked in contact with an aluminum film or an aluminum alloy film, for example, oxidization can be inhibited. Examples of a material for the metal film or the metal oxide film include titanium and titanium oxide. Alternatively, the above conductive film that transmits visible light and a film containing a metal material may be stacked. For example, a stacked-layer film of silver and indium tin oxide or a stacked-layer film of an alloy of silver and magnesium and indium tin oxide can be used.

Figure 3A:
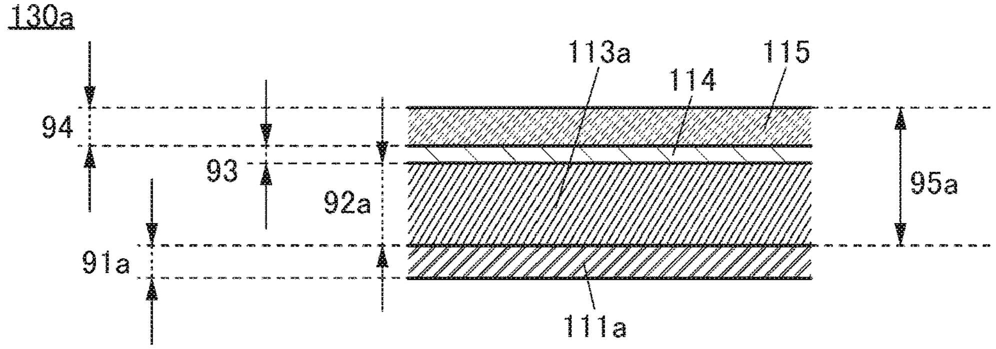
FIG. 3A to FIG. 3D are cross-sectional views illustrating examples of a display apparatus.
Figure 3B:
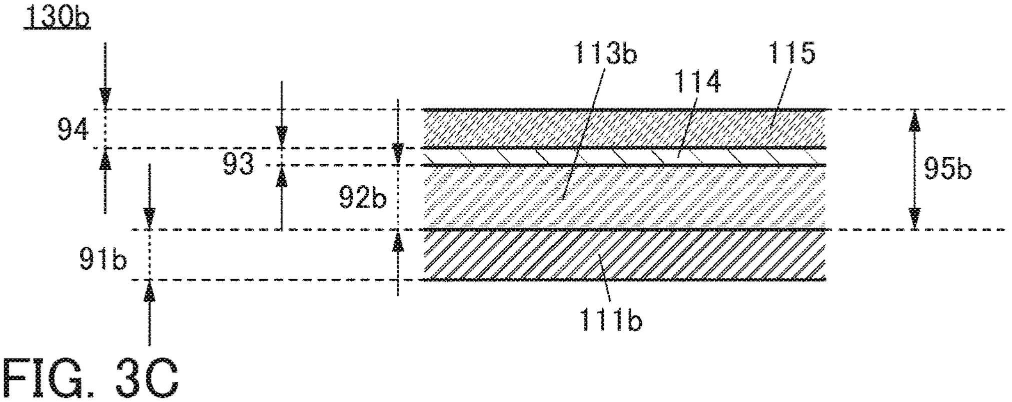
Figure 3C:
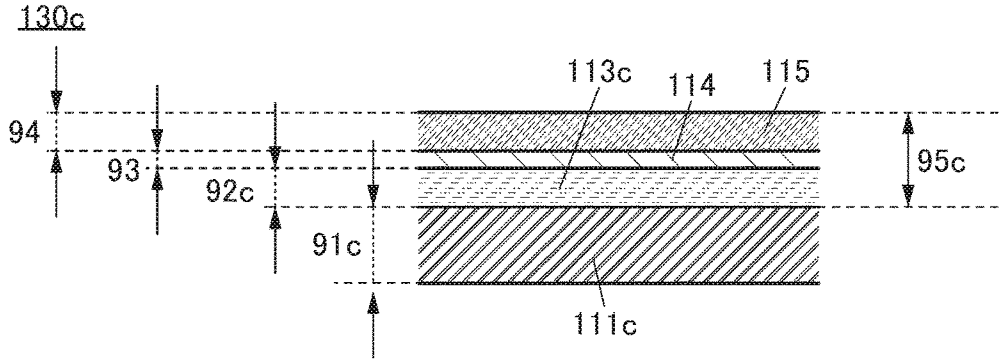

FIG. 3A to FIG. 3C are schematic diagrams each illustrating the thicknesses of the pixel electrode 111, the layer 113, the common layer 114, and the common electrode 115.

The thicknesses of the pixel electrode 111*a*, the pixel electrode 111*b*, and the pixel electrode 111*c* are denoted by a thickness 91*a*, a thickness 91*b*, and a thickness 91*c*, respectively.

The thicknesses of the layer 113*a*, the layer 113*b*, and the layer 113*c* are denoted by a thickness 92*a*, a thickness 92*b*, and a thickness 92*c*, respectively.

The thickness of the common layer 114 is denoted by a thickness 93. The thickness of the common electrode 115 is denoted by a thickness 94. Note that the light-emitting device 130 can have a structure not including the common layer 114. When the thickness of the common layer 114 is extremely small, the common layer 114 may be difficult to observe in cross-sectional observation of the light-emitting device 130.

The total thickness of the pixel electrode 111 and the layer 113 are preferably substantially the same among a plurality of the light-emitting devices 130.

Here, in the case where the sum of the thicknesses in a region is substantially the same or the sum of the thickness and the distance in a region is substantially the same among the stacked-layer structures included in the light-emitting devices 130, the difference between the value of one sum and the value of the other sum is preferably less than or equal to 100 nm, further preferably less than or equal to 50 nm. The value of the one sum is preferably greater than equal to 0.8 times and less than or equal to 1.2 times the value of the other sum. The value of the one sum is further preferably greater than equal to 0.9 times and less than or equal to 1.1 times the value of the other sum.

The thickness of the layer 113 is, for example, greater than or equal to 10 nm and less than or equal to 1000 nm. Here, a case where the insulating layer 125 is provided between two adjacent light-emitting devices 130 (hereinafter referred to as a first light-emitting device and a second light-emitting device) in a top view is considered. The insulating layer 125 is preferably in contact with the side surfaces of the layers 113 in the two light-emitting devices 130. In the case where the interval between the side surface of the layer 113 which is in contact with the insulating layer 125 in the first light-emitting device (hereinafter a first side surface) and the side surface of the layer 113 which is in contact with the insulating layer 125 in the second light-emitting device (hereinafter a second side surface) is small, the distance between the first side surface and the top surface of the insulating layer 127 and the distance between the second side surface and the top surface of the insulating layer 127 decreases, and consequently the layer 113 may be likely to be further affected by a stress change due to the shrinkage of the insulating layer 127.

Therefore, a more significant effect can be sometimes obtained in the structure of one embodiment of the present invention compared to, especially, that in the case where the interval between the first side surface and the second side surface is small. For example, a more significant effect can be obtained in the display apparatus having an extremely high resolution with the structure of one embodiment of the present invention in some cases.

For example, a more significant effect can be obtained in the structure of one embodiment of the present invention compared to that in the structure in which the interval between the first side surface and the second side surface is small with respect to the thickness of the layer 113 in some cases.

Specifically, for example, a more significant effect can be obtained in the structure of one embodiment of the present invention in the case where the interval between the first side surface and the second side surface is less than or equal to 2000 nm or less than or equal to 1000 nm in some cases.

For example, the sum of the thickness 91*a* and the thickness 92*a* is preferably substantially equal to the sum of the thickness 91*b* and the thickness 92*b* because the top surface of the layer 113*a* and the top surface of the layer 113*b* are substantially level with each other in the display apparatus 100 illustrated in FIG. 1A and the like. The sum of the thickness 91*a* and the thickness 92*a* is preferably substantially equal to the sum of the thickness 91*c* and the thickness 92*c* because the top surface of the layer 113*a* and the top surface of the layer 113*c* are substantially level with each other in the display apparatus 100 illustrated in FIG. 1A and the like.

In FIG. 3A to FIG. 3C, the thickness 91*a* is smaller than the thickness 91*b* and the thickness 92*a* is larger than the thickness 92*b*. Furthermore, in FIG. 3A to FIG. 3C, the thickness 91*b* is smaller than the thickness 91*c* and the thickness 92*b* is larger than the thickness 92*c*.

Note that the interface between the common layer 114 and the layer 113 is sometimes difficult to observe in cross-sectional observation of the light-emitting device 130. Accordingly, for example, the total thickness of the layer 113 and the common layer 114 may be used for the evaluation. Here, the layer 113*a* and the common layer 114 can be collectively referred to as an EL layer included in the light-emitting device 130*a*. In addition, the layer 113*b* and the common layer 114 can be collectively referred to as an EL layer included in the light-emitting device 130*b*. In addition, the layer 113*c* and the common layer 114 can be collectively referred to as an EL layer included in the light-emitting device 130*c*.

The sum of the thickness 91*a*, the thickness 92*a*, and the thickness 93 is denoted by t1. The sum of the thickness 91*b*, the thickness 92*b*, and the thickness 93 is denoted by t2. The sum of the thickness 91*c*, the thickness 92*c*, and the thickness 93 is denoted by t3. It is preferable that the t1 and the t2 be substantially the same. Furthermore, the difference between the t1 and the t2 is preferably less than or equal to 100 nm, further preferably less than or equal to 50 nm. In addition, it is preferable that t1 and t3 be substantially the same. Furthermore, the difference between t1 and t3 is preferably less than or equal to 100 nm, further preferably less than or equal to 50 nm.

Furthermore, in FIG. 3A to FIG. 3C, the thickness 91*a* is smaller than the thickness 91*b*, and the sum of the thickness 92*a* and the thickness 93 is larger than the sum of the thickness 92*b* and the thickness 93. Furthermore, in FIG. 3A to FIG. 3C, the thickness 91*b* is smaller than the thickness 91*c*, and the sum of the thickness 92*b* and the thickness 93 is larger than the sum of the thickness 92*c* and the thickness 93.

In addition, the interface between the common layer 114 and the layer 113 is sometimes difficult to observe in cross-sectional observation of the light-emitting device 130. Thus, the thickness may be calculated using the interface that can be clearly seen. For example, the distance may be calculated using the top surface or the bottom surface of an electrode.

For example, the distance between the top surface of the pixel electrode 111*a* and the top surface of the common electrode 115 is referred to as a distance 95*a*, the distance between the top surface of the pixel electrode 111*b* and the top surface of the common electrode 115 is referred to as a distance 95*b*, and the distance between the top surface of the pixel electrode 111*c* and the top surface of the common electrode 115 is referred to as a distance 95*c*. The sum of the thickness 91*a* and the distance 95*a* is preferably substantially equal to the sum of the thickness 91*b* and the distance 95*b*. The sum of the thickness 91*a* and the distance 95*a* is preferably substantially equal to the sum of the thickness 91*c* and the distance 95*c*.

In FIG. 3A to FIG. 3C, the thickness 91*a* is smaller than the thickness 91*b* and the distance 95*a* is larger than the distance 95*b*. Furthermore, in FIG. 3A to FIG. 3C, the thickness 91*b* is smaller than the thickness 91*c* and the distance 95*b* is larger than the distance 95*c*.

Figure 3D:
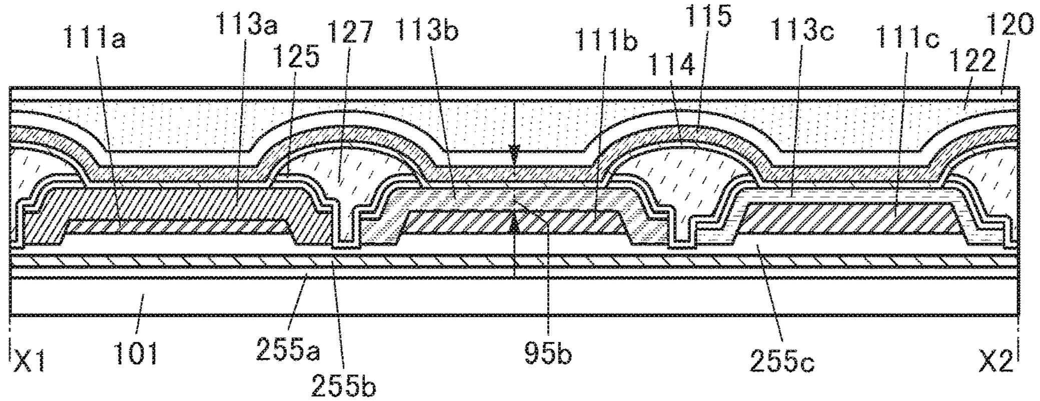

Note that in the case where the thicknesses of the pixel electrode 111, the layer 113, the common layer 114, and the common electrode 115 are evaluated and the layers are formed into an island shape, for example, the evaluation may be performed using the center and the vicinity thereof of the island-shaped layers in the cross-sectional observation image. FIG. 3D illustrates an example in which the distance 95*b* is evaluated using the center of the island-shaped pixel electrode 111*b*.

Furthermore, over the insulating layer 255*c*, another conductive layer is included, in addition to the pixel electrode 111 illustrated in FIG. 1B and the like, between the insulating layer 255*c* and the pixel electrode 111 in some cases. In such a case, the conductive layer is regarded as a pixel electrode in some cases, and the thickness 91*a*, the thickness 91*b*, and the thickness 91*c* described above may be replaced by the total thickness of the pixel electrode 111*a* and the conductive layer, the total thickness of the pixel electrode 111*b* and the conductive layer, and the total thickness of the pixel electrode 111*c* and the conductive layer, respectively. Alternatively, the conductive layer may be distinguished from the pixel electrode 111.

The display apparatus 100 includes a plurality of light-emitting devices 130. A light-emitting region of the light-emitting device 130 includes a conductive layer provided over at least one of the insulating layer 255*a*, the insulating layer 255*b*, and the insulating layer 255*c*. An EL layer is provided over a first region of the conductive layer. The common electrode 115 is provided over the EL layer.

The light-emitting device 130*a* includes a first conductive layer over at least one of the insulating layer 255*a*, the insulating layer 255*b*, and the insulating layer 255*c*, and a first EL layer is provided over a first region of the first conductive layer. In the first conductive layer, the first region is a region overlapping with the light-emitting region of the light-emitting device 130*a*, for example.

The light-emitting device 130*b* includes a second conductive layer over at least one of the insulating layer 255*a*, the insulating layer 255*b*, and the insulating layer 255*c*, and a second EL layer is provided over a second region of the second conductive layer. In the second conductive layer, the second region is a region overlapping with the light-emitting region of the light-emitting device 130*b*, for example.

The light-emitting device 130*c* includes a third conductive layer over at least one of the insulating layer 255*a*, the insulating layer 255*b*, and the insulating layer 255*c*, and a third EL layer is provided over a third region of the third conductive layer. In the third conductive layer, the third region is a region overlapping with the light-emitting region of the light-emitting device 130*c*, for example.

The total thickness of the first region and the first EL layer is preferably substantially equal to the total thickness of the second region and the second EL layer. Furthermore, the total thickness of the first region and the first EL layer is preferably substantially equal to the total thickness of the third region and the third EL layer.

Figure 4A:
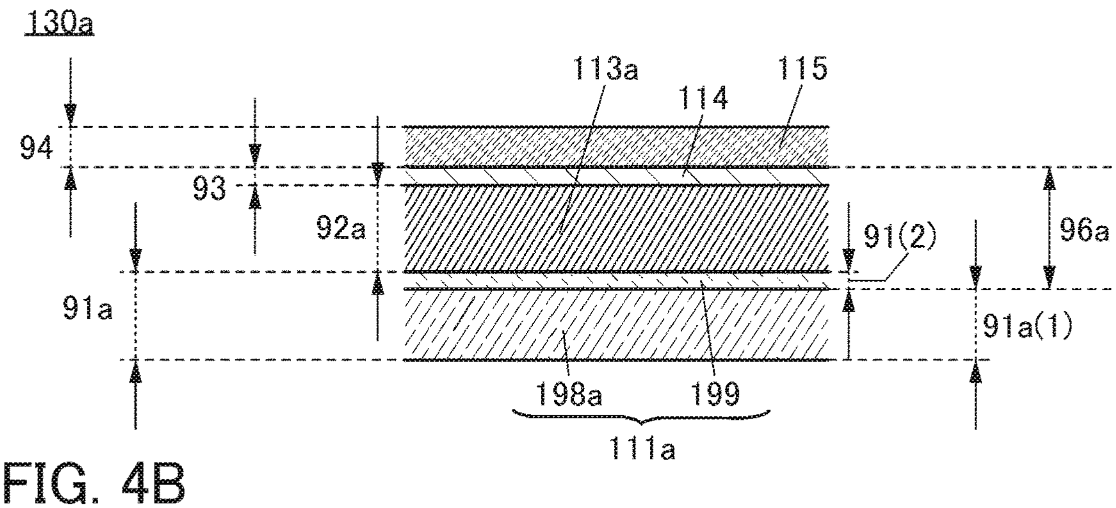
FIG. 4A to FIG. 4C are cross-sectional views illustrating examples of display apparatuses.
Figure 4B:
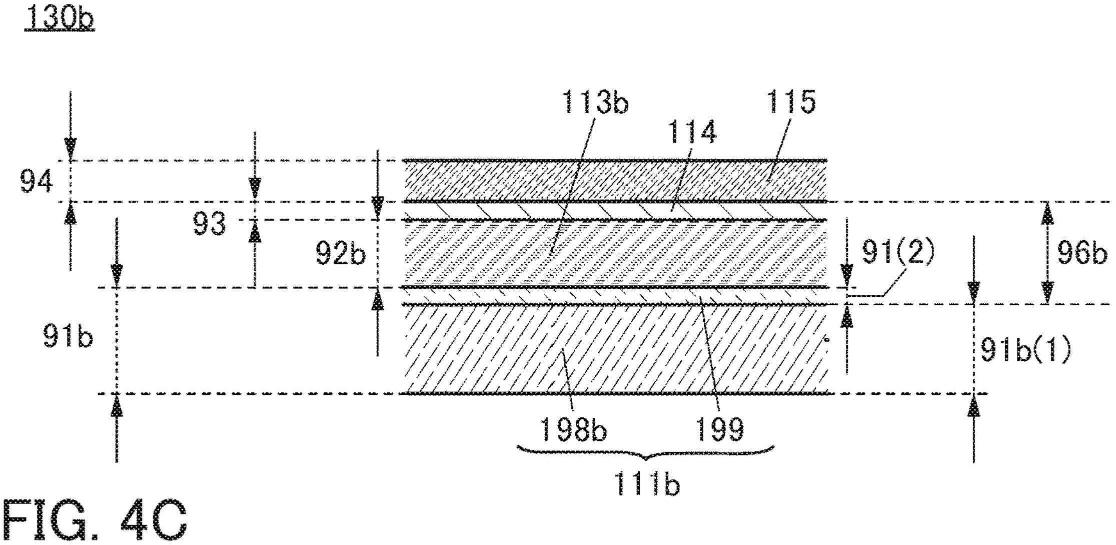
Figure 4C:
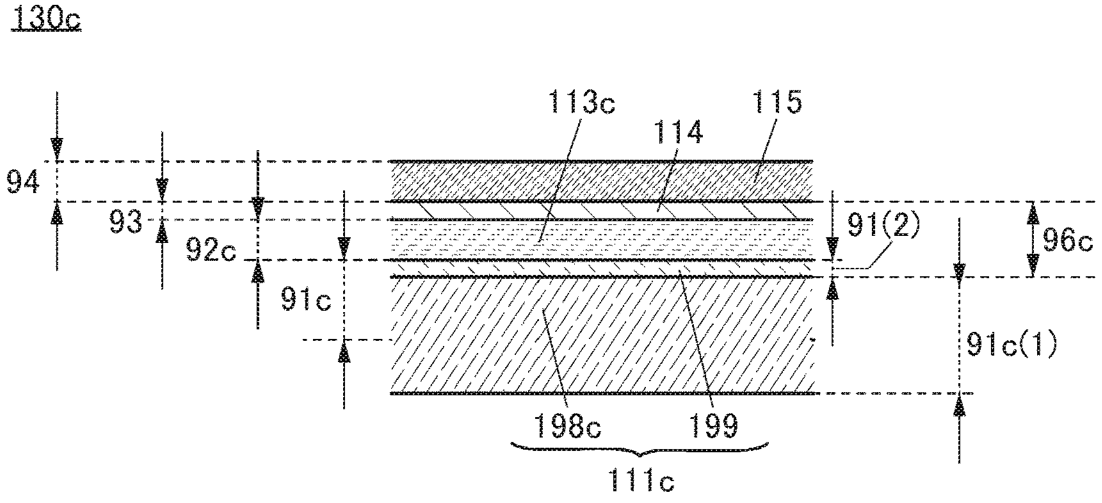

FIG. 4A illustrates an example in which the pixel electrode 111*a* has a stacked-layer structure of a conductive layer 198*a* and a conductive layer 199 over the conductive layer 198*a*. FIG. 4B illustrates an example in which the pixel electrode 111*b* has a stacked-layer structure of a conductive layer 198*b* and a conductive layer 199 over the conductive layer 198*b*. FIG. 4C illustrates an example in which the pixel electrode 111*c* has a stacked-layer structure of a conductive layer 198*c* and a conductive layer 199 over the conductive layer 198*c*. The conductive layer 198*a*, the conductive layer 198*b*, and the conductive layer 198*c* each preferably have a function of a reflective conductive film. The conductive layer 199 preferably has a function of a transparent conductive film.

Note that the conductive layer 198*a*, the conductive layer 198*b*, and the conductive layer 198*c* are collectively referred to as a conductive layer 198 in some cases.

The thicknesses of the conductive layer 198*a*, the conductive layer 198*b*, the conductive layer 198*c*, and the conductive layer 199 are denoted by a thickness 91*a*(1), a thickness 91*b*(1), a thickness 91*c*(1), and a thickness 91(2), respectively.

The distance between the top surface of the conductive layer 198*a* and the bottom surface of the common electrode 115 is denoted by a distance 96*a*, the distance between the top surface of the conductive layer 198*b* and the bottom surface of the common electrode 115 is denoted by a distance 96*b*, and the distance between the top surface of the conductive layer 198*c* and the bottom surface of the common electrode 115 is denoted by a distance 96*c*.

The distance 96*a*, the distance 96*b*, and the distance 96*c* correspond to the optical path lengths of the light-emitting device 130*a*, the light-emitting device 130*b*, and the light-emitting device 130*c*, respectively.

In the display apparatus 100 illustrated in FIG. 1B and the like, the distance 96*a* can be calculated from the sum of the thickness 91(2), thickness 92*a* and the thickness 93, for example. In addition, the distance 96*b* can be calculated from the sum of the thickness 91(2), thickness 92*b*, and the thickness 93, for example. In addition, the distance 96*c* can be calculated from the sum of the thickness 91(2), thickness 92*c* and the thickness 93, for example.

Note that a value obtained by adding the thickness of the common electrode 115 to the distance 96*a*, a value obtained by adding the thickness of the common electrode 115 to the distance 96*b*, and a value obtained by adding the thickness of the common electrode 115 to the distance 96*c* sometimes correspond to the optical path lengths of the light-emitting device 130*a*, the light-emitting device 130*b*, and the light-emitting device 130*c*, respectively. In other words, the optical path lengths of the light-emitting device 130*a*, the light-emitting device 130*b*, and the light-emitting device 130*c* can be sometimes calculated from, for example, the distance between the top surface of the conductive layer 198*a* and the top surface of the common electrode 115, the distance between the top surface of the conductive layer 198*b* and the top surface of the common electrode 115, and the distance between the top surface of the conductive layer 198*c* and the top surface of the common electrode 115, respectively.

In a plurality of light-emitting devices 130, the total thickness of the conductive layer 198 included in the pixel electrode 111 and the optical path length are preferably substantially the same.

For example, the sum of the thickness 91*a*(1) and the distance 96*a* is preferably substantially equal to the sum of the thickness 91*b*(1) and the distance 96*b*. Furthermore, the sum of the thickness 91*a*(1) and the distance 96*a* is preferably substantially equal to the sum of the thickness 91*c*(1) and the distance 96*c*.

Note that although FIG. 4A to FIG. 4C illustrate an example in which the light-emitting device 130*a*, the light-emitting device 130*b*, and the light-emitting device 130*c* include, as electrodes functioning as transparent conductive films, the conductive layers 199 having the same thickness, electrodes having different thicknesses may be included as electrodes functioning as transparent conductive films.

For the conductive layer 198*a*, the conductive layer 198*b*, and the conductive layer 198*c*, for example, a metal material such as aluminum, gold, platinum, silver, nickel, tungsten, chromium, molybdenum, iron, cobalt, copper, or palladium or an alloy containing any of these metal materials can be used. Copper is preferably used because of its high reflectance with respect to visible light. Aluminum is preferable because an aluminum electrode is easily etched and thus is easily processed, and aluminum has high reflectance with respect to visible light and near-infrared light. Lanthanum, neodymium, germanium, or the like may be added to the above metal material or alloy. An alloy (an aluminum alloy) containing aluminum and titanium, nickel, or neodymium may be used. Alternatively, an alloy containing silver and copper, palladium, or magnesium may be used. An alloy containing silver and copper is preferable because of its high heat resistance. The conductive layer 198*a*, the conductive layer 198*b*, and the conductive layer 198*c* can each have a single-layer structure or a stacked-layer structure including a film containing any of these materials. In the case where the conductive layer 198*a*, the conductive layer 198*b*, and the conductive layer 198*c* have a stacked-layer structure, a film containing the above-described material is preferably provided for the uppermost layer.

For the conductive layer 199, for example, indium oxide, indium tin oxide, indium zinc oxide, zinc oxide, or zinc oxide to which gallium is added can be used. Alternatively, a metal material such as gold, silver, platinum, magnesium, nickel, tungsten, chromium, molybdenum, iron, cobalt, copper, palladium, or titanium; an alloy containing any of these metal materials; a nitride of any of these metal materials (e.g., titanium nitride), or the like formed thin enough to have a light-transmitting property can be used. Furthermore, a stacked-layer film of the above materials can be used for a conductive layer. For example, a stacked-layer film of indium tin oxide and an alloy of silver and magnesium is preferably used, in which case conductivity can be increased. Further alternatively, graphene or the like may be used.

In the case where the conductive layer 198*a*, the conductive layer 198*b*, and the conductive layer 198*c* each have a stacked-layer structure, the above-described material exemplified for the conductive layer 199 may be used for a layer under the uppermost layer in each of the conductive layer 198*a*, the conductive layer 198*b*, and the conductive layer 198*c*.

Note that the pixel electrode 111*a*, the pixel electrode 111*b*, and the pixel electrode 111*c* may include films containing the same material and having the same thickness.

FIG. 6A to FIG. 6D illustrate an example in which part of the conductive layer 198*b* has the same structure as the conductive layer 198*a*, and part of the conductive layer 198*c* has the same structure as the conductive layer 198*b* and the conductive layer 198*a*.

The conductive layer 198*b* includes a conductive layer 198_2 and a conductive layer 198_3 stacked over the conductive layer 198_2. The conductive layer 198_3 is a film in which the material and the thickness are the same as those of the conductive layer 198*a*.

The conductive layer 198*c* includes a conductive layer 198_1, the conductive layer 198_2 stacked over the conductive layer 198_1, and the conductive layer 198_3 stacked over the conductive layer 198_2.

Note that the conductive layer 198_1, the conductive layer 1982, and the conductive layer 198_3 can each have a single-layer structure or a stacked-layer structure including a film containing the above-described material exemplified for the conductive layer 198*a*, the conductive layer 198*b*, and the conductive layer 198*c* can be employed.

As illustrated in FIG. 11A to FIG. 11D, a structure in which at least part of an end portion of the conductive layer 198_3 is positioned outward from the conductive layer 198_2 and a structure in which at least part of an end portion of the conductive layer 198_2 is positioned outward from the conductive layer 198_1 may be employed.

Alternatively, as illustrated in FIG. 12A to FIG. 12D, a structure in which at least part of the end portion of the conductive layer 198_3 is positioned inward from the conductive layer 198_2 and a structure in which at least part of the end portion of the conductive layer 198_2 is positioned inward from the conductive layer 1981 may be employed.

<Fabrication Method Example of Display Apparatus>

Next, an example of a method for fabricating the display apparatus 100 illustrated in FIG. 1A and the like is described with reference to FIG. 7A to FIG. 10B. FIG. 7A to FIG. 10B each illustrate a cross-sectional view along the dashed-dotted line X1-X2 and a cross-sectional view along the dashed-dotted line Y1-Y2 in FIG. 1A side by side.

Thin films included in the display apparatus (e.g., insulating films, semiconductor films, and conductive films) can be formed by a sputtering method, a chemical vapor deposition (CVD) method, a vacuum evaporation method, a pulsed laser deposition (PLD) method, an ALD method, or the like. Examples of a CVD method include a plasma-enhanced chemical vapor deposition (PECVD: Plasma Enhanced CVD) method and a thermal CVD method. As an example of the thermal CVD method, a metal organic chemical vapor deposition (MOCVD) method can be given.

Alternatively, thin films (e.g., an insulating film, a semiconductor film, and a conductive film) included in the display apparatus can be formed by a method such as spin coating, dipping, spray coating, ink-jetting, dispensing, screen printing, offset printing, a doctor knife method, slit coating, roll coating, curtain coating, or knife coating.

Specifically, for fabrication of the light-emitting device, a vacuum process such as an evaporation method and a solution process such as a spin coating method or an inkjet method can be used. Examples of an evaporation method include physical vapor deposition methods (PVD methods) such as a sputtering method, an ion plating method, an ion beam evaporation method, a molecular beam evaporation method, and a vacuum evaporation method, and a chemical vapor deposition method (CVD method). Specifically, functional layers (e.g., a hole-injection layer, a hole-transport layer, a light-emitting layer, an electron-transport layer, and an electron-injection layer) included in the EL layer can be formed by an evaporation method (e.g., a vacuum evaporation method), a coating method (e.g., a dip coating method, a die coating method, a bar coating method, a spin coating method, or a spray coating method), a printing method (e.g., an inkjet method, a screen printing (stencil) method, an offset printing (planography) method, a flexography (relief printing) method, a gravure printing method, or a micro-contact printing method), or the like.

When the thin films that form the display apparatus are processed, a photolithography method or the like can be used for the processing. Alternatively, thin films may be processed by a nanoimprinting method, a sandblasting method, a lift-off method, or the like. Alternatively, island-shaped thin films may be directly formed by a film formation method using a shielding mask such as a metal mask.

There are the following two typical methods of a photolithography method. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As the light used for light exposure in the photolithography method, for example, an i-line (with a wavelength of 365 nm), a g-line (with a wavelength of 436 nm), an h-line (with a wavelength of 405 nm), or combined light of any of them can be used. Alternatively, ultraviolet light, KrF laser light, ArF laser light, or the like can be used. In addition, light exposure may be performed by liquid immersion exposure technique. As the light for exposure, extreme ultraviolet (EUV) light or X-rays may also be used. Instead of the light used for the light exposure, an electron beam can also be used. It is preferable to use EUV light, X-rays, or an electron beam because they can perform extremely minute processing. Note that a photomask is not needed when light exposure is performed by scanning with a beam such as an electron beam.

For etching of thin films, a dry etching method, a wet etching method, a sandblast method, or the like can be used.

First, the insulating layer 255*a*, the insulating layer 255*b*, and the insulating layer 255*c* are formed in this order over the layer 101 including transistors. For the insulating layers 255*a*, 255*b*, and 255*c*, any of the structures that can be employed for the insulating layers 255*a*, 255*b*, and 255*c* described above can be employed.

Figures 7A, 7B, 7C, 7D:
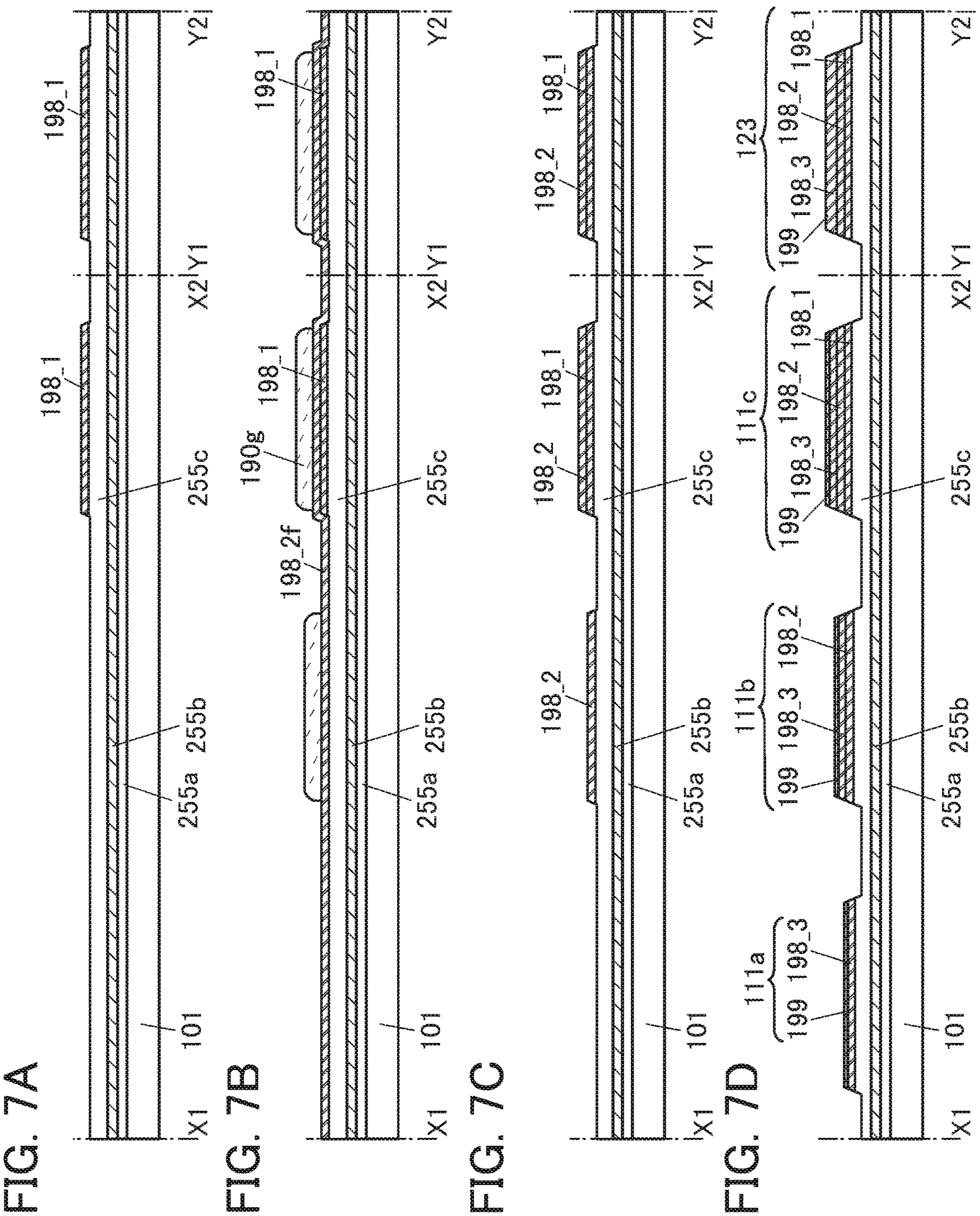
FIG. 7A to FIG. 7D are cross-sectional views illustrating an example of a method for fabricating a display apparatus.

Next, a conductive layer 198_1 is formed over a region where the pixel electrode 111*c* is to be formed and a region where the conductive layer 123 is to be formed over the insulating layer 255*c* (FIG. 7A). The conductive layer 198_1 can be formed, for example, by depositing a conductive film to be the conductive layer 198_1 over the insulating layer 255*c* and removing part of the conductive film. For formation of the conductive film to be the conductive film 198_1, a sputtering method or a vacuum evaporation method can be used, for example.

Next, a conductive film 198_2*f* to be the conductive layer 1982 is deposited over the insulating layer 255*c* and a plurality of conductive layers 198_1. Next, a mask 190*g* is formed over the conductive film 198_2*f* (FIG. 7B). The mask 190*g* is provided to overlap with regions where the pixel electrode 111*b*, the pixel electrode 111*c*, and the conductive layer 123 are to be formed. A resist mask can be used as the mask 190*g*, for example. Alternatively, a hard mask may be formed using a resist mask and a conductive layer may be formed using the hard mask. For formation of the conductive film 198_2*f*, a sputtering method or a vacuum evaporation method can be used, for example.

Then, part of the conductive film 198_2*f* is removed using the mask 190*g* as a mask, whereby the conductive layer 1982 is formed (FIG. 7C).

Next, a conductive film to be the conductive layer 198_3 is formed over the insulating layer 255*c*, the conductive layer 198_1, and the conductive layer 198_2. For formation of the conductive film to be the conductive layer 1983, a sputtering method or a vacuum evaporation method can be used, for example. Then, the conductive film is processed to form a plurality of conductive layers 198_3.

For formation of the conductive film to be the conductive layer 1983, a sputtering method or a vacuum evaporation method can be used, for example. The plurality of conductive layers 198_3 are provided so as to overlap with a region to be the pixel electrode 111*a*, a region to be the pixel electrode 111*b*, a region to be the pixel electrode 111*c*, and a region to be the conductive layer 123. The conductive layer 198_3 can be formed by depositing a conductive film to be the conductive layer 198_3 over the insulating layer 255*c*, the conductive layer 1981, and the conductive layer 198_2 and removing part of the conductive film.

Next, the conductive layer 199 is formed over each of the plurality of conductive layers 198_3, whereby the pixel electrode 111*a*, the pixel electrode 111*b*, the pixel electrode 111*c*, and the conductive layer 123 are formed over the insulating layer 255*c* (FIG. 7D). The conductive layer 199 can be formed by depositing a conductive film to be the conductive layer 199 and removing part of the conductive film. For formation of the conductive film to be the conductive layer 199, a sputtering method or a vacuum evaporation method can be used, for example.

In FIG. 7D, the pixel electrode 111*c* has a structure in which the conductive layer 1981, the conductive layer 1982, the conductive layer 1983, and the conductive layer 199 are stacked in this order from the bottom. The pixel electrode 111*b* has a structure in which the conductive layer 1982, the conductive layer 1983, and a conductive layer 199 are stacked in this order from the bottom. The pixel electrode 111*a* has a structure in which the conductive layer 198_1 and a conductive layer 199 are stacked in this order from the bottom. The conductive layer 123 has a structure in which the conductive layer 1981, the conductive layer 1982, the conductive layer 198_3, and the conductive layer 199 are stacked in this order from the bottom.

The end portions of the pixel electrodes 111*a*, 111*b*, and 111*c* each preferably have a tapered shape. This can improve the coverage with the layers formed over the pixel electrodes 111*a*, 111*b*, and 111*c* and improve the manufacturing yield of the light-emitting devices.

Next, a layer 113A is formed over the pixel electrode 111*a*, the pixel electrode 111*b*, and the pixel electrode 111*c*. Then, a first mask layer 118A is formed over the layer 113A and the conductive layer 123, and a second mask layer 119A is formed over the first mask layer 118A.

The layer 113A is a layer to be the layer 113*a* later. Thus, the above structure applicable to the layer 113*a* can be employed. The layer 113A can be formed by an evaporation method (including a vacuum evaporation method), a transfer method, a printing method, an inkjet method, a coating method, or the like. The layer 113A is preferably formed by an evaporation method. A premix material may be used in the deposition by an evaporation method. Note that in this specification and the like, a premix material is a composite material in which a plurality of materials are combined or mixed in advance.

Figure 8A:
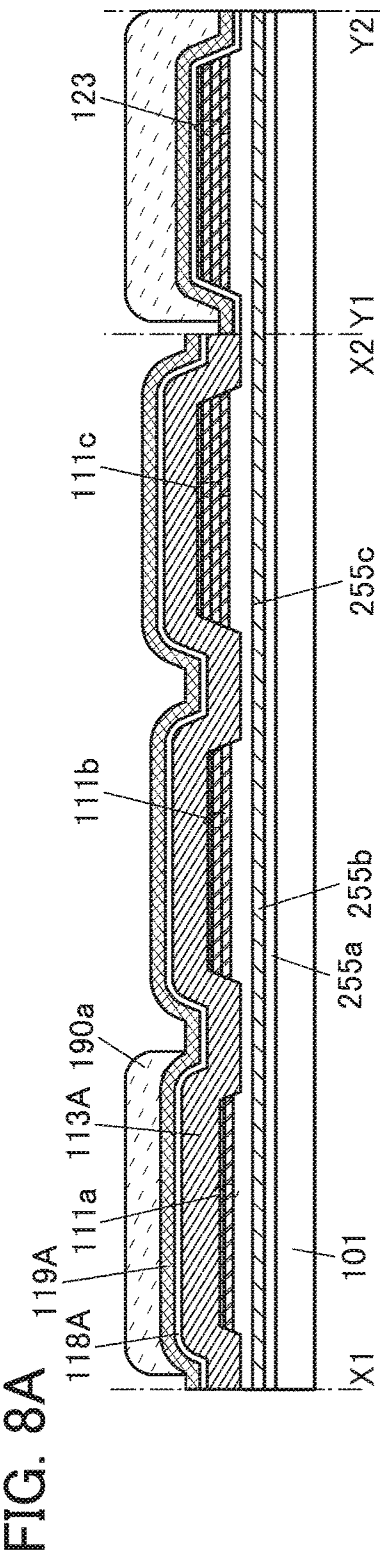
FIG. 8A to FIG. 8C are cross-sectional views illustrating the example of the method for fabricating a display apparatus.

Note that in a structure in FIG. 8A, the layer 113A is not provided over the conductive layer 123. For example, by using a mask for specifying a deposition area (also referred to as an area mask, a rough metal mask, or the like to be distinguished from a fine metal mask), a region where the layer 113A is deposited and a region where the layer 113A is not deposited can be controlled.

As the first mask layer 118A and the second mask layer 119A, a film that is highly resistant to the process conditions for the layer 113A, a layer 113B and a layer 113C to be formed later, and the like, specifically, a film having high etching selectivity with EL layers is used.

The first mask layer 118A and the second mask layer 119A can be formed by a sputtering method, an ALD method (a thermal ALD method and a PEALD method), a CVD method, or a vacuum evaporation method, for example. The first mask layer 118A, which is formed over and in contact with the EL layer, is preferably formed by a formation method that causes less damage to the EL layer than a formation method for the second mask layer 119A. For example, the first mask layer 118A is preferably formed by an ALD method or a vacuum evaporation method rather than a sputtering method. The first mask layer 118A and the second mask layer 119A are formed at a temperature lower than the upper temperature limit of the EL layer. The typical substrate temperatures in formation of the first mask layer 118A and the second mask layer 119A are each lower than or equal to 200° C., preferably lower than or equal to 150° C., further preferably lower than or equal to 120° C., still further preferably lower than or equal to 100° C., yet still further preferably lower than or equal to 80° C.

The first mask layer 118A and the second mask layer 119A are preferably films that can be removed by a wet etching method. Using a wet etching method can reduce damage to the layer 113A in processing of the first mask layer 118A and the second mask layer 119A, compared to the case of using a dry etching method.

The first mask layer 118A is preferably a film having high etching selectivity with the second mask layer 119A.

In the method for fabricating the display apparatus of this embodiment, it is desirable that the layers (e.g., the hole-injection layer, the hole-transport layer, the light-emitting layer, and the electron-transport layer) included in the EL layer not be easily processed in the step of processing the mask layers, and that the mask layers not be easily processed in the steps of processing the layers included in the EL layer. In consideration of the above, the materials and a processing method for the mask layers and processing methods for the EL layer are preferably selected.

Although this embodiment describes an example where the mask layer is formed to have a two-layer structure of the first mask layer and the second mask layer, the mask layer may have a single-layer structure or a stacked-layer structure of three or more layers.

As the first mask layer 118A and the second mask layer 119A, it is preferable to use an inorganic film such as a metal film, an alloy film, a metal oxide film, a semiconductor film, or an inorganic insulating film, for example.

For each of the first mask layer 118A and the second mask layer 119A, it is possible to use a metal material such as gold, silver, platinum, magnesium, nickel, tungsten, chromium, molybdenum, iron, cobalt, copper, palladium, titanium, aluminum, yttrium, zirconium, or tantalum or an alloy material containing any of the metal materials, for example. It is particularly preferable to use a low-melting-point material such as aluminum or silver. The use of a metal material capable of blocking ultraviolet light for one or both of the first mask layer 118A and the second mask layer 119A is preferable, in which case the EL layer can be inhibited from being irradiated with ultraviolet light and deteriorating.

For each of the first mask layer 118A and the second mask layer 119A, a metal oxide such as In—Ga—Zn oxide can be used. As the first mask layer 118A or the second mask layer 119A, an In—Ga—Zn oxide film can be formed by a sputtering method, for example. Furthermore, indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like can be used. Alternatively, indium tin oxide containing silicon or the like can also be used.

In addition, in place of gallium described above, an element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be used. In particular, M is preferably one or both of aluminum and yttrium.

As each of the first mask layer 118A and the second mask layer 119A, any of a variety of inorganic insulating films that can be used as the protective layer 131 can be used. In particular, an oxide insulating film is preferable because its adhesion to the EL layer is higher than that of a nitride insulating film. For example, an inorganic insulating material such as aluminum oxide, hafnium oxide, or silicon oxide can be used for each of the first mask layer 118A and the second mask layer 119A. As the first mask layer 118A or the second mask layer 119A, an aluminum oxide film can be formed by an ALD method, for example. The use of an ALD method is preferable, in which case damage to a base (in particular, the EL layer or the like) can be reduced.

For example, an inorganic insulating film (e.g., an aluminum oxide film) formed by an ALD method can be used as the first mask layer 118A, and an inorganic film (e.g., an In—Ga—Zn oxide film, an aluminum film, or a tungsten film) formed by a sputtering method can be used as the second mask layer 119A.

Note that the same inorganic insulating film can be used for both the first mask layer 118A and the insulating layer 125 that is to be formed later. For example, an aluminum oxide film formed by an ALD method can be used for both the first mask layer 118A and the insulating layer 125. Here, the same deposition conditions may be employed for the first mask layer 118A and the insulating layer 125. For example, when the first mask layer 118A is deposited under conditions similar to those of the insulating layer 125, the first mask layer 118A can be an insulating layer having a high barrier property against at least one of water and oxygen. Note that without limitation thereto, different deposition conditions may be employed for the first mask layer 118A and the insulating layer 125.

A material dissolvable in a solvent that is chemically stable with respect to at least the uppermost film of the layer 113A may be used for one or both of the first mask layer 118A and the second mask layer 119A. Specifically, a material that will be dissolved in water or alcohol can be suitably used. In depositing a film of such a material, it is preferable to apply the material dissolved in a solvent such as water or alcohol by a wet film formation method and then perform heat treatment for evaporating the solvent. At this time, the heat treatment is preferably performed in a reduced-pressure atmosphere, in which case the solvent can be removed at a low temperature in a short time and thermal damage to the EL layer can be reduced accordingly.

The first mask layer 118A and the second mask layer 119A may each be formed by a wet film formation method such as spin coating, dipping, spray coating, ink-jetting, dispensing, screen printing, offset printing, a doctor knife method, slit coating, roll coating, curtain coating, or knife coating.

The first mask layer 118A and the second mask layer 119A may each be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin.

Next, a resist mask 190*a* is formed over the second mask layer 119A (FIG. 8A). The resist mask can be formed by application of a photosensitive resin (photoresist), light exposure, and development.

The resist mask may be formed using either a positive resist material or a negative resist material.

The resist mask 190*a* is provided at a position overlapping with the pixel electrode 111*a*. One island-shaped pattern is preferably provided for one subpixel 110*a* or for one light-emitting device 130*a* as the resist mask 190*a*. Alternatively, one band-like pattern for a plurality of subpixels 110*a* aligned in one column (aligned in the Y direction in FIG. 1A) may be formed as the resist mask 190*a*.

Here, when the resist mask 190*a* is formed such that an end portion of the resist mask 190*a* is positioned outward from the end portion of the pixel electrode 111*a*, an end portion of the layer 113*a* to be formed later can be provided outward from the end portion of the pixel electrode 111*a*. Positioning the end portion of the layer 113*a* outward from the end portion of the pixel electrode 111*a* can increase the aperture ratio of the pixel.

Note that the resist mask 190*a* is preferably provided also at a position overlapping with the connection portion 140. This can inhibit the conductive layer 123 from being damaged during the fabrication process of the display apparatus.

Then, part of the second mask layer 119A is removed using the resist mask 190*a*, so that the mask layer 119*a* is formed. The mask layer 119*a* remains over the pixel electrode 111*a* and the conductive layer 123.

In etching the second mask layer 119A, an etching condition with high selectivity is preferably employed so that the first mask layer 118A is not removed by the etching. Since the EL layer is not exposed in processing the second mask layer 119A, the range of choices of the processing method is wider than that for processing the first mask layer 118A. Specifically, deterioration of the EL layer can be further inhibited even when a gas containing oxygen is used as an etching gas in processing the second mask layer 119A.

After that, the resist mask 190*a* is removed. The resist mask 190*a* can be removed by ashing using oxygen plasma, for example. Alternatively, an oxygen gas and any of $CF_4$, $C_4F_8$, $SF_6$, $CHF_3$, $Cl_2$, $H_2O$, $BCl_3$, and a noble gas (also referred to as rare gas) such as He may be used. Alternatively, the resist mask 190*a* may be removed by wet etching. At this time, the first mask layer 118A is positioned on the outermost surface and the layer 113A is not exposed; thus, the layer 113A can be inhibited from being damaged in the step of removing the resist mask 190*a*. In addition, the range of choices of the method for removing the resist mask 190*a* can be widened.

Next, part of the first mask layer 118A is removed using the mask layer 119*a* as a mask (also referred to as a hard mask), so that the mask layer 118*a* is formed.

The first mask layer 118A and the second mask layer 119A can be processed by a wet etching method or a dry etching method. The first mask layer 118A and the second mask layer 119A are preferably processed by anisotropic etching.

Using a wet etching method can reduce damage to the layer 113A in processing of the first mask layer 118A and the second mask layer 119A, compared to the case of using a dry etching method. In the case of using a wet etching method, it is preferable to use a developer, a tetramethylammonium hydroxide (TMAH) aqueous solution, dilute hydrofluoric acid, oxalic acid, phosphoric acid, acetic acid, nitric acid, or a chemical solution containing a mixed solution thereof, for example.

In the case of using a dry etching method, deterioration of the layer 113A can be inhibited by not using a gas containing oxygen as the etching gas. In the case of using a dry etching method, it is preferable to use a gas containing $CF_4$, $C_4F_8$, $SF_6$, $CHF_3$, $Cl_2$, $H_2O$, or $BCl_3$ or a noble gas (also referred to as a rare gas) such as He as the etching gas, for example.

For example, when an aluminum oxide film formed by an ALD method is used as the first mask layer 118A, the first mask layer 118A can be processed by a dry etching method using $CHF_3$ and He. In the case where an In—Ga—Zn oxide film formed by a sputtering method is used as the second mask layer 119A, the second mask layer 119A can be processed by a wet etching method using diluted phosphoric acid. Alternatively, the second mask layer 119A may be processed by a dry etching method using $CH_4$ and Ar. Alternatively, the second mask layer 119A can be processed by a wet etching method using diluted phosphoric acid. In the case where a tungsten film formed by a sputtering method is used as the second mask layer 119A, the second mask layer 119A can be processed by a dry etching method using a combination of $CF_4$ and $O_2$, a combination of $CF_6$ and $O_2$, a combination of $CF_4$, $Cl_2$, and $O_2$, or a combination of $CF_6$, $Cl_2$, and $O_2$.

Next, part of the layer 113A is removed by etching treatment using the mask layer 119*a* and the mask layer 118*a* as hard masks, whereby the layer 113*a* is formed.

Thus, a stacked-layer structure of the layer 113*a*, the mask layer 118*a*, and the mask layer 119*a* remains over the pixel electrode 111*a*. In the region corresponding to the connection portion 140, a stacked-layer structure of the mask layer 118*a* and the mask layer 119*a* remains over the conductive layer 123. A depressed portion is sometimes formed by the etching treatment in a region of the insulating layer 255*c* not overlapping with the layer 113*a*.

The layer 113*a* covers the top surface and the side surface of the pixel electrode 111*a* and thus, the subsequent steps can be performed without exposure of the pixel electrode 111*a*. When the end portion of the pixel electrode 111*a* is exposed, corrosion might occur in the etching step or the like. A product generated by corrosion of the pixel electrode 111*a* might be unstable; for example, the product might be dissolved in a solution in wet etching and might be diffused in an atmosphere in dry etching. The product dissolved in a solution or scattered in an atmosphere might be attached to a surface to be processed, the side surface of the layer 113*a*, and the like, which adversely affects the characteristics of the light-emitting device or forms a leakage path between the light-emitting devices in some cases. In a region where the end portion of the pixel electrode 111*a* is exposed, adhesion between layers in contact with each other might be lowered, which might be likely to cause film separation of the layer 113*a* or the pixel electrode 111*a*.

With the structure in which the layer 113*a* covers the top surface and the side surface of the pixel electrode 111*a*, for example, the yield of the light-emitting device can be improved and display quality of the light-emitting device can be improved.

Note that part of the layer 113A may be removed using the resist mask 190*a*. Then, the resist mask 190*a* may be removed.

The layer 113A is preferably processed by anisotropic etching. In particular, anisotropic dry etching is preferably used. Alternatively, wet etching may be used.

In the case of using a dry etching method, deterioration of the layer 113A can be inhibited by not using a gas containing oxygen as the etching gas.

A gas containing oxygen may be used as the etching gas. When the etching gas contains oxygen, the etching rate can be increased. Therefore, the etching can be performed under a low-power condition while an adequately high etching rate is maintained. Thus, damage to the layer 113A can be inhibited. Furthermore, a defect such as attachment of a reaction product generated in the etching can be inhibited.

In the case of using a dry etching method, it is preferable to use a gas containing at least one kind of $H_2$, $CF_4$, $C_4F_8$, $SF_6$, $CHF_3$, $Cl_2$, $H_2O$, $BCl_3$, and a noble gas (also referred to as a rare gas) such as He and Ar as the etching gas, for example. Alternatively, a gas containing oxygen and at least one of the above is preferably used as the etching gas. Alternatively, an oxygen gas may be used as the etching gas. Specifically, for example, a gas containing $H_2$ and Ar or a gas containing $CF_4$ and He can be used as the etching gas. As another example, a gas containing $CF_4$, He, and oxygen can be used as the etching gas.

Through the above steps, regions of the layer 113A, the first mask layer 118A, and the second mask layer 119A that do not overlap with the resist mask 190*a* can be removed.

Then, the layer 113B is formed over the mask layer 119*a*, the pixel electrode 111*b*, and the pixel electrode 111*c*, a first mask layer 118B is formed over the layer 113B, and a second mask layer 119B is formed over the first mask layer 118B. The layer 113B is not provided over the conductive layer 123. By using a mask for specifying a deposition area, a region where the layer 113B is deposited and a region where the layer 113B is not deposited can be controlled.

The layer 113B is a layer to be the layer 113*b* later. The layer 113*b* emits light of a color different from that of light emitted by the layer 113*a*. Structures, materials, and the like that can be used for the layer 113*b* are similar to those of the layer 113*a*. The layer 113B can be formed by a method similar to that for the layer 113A.

The first mask layer 118B can be formed using a material that can be used for the first mask layer 118A. The second mask layer 119B can be formed using a material that can be used for the second mask layer 119A.

Figure 8B:
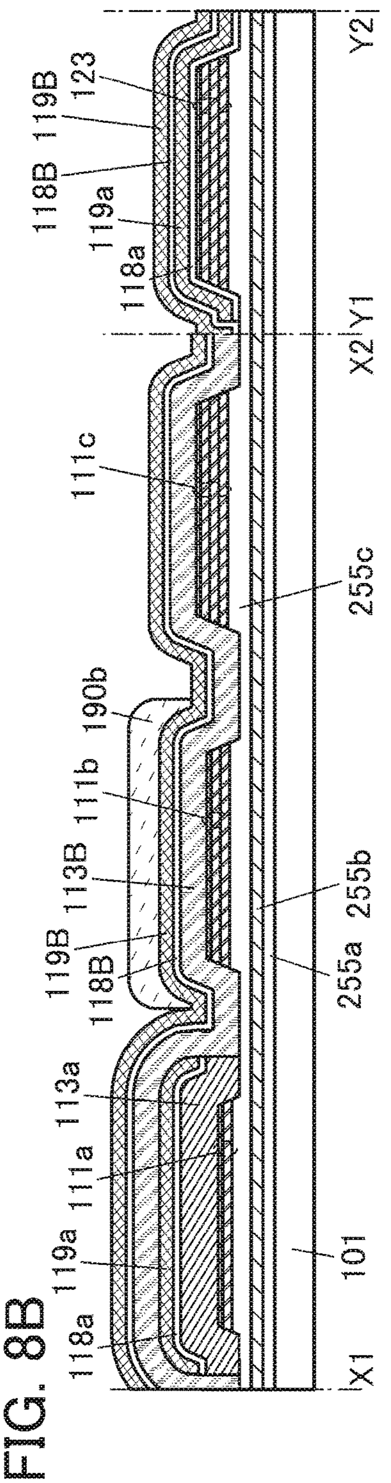

Next, a resist mask 190*b* is formed over the second mask layer 119B (FIG. 8B).

The resist mask 190*b* is provided at a position overlapping with the pixel electrode 111*b*.

Next, a step similar to the step described in the fabrication of the layer 113*a*, the mask layer 118*a*, and the mask layer 119*a* is performed, whereby regions of the layer 113B, the first mask layer 118B, and the second mask layer 119B, which do not overlap with the resist mask 190*b*, are removed.

Accordingly, a stacked-layer structure of the layer 113*b*, the mask layer 118*b*, and the mask layer 119*b* remains over the pixel electrode 111*b*. In the region corresponding to the connection portion 140, a stacked-layer structure of the mask layer 118*a* and the mask layer 119*a* remains over the conductive layer 123.

Next, the layer 113C is formed over the mask layer 119*a*, the mask layer 119*b*, and the pixel electrode 111*c*, a first mask layer 118C is formed over the layer 113C, and a second mask layer 119C is formed over the first mask layer 118C. The layer 113C is not provided over the conductive layer 123. By using a mask for specifying a deposition area, a region where the layer 113C is deposited and a region where the layer 113C is not deposited can be controlled.

The layer 113C is a layer to be the layer 113*c* later. The layer 113*c* emits light of a color different from those of light emitted by the layer 113*a* and the layer 113*b*. Structures, materials, and the like that can be used for the layer 113*c* are similar to those of the layer 113*a*. The layer 113C can be deposited by a method similar to that for the layer 113A.

The first mask layer 118C can be formed using a material that can be used for the first mask layer 118A. The second mask layer 119C can be formed using a material that can be used for the second mask layer 119A.

Figure 8C:
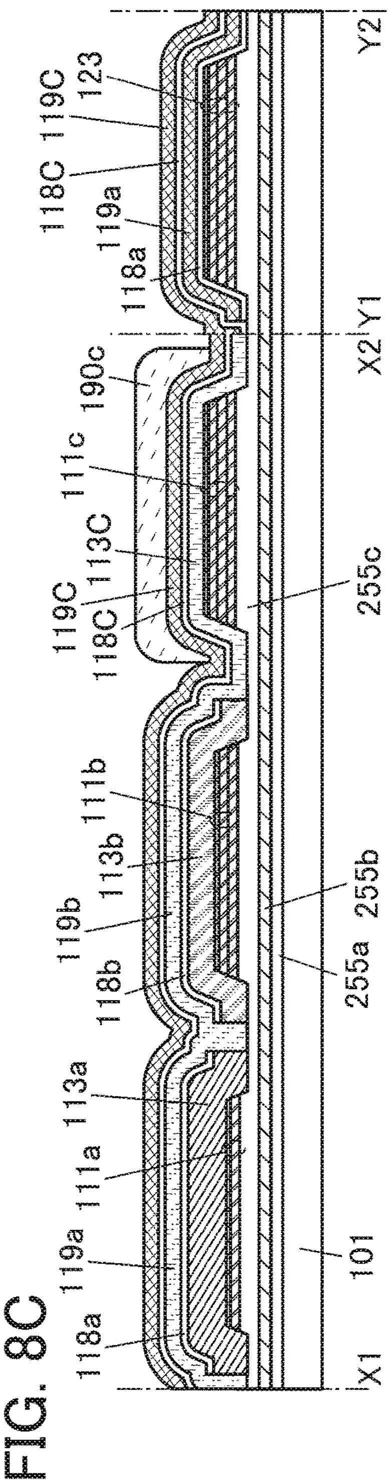

Next, a resist mask 190*c* is formed over the second mask layer 119C (FIG. 8C).

The resist mask 190*c* is provided at a position overlapping with the pixel electrode 111*c*. The resist mask 190*c* may be provided also at a position overlapping with the region to be the connection portion 140 later.

Next, a step similar to the step described in the fabrication of the layer 113*a*, the mask layer 118*a*, and the mask layer 119*a* is performed, whereby regions of the layer 113C, the first mask layer 118C, and the second mask layer 119C, which are not overlapping with the resist mask 190*c*, are removed.

Accordingly, a stacked-layer structure of the layer 113*c*, the mask layer 118*c*, and a layer obtained by processing the second mask layer 119C remains over the pixel electrode 111*c*. In the region corresponding to the connection portion 140, a stacked-layer structure of the mask layer 118*a* and the mask layer 119*a* remains over the conductive layer 123.

Note that the side surfaces of the layer 113*a*, the layer 113*b*, and the layer 113*c* are preferably perpendicular or substantially perpendicular to their formation surfaces. For example, the angle between the formation surfaces and these side surfaces is preferably greater than or equal to 60° and less than or equal to 90°.

As described above, by processing the EL layers by a photolithography method, the distance between pixels can be shortened to less than or equal to 8 μm, less than or equal to 5 μm, less than or equal to 3 μm, less than or equal to 2 μm, or less than or equal to 1 μm. Here, the distance between pixels can be determined by, for example, the distance between opposite end portions of two adjacent layers among the layer 113*a*, the layer 113*b*, and the layer 113*c*. The distance between pixels is shortened in this manner, whereby a display apparatus with high resolution and a high aperture ratio can be provided.

Figures 9A, 9B, 9C:
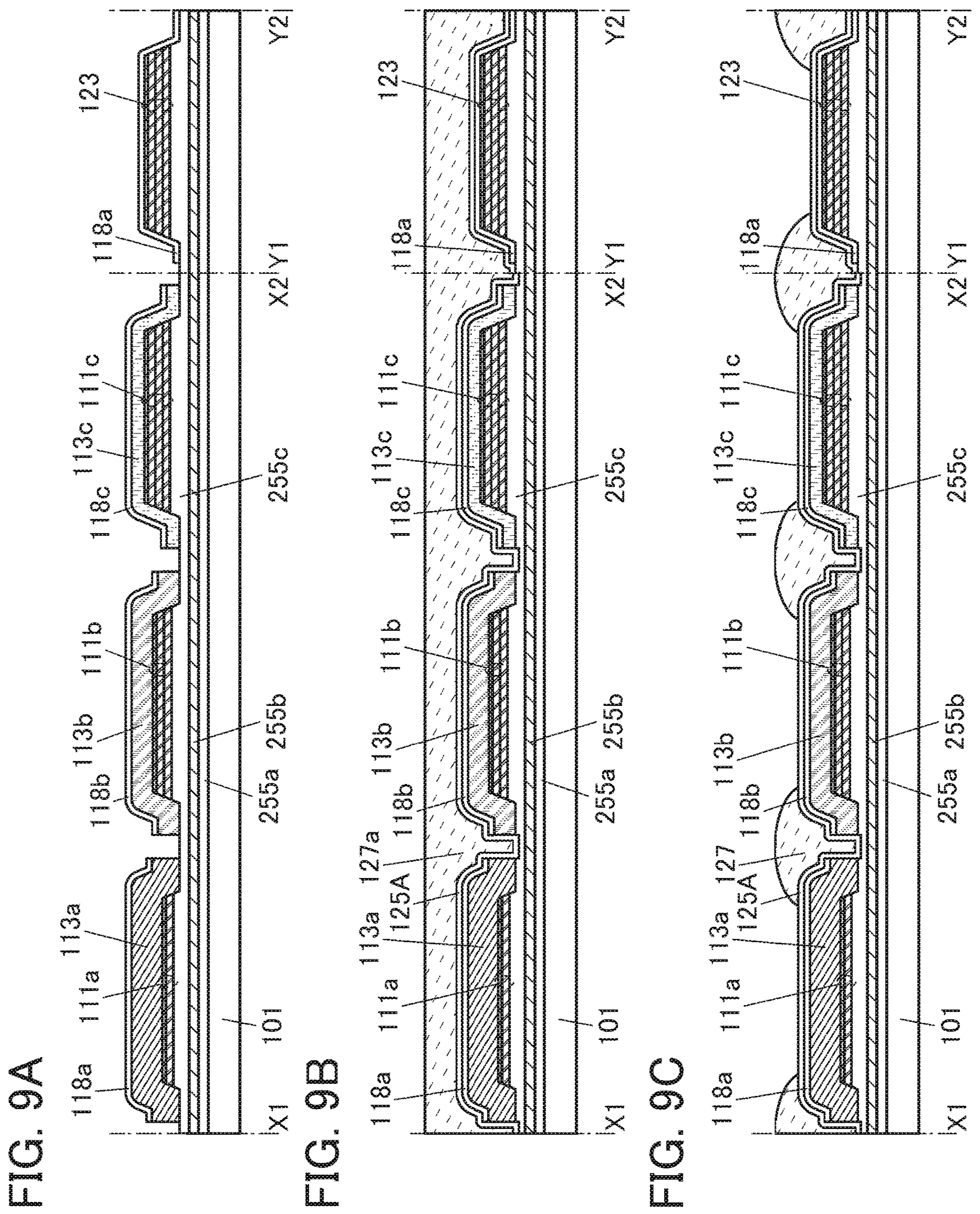
FIG. 9A to FIG. 9C are cross-sectional views illustrating the example of the method for fabricating a display apparatus.

Next, the mask layer 119*a*, the mask layer 119*b*, and the layer obtained by processing the second mask layer 119C are removed (FIG. 9A). As a result, the mask layer 118_a_ is exposed over the pixel electrode 111_a_, the mask layer 118_b_ is exposed over the pixel electrode 111_b_, the mask layer 118_c_ is exposed over the pixel electrode 111_c_, and the mask layer 118_a_ is exposed over the conductive layer 123.

Note that the formation step of an insulating film 125A may be performed without removing the mask layer 119_a_, the mask layer 119_b_, and the layer obtained by processing the second mask layer 119C.

The step of removing the mask layers can be performed by a method similar to that for the step of processing the mask layers. In particular, using a wet etching method can reduce damage to the layer 113_a_, the layer 113_b_, and the layer 113_c_ in removing the mask layers, as compared to the case of using a dry etching method.

The mask layers may be removed by being dissolved in a solvent such as water or alcohol. Examples of alcohol include ethyl alcohol, methyl alcohol, isopropyl alcohol (IPA), and glycerin.

After the mask layers are removed, drying treatment may be performed to remove water included in the EL layer and water adsorbed on the surface of the EL layer. For example, heat treatment in an inert gas atmosphere or a reduced-pressure atmosphere can be performed. The heat treatment can be performed with a substrate temperature higher than or equal to 50° C. and lower than or equal to 200° C., preferably higher than or equal to 60° C. and lower than or equal to 150° C., further preferably higher than or equal to 70° C. and lower than or equal to 120° C. Employing a reduced-pressure atmosphere is preferable, in which case drying at a lower temperature is possible.

Next, the insulating film 125A is formed to cover the layer 113_a_, the layer 113_b_, the layer 113_c_, and the mask layers 118_a_, 118_b_, and 118_c_.

The insulating film 125A is a layer to be the insulating layer 125 later. Thus, the insulating film 125A can be formed using a material that can be used for the insulating layer 125. The thickness of the insulating film 125A is preferably greater than or equal to 3 nm, greater than or equal to 5 nm, or greater than or equal to 10 nm and less than or equal to 200 nm, less than or equal to 150 nm, less than or equal to 100 nm, or less than or equal to 50 nm.

In particular, the insulating film 125A, which is formed in contact with the side surface of the EL layer, is preferably deposited by a formation method that causes little damage to the EL layer. In addition, the insulating film 125A is formed at a temperature lower than the upper temperature limit of the EL layer. The typical substrate temperature in formation of the insulating film 125A is lower than or equal to 200° C., preferably lower than or equal to 180° C., further preferably lower than or equal to 160° C., still further preferably lower than or equal to 150° C., yet still further preferably lower than or equal to 140° C.

As the insulating film 125A, an aluminum oxide film is preferably formed by an ALD method, for example. The use of an ALD method is preferable, in which case damage by the deposition is reduced and a film with favorable coverage can be deposited. Here, the insulating film 125A can be deposited using a material and a method which are similar to those of the mask layers 118_a_, 118_b_, and 118_c_. In this case, the boundary between the mask layers 118_a_, 118_b_, and 118_c_ and the insulating film 125A is unclear in some cases.

Next, the insulating layer 127_a_ is formed over the insulating film 125A by a coating method (FIG. 9B).

The insulating layer 127_a_ is a film to be the insulating layer 127 in a later step, and any of the above-described organic materials can be used for the insulating layer 127_a_. As the organic material, a photosensitive organic resin is preferably used; for example, a photosensitive acrylic resin may be used. The viscosity of the material of the insulating layer 127_a_ is greater than or equal to 1 cP and less than or equal to 1500 cP, and is preferably greater than or equal to 1 cP and less than or equal to 12 cP. By setting the viscosity of the material of the insulating layer 127_a_ in the above range, the insulating layer 127 having a tapered shape can be formed relatively easily.

There is no particular limitation on the method of forming the insulating layer 127_a_, and, for example, the insulating layer 127_a_ can be formed by a wet film formation method such as spin coating, dipping, spray coating, ink-jetting, dispensing, screen printing, offset printing, doctor blade coating, slit coating, roll coating, curtain coating, or knife coating. Specifically, the insulating layer 127_a_ is preferably formed by spin coating.

After the formation of the insulating layer 127_a_ by a coating method, heat treatment is preferably performed. The heat treatment is performed at a temperature lower than the upper temperature limit of the EL layer. The heat treatment may be performed with a substrate temperature higher than or equal to 50° C. and lower than or equal to 200° C., preferably higher than or equal to 60° C. and lower than or equal to 150° C., further preferably higher than or equal to 70° C. and lower than or equal to 120° C. Accordingly, a solvent contained in the insulating layer 127_a_ can be removed.

Then, part of the insulating layer 127_a_ is exposed to visible light or ultraviolet rays. Here, in the case where a positive acrylic resin is used for the insulating layer 127_a_, a region where the insulating layer 127 is not formed in a later step is irradiated with visible light or ultraviolet rays using a mask. In the case where visible light is used for exposure, the visible light preferably includes the i-line (wavelength: 365 nm). Furthermore, visible light including the g-line (wavelength: 436 nm), the h-line (wavelength: 405 nm), or the like may be used.

Note that a negative photosensitive organic resin may be used for the insulating layer 127_a_. In this case, a region where the insulating layer 127 is formed is irradiated with visible light or ultraviolet rays.

Next, development is performed to remove the region of the insulating layer 127_a_ subjected to the light exposure, whereby the insulating layer 127 can be formed (FIG. 9C). In the case where an acrylic resin is used for the insulating layer 127_a_, an alkaline solution is preferably used as a developer, and for example, a tetramethyl ammonium hydroxide (TMAH) aqueous solution is used.

After the development, the entire substrate may be subjected to light exposure, that is, the entire substrate may be irradiated with visible light or ultraviolet rays. Furthermore, after the development or after the development and light exposure, heat treatment may be performed.

Figure 10A:
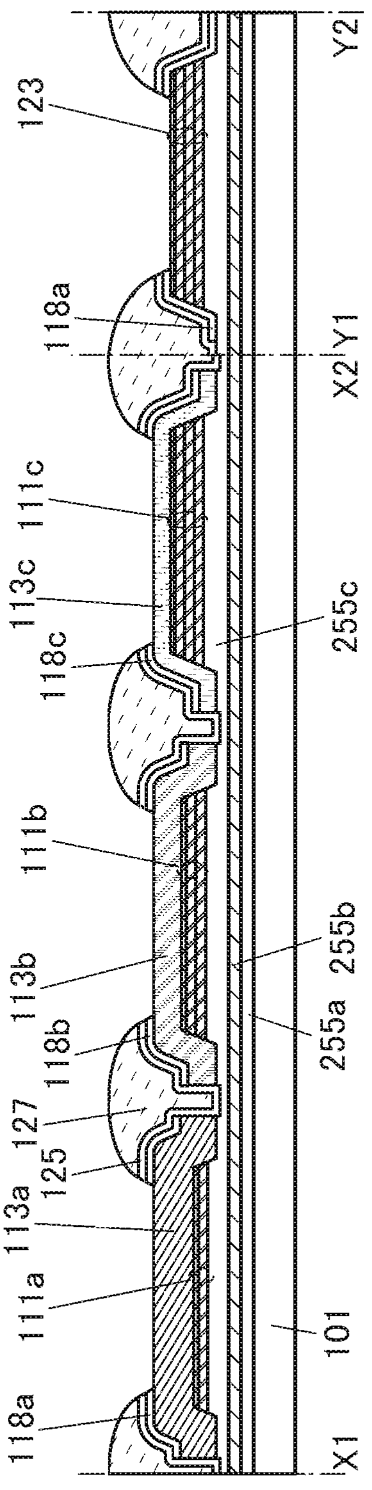
FIG. 10A and FIG. 10B are cross-sectional views illustrating the example of the method for fabricating a display apparatus.

Next, the insulating layer 125 is formed by etching treatment using the insulating layer 127 as a mask (FIG. 10A). The etching treatment can be performed by dry etching or wet etching.

Figure 10B:
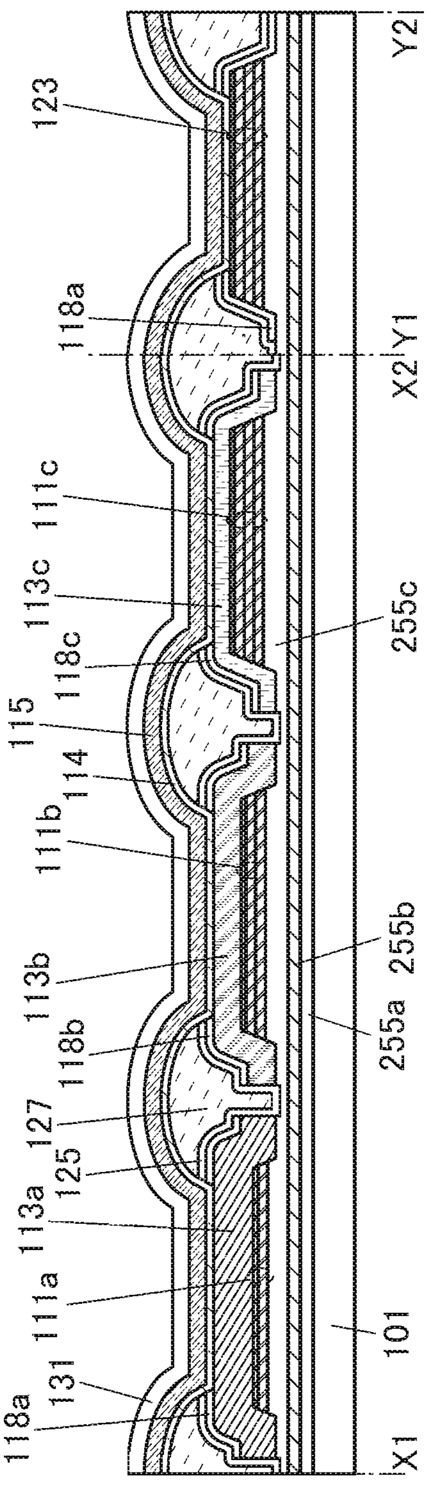
Figure 11A:
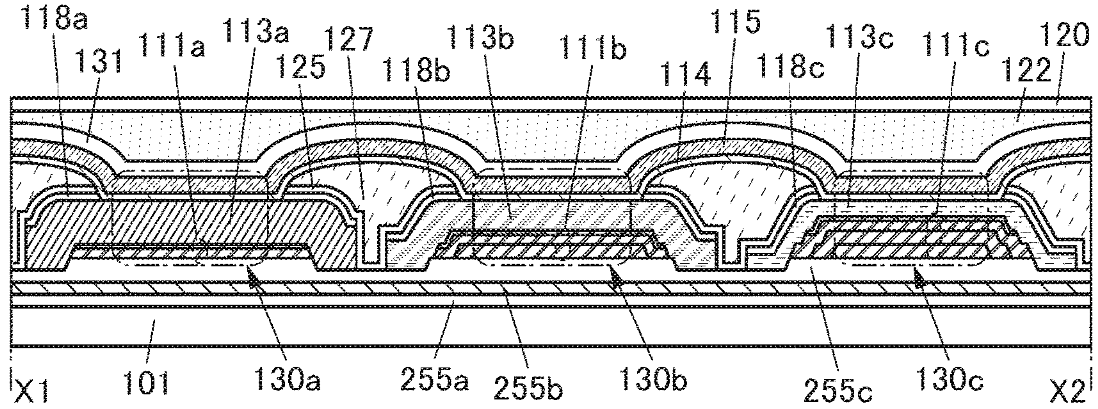
FIG. 11A is a cross-sectional view illustrating an example of a display apparatus.
Figure 11B:
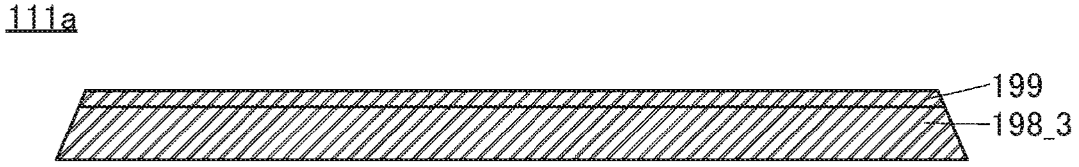
FIG. 11B to FIG. 11D are cross-sectional views illustrating examples of electrodes.
Figure 11C:
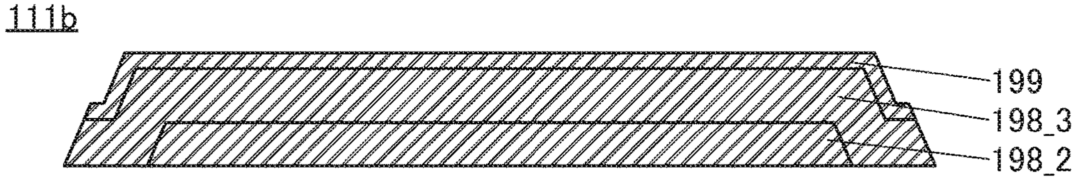
Figure 11D:
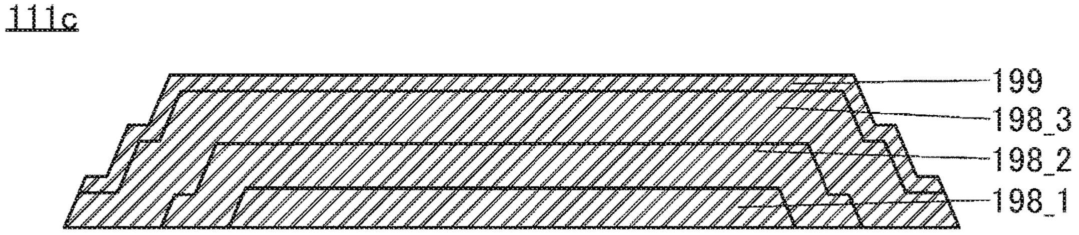
Figure 12A:
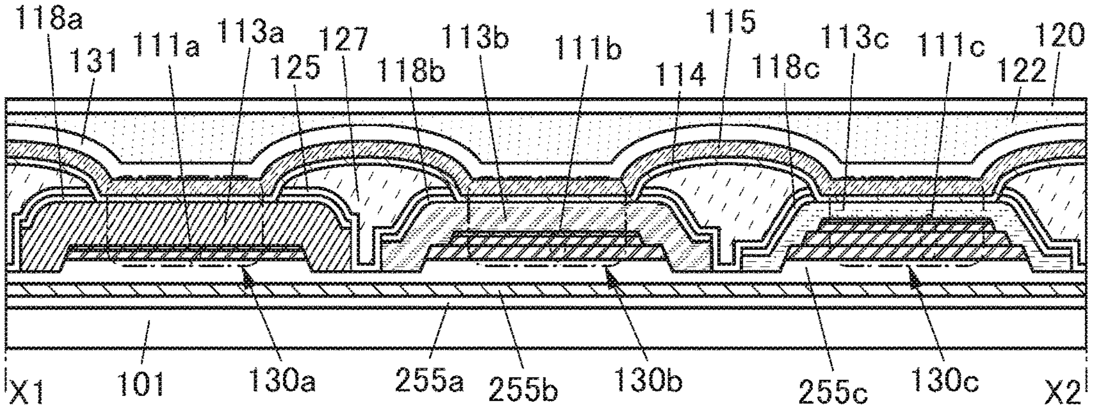
FIG. 12A is a cross-sectional view illustrating an example of a display apparatus.
Figure 12B:
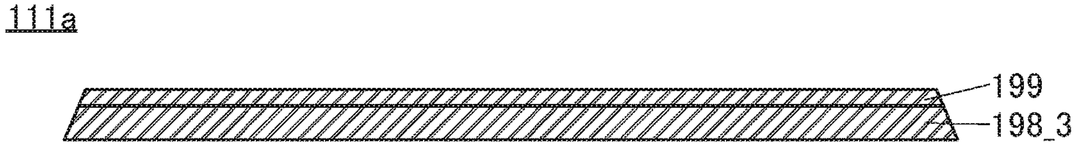
FIG. 12B to FIG. 12D are cross-sectional views illustrating examples of electrodes.
Figure 12C:
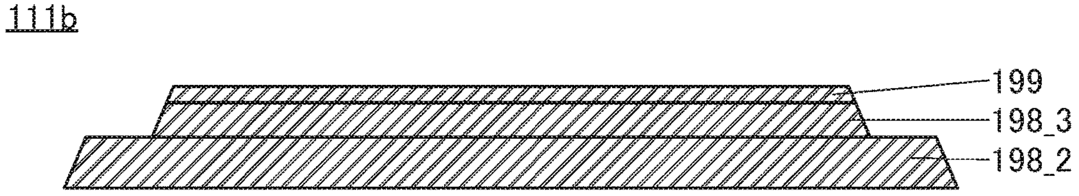
Figure 12D:
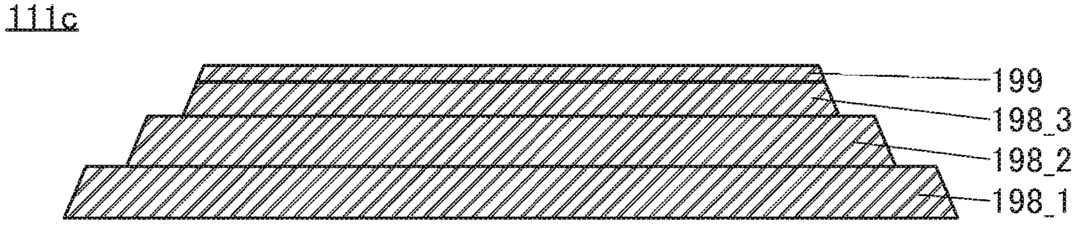

Next, the common layer 114, the common electrode 115, and the protective layer 131 are formed in this order so as to cover the insulating layer 125, the insulating layer 127, the mask layer 118, the layer 113_a_, the layer 113_b_, and the layer 113_c_ (FIG. 10B).

The cross-sectional view taken along Y1-Y2 illustrated in FIG. 10B shows the example in which the common layer 114 is provided in the connection portion 140. With this structure, the connection portion 140 having a structure in which the conductive layer 123 is electrically connected to the common electrode 115 through the common layer 114 can be formed.

In the case where the common layer 114 has low conductivity, a structure in which the common layer 114 is not provided in the connection portion 140 may be employed, for example. In that case, for example, a mask for specifying a deposition area (also referred to as an area mask, a rough metal mask, or the like) is preferably used in the deposition of the common layer 114.

Materials that can be used for the common layer 114 are as described above. The common layer 114 can be formed by an evaporation method (including a vacuum evaporation method), a transfer method, a printing method, an inkjet method, a coating method, or the like. The common layer 114 may be formed using a premix material.

The common layer 114 is provided to cover the top surfaces of the layer 113*a*, the layer 113*b*, and the layer 113*c* and the top and side surfaces of the insulating layer 127. Here, in the case where the common layer 114 has high conductivity and the insulating layer 125 and the insulating layer 127 are not provided, a short circuit in the light-emitting device might be caused when the common layer 114 is in contact with any of the side surfaces of the pixel electrodes 111*a*, 111*b*, and 111*c*, the layer 113*a*, the layer 113*b*, and the layer 113*c*. In the display apparatus of one embodiment of the present invention, however, the insulating layers 125 and 127 cover the side surfaces of the layer 113*a*, the layer 113*b*, and the layer 113*c*, and the layer 113*a*, the layer 113*b*, and the layer 113*c* cover the side surfaces of the corresponding pixel electrodes 111*a*, 111*b*, and 111*c*. This inhibits the common layer 114 having high conductivity from being in contact with the side surfaces of these layers, whereby a short circuit in the light-emitting device can be inhibited. Thus, the reliability of the light-emitting device can be increased.

Since the space between the layer 113*a* and the layer 113*b* and the space between the layer 113*b* and the layer 113*c* are filled with the insulating layers 125 and 127, the formation surface of the common layer 114 has a smaller step and higher planarity than the formation surface of the case where the insulating layers 125 and 127 are not provided. This can improve the coverage with the common layer 114.

A mask for specifying a deposition area (also referred to as an area mask, a rough metal mask, or the like) may be used in the deposition of the common electrode 115. Alternatively, a film to be the common electrode 115 may be deposited without the use of the mask and may be processed with the use of a resist mask or the like after the film to be the common electrode 115 is deposited.

Materials that can be used for the common electrode 115 are as described above. The common electrode 115 can be formed by a sputtering method or a vacuum evaporation method, for example. Alternatively, the common electrode 115 may be a stack of a film formed by an evaporation method and a film formed by a sputtering method.

Materials and deposition methods that can be used for the protective layer 131 are as described above. Examples of methods for depositing the protective layer 131 include a vacuum evaporation method, a sputtering method, a CVD method, and an ALD method. The protective layer 131 may have a single-layer structure or a stacked-layer structure.

Then, the substrate 120 is bonded to the protective layer 131 with the resin layer 122, whereby the display apparatus 100 illustrated in FIG. 1B can be fabricated.

Through the above steps, the above-described display apparatus 100 can be fabricated.

This embodiment can be combined with the other embodiments as appropriate.

Embodiment 2

In this embodiment, the display apparatus of one embodiment of the present invention is described with reference to FIG. 13 to FIG. 16.

[Pixel Layout]

In this embodiment, pixel layouts different from that in FIG. 1A are mainly described. There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and pentile arrangement.

Examples of a top surface shape of the subpixel include polygons such as a triangle, a tetragon (including a rectangle and a square), and a pentagon; polygons with rounded corners; an ellipse; and a circle. Here, a top surface shape of the subpixel corresponds to a top surface shape of a light-emitting region of the light-emitting device.

Figure 13A:
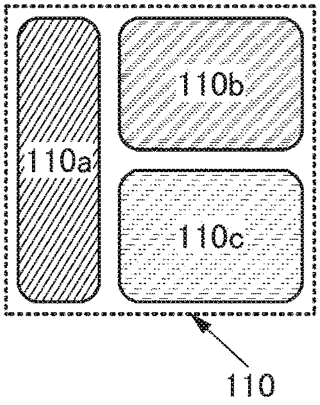
FIG. 13A to FIG. 13F are top views illustrating examples of a pixel.
Figure 15A:
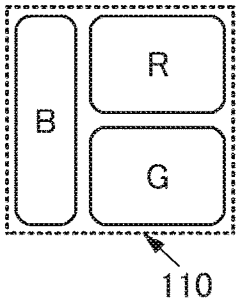
FIG. 15A to FIG. 15J are top views illustrating examples of a pixel.

The pixel 110 illustrated in FIG. 13A employs S-stripe arrangement. The pixel 110 illustrated in FIG. 13A is composed of three subpixels 110*a*, 110*b*, and 110*c*. For example, as illustrated in FIG. 15A, the subpixel 110*a* may be a blue subpixel B, the subpixel 110*b* may be a red subpixel R, and the subpixel 110*c* may be a green subpixel G.

Figure 13B:
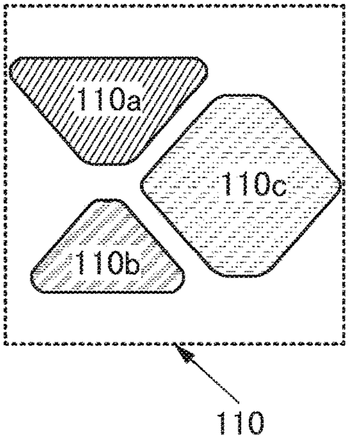
Figure 15B:
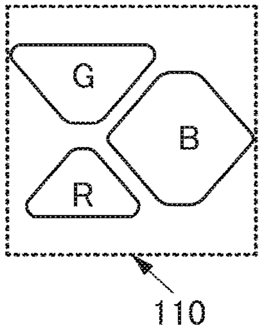

The pixel 110 illustrated in FIG. 13B includes the subpixel 110*a* whose top surface has a rough trapezoidal shape with rounded corners, the subpixel 110*b* whose top surface has a rough triangle shape with rounded corners, and the subpixel 110*c* whose top surface has a rough tetragonal or rough hexagonal shape with rounded corners. The subpixel 110*a* has a larger light-emitting area than the subpixel 110*b*. In this manner, the shapes and sizes of the subpixels can be determined independently. For example, the size of a subpixel including a light-emitting device with higher reliability can be smaller. For example, as illustrated in FIG. 15B, the subpixel 110*a* may be the green subpixel G, the subpixel 110*b* may be the red subpixel R, and the subpixel 110*c* may be the blue subpixel B.

Figure 13C:
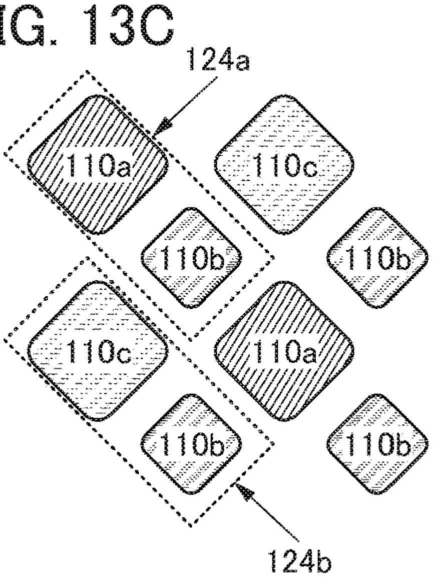
Figure 15C:
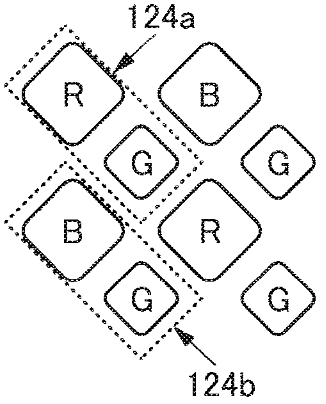

Pixels 124*a* and 124*b* illustrated in FIG. 13C employ pentile arrangement. FIG. 13C illustrates an example where the pixels 124*a* including the subpixel 110*a* and the subpixel 110*b* and the pixels 124*b* including the subpixel 110*b* and the subpixel 110*c* are alternately arranged. For example, as illustrated in FIG. 15C, the subpixel 110*a* may be the red subpixel R, the subpixel 110*b* may be the green subpixel G, and the subpixel 110*c* may be the blue subpixel B.

Figure 13D:
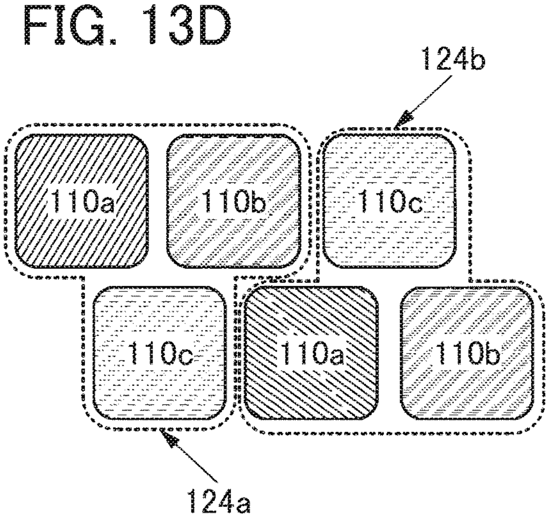
Figure 13E:
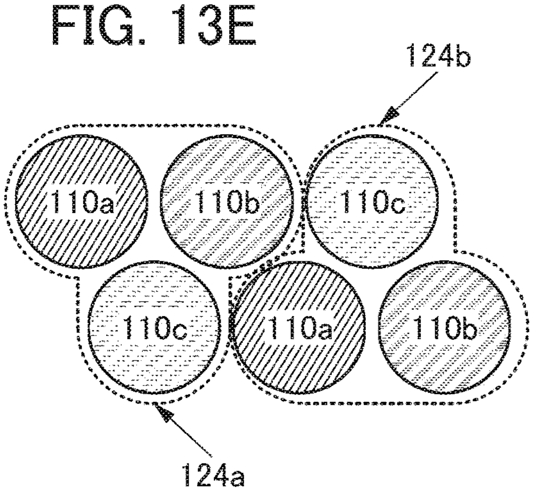
Figure 15D:
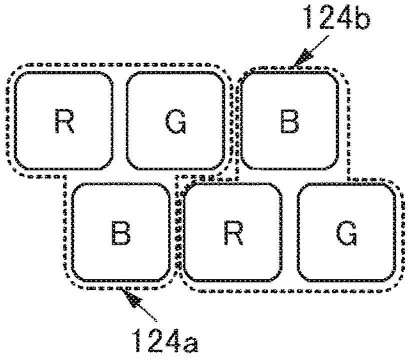

The pixels 124*a* and 124*b* illustrated in FIG. 13D and FIG. 13E employ delta arrangement. The pixel 124*a* includes two subpixels (the subpixels 110*a* and 110*b*) in the upper row (first row) and one subpixel (the subpixel 110*c*) in the lower row (second row). The pixel 124*b* includes one subpixel (the subpixel 110*c*) in the upper row (first row) and two subpixels (the subpixels 110*a* and 110*b*) in the lower row (second row). For example, as illustrated in FIG. 15D, the subpixel 110*a* may be the red subpixel R, the subpixel 110*b* may be the green subpixel G, and the subpixel 110*c* may be the blue subpixel B.

FIG. 13D is an example where each subpixel has a rough quadrangular top surface shape with rounded corners, and FIG. 13E is an example where each subpixel has a circular top surface shape.

Figure 13F:
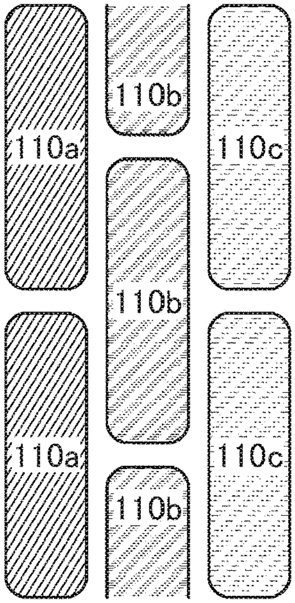
Figure 15E:
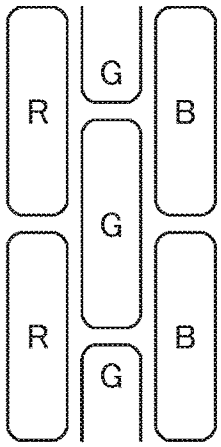

FIG. 13F illustrates an example where subpixels of different colors are arranged in a zigzag manner. Specifically, the positions of the top sides of two subpixels arranged in the column direction (e.g., the subpixel 110*a* and the subpixel 110*b* or the subpixel 110*b* and the subpixel 110*c*) are not aligned in the top view. For example, as illustrated in FIG. 15E, the subpixel 110*a* may be the red subpixel R, the subpixel 110*b* may be the green subpixel G, and the subpixel 110*c* may be the blue subpixel B.

In a photolithography method, as a pattern to be formed by processing becomes finer, the influence of light diffraction becomes more difficult to ignore; accordingly, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel sometimes has a polygonal shape with rounded corners, an elliptical shape, a circular shape, or the like.

Furthermore, in the method for fabricating the display apparatus of one embodiment of the present invention, an island-shaped EL layer or an island-shaped layer including part of an EL layer with the use of a resist mask. A resist film formed over the island-shaped EL layer or the island-shaped layer including part of an EL layer needs to be cured at a temperature lower than the upper temperature limit of the island-shaped EL layer or the island-shaped layer including part of an EL layer. Thus, the resist film is insufficiently cured in some cases depending on the upper temperature limit of the material of the island-shaped EL layer or the island-shaped layer including part of an EL layer and the curing temperature of the resist material. An insufficiently cured resist film may have a shape different from a desired shape when processed. As a result, the top surface of the island-shaped EL layer or the island-shaped layer including part of an EL layer sometimes has a polygonal shape with rounded corners, an elliptical shape, a circular shape, or the like. For example, when a resist mask with a square top surface shape is intended to be formed, a resist mask with a circular top surface shape might be formed and the top surface shape of the EL layer might be circular.

To obtain a desired top surface shape of the island-shaped EL layer or the island-shaped layer including part of an EL layer, a technique of correcting a mask pattern in advance so that a transferred pattern agrees with a design pattern (an OPC (Optical Proximity Correction) technique) may be used. Specifically, with the OPC technique, a pattern for correction is added to a corner portion or the like of a figure on a mask pattern.

Figure 15F:
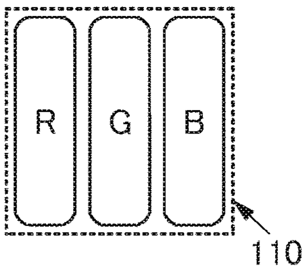
Figure 15G:
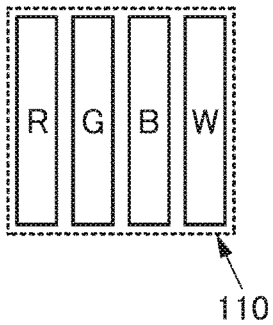
Figure 15H:
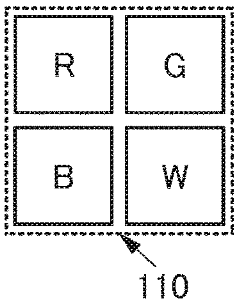
Figure 15I:
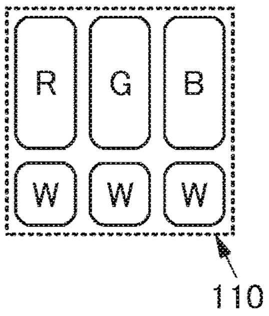
Figure 15J:
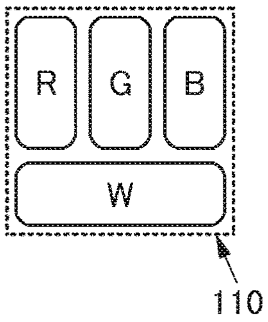

Also in the pixel 110 illustrated in FIG. 1A, which employs stripe arrangement, for example, the subpixel 110*a* can be the red subpixel R, the subpixel 110*b* can be the green subpixel G, and the subpixel 110*c* can be the blue subpixel B as illustrated in FIG. 15F.

As illustrated in FIG. 14A to FIG. 14H, the pixel can include four types of subpixels.

Figure 14A:
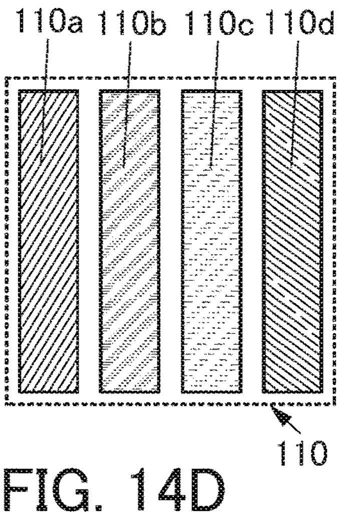
FIG. 14A to FIG. 14H are top views illustrating examples of a pixel.
Figure 14B:
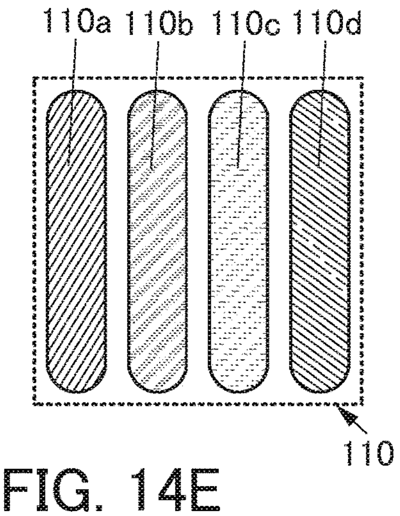
Figure 14C:
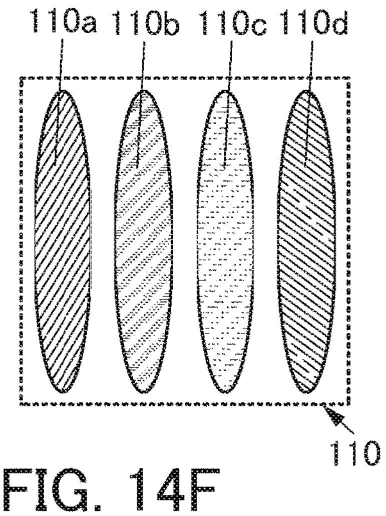

The pixels 110 illustrated in FIG. 14A to FIG. 14C employ stripe arrangement.

FIG. 14A illustrates an example where each subpixel has a rectangular top surface shape, FIG. 14B illustrates an example where each subpixel has a top surface shape formed by combining two half circles and a rectangle, and FIG. 14C illustrates an example where each subpixel has an elliptical top surface shape.

Figure 14D:
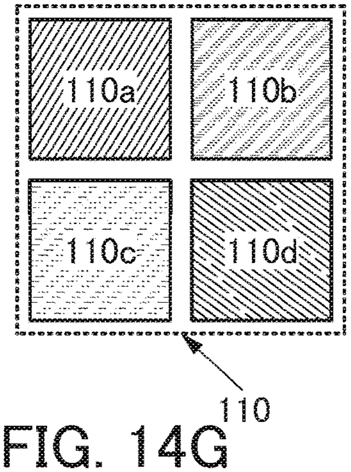
Figure 14E:
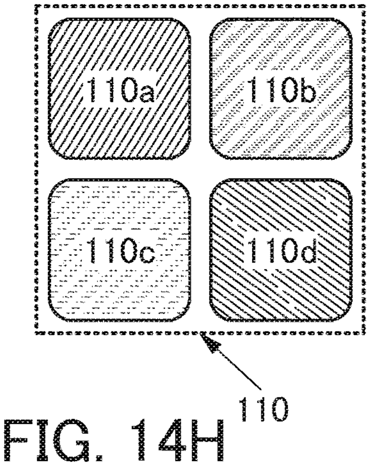
Figure 14F:
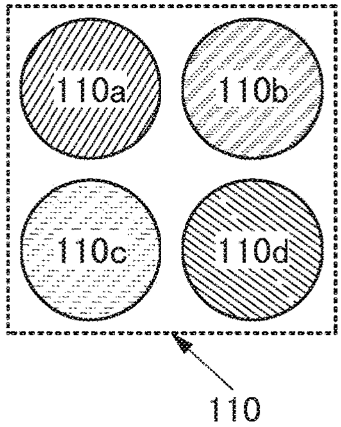

The pixels 110 illustrated in FIG. 14D to FIG. 14F employ matrix arrangement.

FIG. 14D illustrates an example where each subpixel has a square top surface shape, FIG. 14E illustrates an example where each subpixel has a substantially square top surface shape with rounded corners, and FIG. 14F illustrates an example where each subpixel has a circular top surface shape.

Figure 14G:
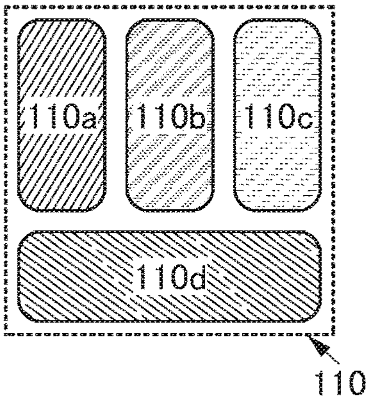
Figure 14H:
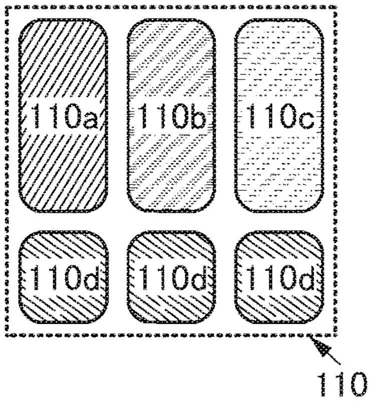

FIG. 14G and FIG. 14H each illustrate an example where one pixel 110 is composed of two rows and three columns.

The pixel 110 illustrated in FIG. 14G includes three subpixels (the subpixels 110*a*, 110*b*, and 110*c*) in the upper row (first row) and one subpixel (a subpixel 110*d*) in the lower row (second row). In other words, the pixel 110 includes the subpixel 110*a* in the left column (first column), the subpixel 110*b* in the center column (second column), the subpixel 110*c* in the right column (third column), and the subpixel 110*d* across these three columns.

The pixel 110 illustrated in FIG. 14H includes three subpixels (the subpixels 110*a*, 110*b*, and 110*c*) in the upper row (first row) and three subpixels 110*d* in the lower row (second row). In other words, the pixel 110 includes the subpixel 110*a* and the subpixel 110*d* in the left column (first column), the subpixel 110*b* and another the subpixel 110*d* in the center column (second column), and the subpixel 110*c* and another subpixel 110*d* in the right column (third column). Matching the positions of the subpixels in the upper row and the lower row as illustrated in FIG. 14H enables dust and the like that would be produced in the manufacturing process to be removed efficiently. Thus, a display apparatus with high display quality can be provided.

The pixels 110 illustrated in FIG. 14A to FIG. 14H are each composed of the four subpixels 110*a*, 110*b*, 110*c*, and 110*d*. The subpixels 110*a*, 110*b*, 110*c*, and 110*d* include light-emitting devices that emit light of different colors. The subpixels 110*a*, 110*b*, 110*c*, and 110*d* can be of four colors of R, G, B, and white (W), of four colors of R, G, B, and Y, of four colors of R, G, B, and infrared light (IR), or the like. For example, the subpixels 110*a*, 110*b*, 110*c*, and 110*d* can be red, green, blue, and white subpixels, respectively, as illustrated in FIG. 15G to FIG. 15J.

The display apparatus of one embodiment of the present invention may include a light-receiving device (also referred to as light-receiving element) in the pixel.

Three of the four subpixels included in the pixel 110 illustrated in FIG. 15G to FIG. 15J may include a light-emitting device and the other one may include a light-receiving device.

For example, the subpixels 110*a*, 110*b*, and 110*c* may be subpixels of three colors of R, G, and B, and the subpixel 110*d* may be a subpixel including the light-receiving device.

Figure 16A:
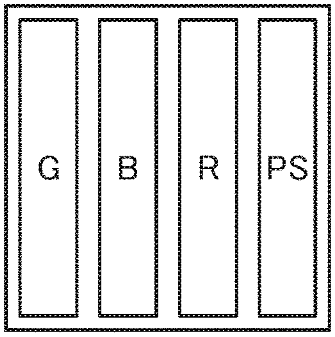
FIG. 16A to FIG. 16D are top views illustrating examples of a pixel.
Figure 16B:
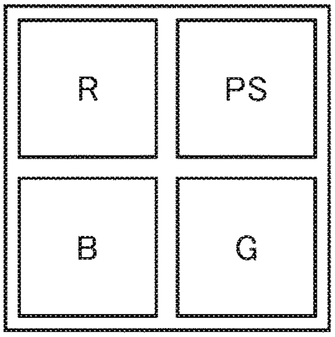

Pixels illustrated in FIG. 16A and FIG. 16B each include the subpixel G, the subpixel B, the subpixel R, and a subpixel PS. Note that the arrangement order of the subpixels is not limited to the structures illustrated in the drawings and can be determined as appropriate. For example, the positions of the subpixel G and the subpixel R may be interchanged with each other.

The pixel illustrated in FIG. 16A employs stripe arrangement. The pixel illustrated in FIG. 16B employs matrix arrangement.

The subpixel R includes a light-emitting device that emits red light. The subpixel G includes a light-emitting device that emits green light. The subpixel B includes a light-emitting device that emits blue light.

The subpixel PS includes a light-receiving device. The wavelength of light detected by the subpixel PS and is not particularly limited. The subpixel PS can have a structure in which one or both of infrared light and visible light can be detected.

Figure 16C:
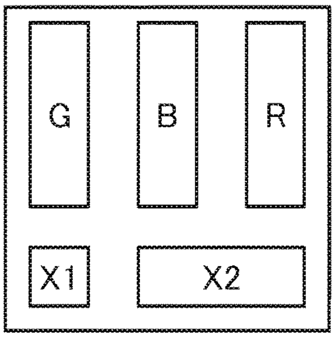
Figure 16D:
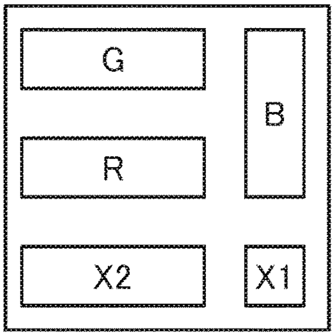

Pixels illustrated in FIG. 16C and FIG. 16D each include the subpixel G, the subpixel B, the subpixel R, the subpixel X1, and a subpixel X2. Note that the arrangement order of the subpixels is not limited to the structures illustrated in the drawings and can be determined as appropriate. For example, the positions of the subpixel G and the subpixel R may be interchanged with each other.

FIG. 16C illustrates an example where one pixel is provided in two rows and three columns. Three subpixels (the subpixel G, the subpixel B, and the subpixel R) are provided in the upper row (first row). In FIG. 16C, two subpixels (the subpixel X1 and the subpixel X2) are provided in the lower row (second row).

FIG. 16D illustrates an example where one pixel is composed of three rows and two columns. In FIG. 16D, the pixel includes the subpixel G in the first row, the subpixel R in the second row, and the subpixel B across these two rows. In addition, two subpixels (the subpixel X1 and the subpixel X2) are provided in the third row. In other words, the pixel illustrated in FIG. 16D includes three subpixels (the subpixel G, the subpixel R, and the subpixel X2) in the left column (first column) and two subpixels (the subpixel B and the subpixel X1) in the right column (second column).

The layout of the subpixels R, G, and B illustrated in FIG. 16C is stripe arrangement. The layout of the subpixels R, G, and B illustrated in FIG. 16D is what is called S stripe arrangement. Thus, high display quality can be achieved.

At least one of the subpixel X1 and the subpixel X2 preferably includes the light-receiving device (also referred to as subpixel PS).

Note that the layout of the pixels including the subpixel PS is not limited to the structures illustrated in FIG. 16A to FIG. 16D.

The subpixel X1 or the subpixel X2 can have a structure including a light-emitting device that emits infrared light (IR), for example. In this case, the subpixel PS preferably detects infrared light. For example, while an image is displayed using the subpixels R, G, and B, one of the subpixel X1 and the subpixel X2 can detect reflected light of the light emitted from the other of the subpixel X1 and the subpixel X2 that is used as a light source.

Both of the subpixel X1 and the subpixel X2 can have a structure including a light-receiving device, for example. In this case, the wavelength ranges of the light detected by the subpixel X1 and the subpixel X2 may be the same, different, or partially the same. For example, one of the subpixel X1 and the subpixel X2 may mainly detect visible light while the other mainly detects infrared light.

The light-receiving area of the subpixel X1 is smaller than the light-receiving area of the subpixel X2. A smaller light-receiving area leads to a narrower image-capturing range, prevents a blur in a captured image, and improves the definition. Thus, the use of the subpixel X1 enables higher-resolution or higher-definition image capturing than the use of the light-receiving device included in the subpixel X2. For example, image capturing for personal authentication with the use of a fingerprint, a palm print, the iris, the shape of a blood vessel (including the shape of a vein and the shape of an artery), a face, or the like is possible by using the subpixel X1.

The light-receiving device included in the subpixel PS preferably detects visible light, and preferably detects one or more of blue light, violet light, bluish violet light, green light, greenish yellow light, yellow light, orange light, red light, and the like. The light-receiving device included in the subpixel PS may detect infrared light.

In the case where the subpixel X2 has a structure including the light-receiving device, the subpixel X2 can be used in a touch sensor (also referred to as a direct touch sensor), a near touch sensor (also referred to as a hover sensor, a hover touch sensor, a contactless sensor, or a touchless sensor), or the like. The wavelength of light detected by the subpixel X2 can be determined as appropriate depending on the application purpose. For example, the subpixel X2 preferably detects infrared light. Thus, touch detection is possible even in a dark place.

Here, the touch sensor or the near touch sensor can detect an approach or contact of an object (e.g., a finger, a hand, or a pen).

The touch sensor can detect an object when the display apparatus and the object come in direct contact with each other. The near touch sensor can detect an object even when the object is not in contact with the display apparatus. For example, the display apparatus can preferably detect an object when the distance between the display apparatus and the object is greater than or equal to 0.1 mm and less than or equal to 300 mm, preferably greater than or equal to 3 mm and less than or equal to 50 mm. This structure enables the display apparatus to be operated without direct contact of an object; in other words, the display apparatus can be operated in a contactless (touchless) manner. With the above structure, the display apparatus can be controlled with a reduced risk of making the display apparatus dirty or damaging the display apparatus or without the object directly touching a dirt (e.g., dust, bacteria, or a virus) attached to the display apparatus.

The refresh rate of the display apparatus of one embodiment of the present invention can be variable. For example, the refresh rate is adjusted (adjusted in the range from 1 Hz to 240 Hz, for example) in accordance with contents displayed on the display apparatus, whereby power consumption can be reduced. The driving frequency of the touch sensor or the near touch sensor may be changed in accordance with the refresh rate. In the case where the refresh rate of the display apparatus is 120 Hz, for example, the driving frequency of the touch sensor or the near touch sensor can be higher than 120 Hz (typically 240 Hz). With this structure, low power consumption can be achieved, and the response speed of the touch sensor or the near-touch sensor can be increased.

Figure 16E:
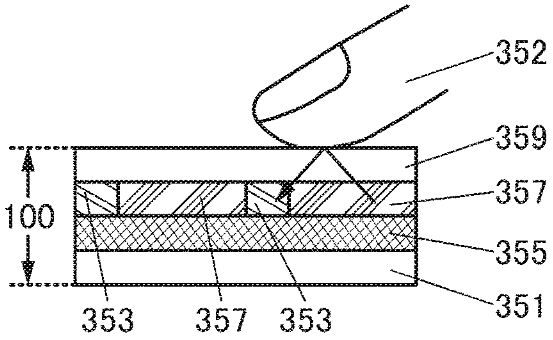
FIG. 16E to FIG. 16G are cross-sectional views illustrating examples of a display apparatus.
Figure 16F:
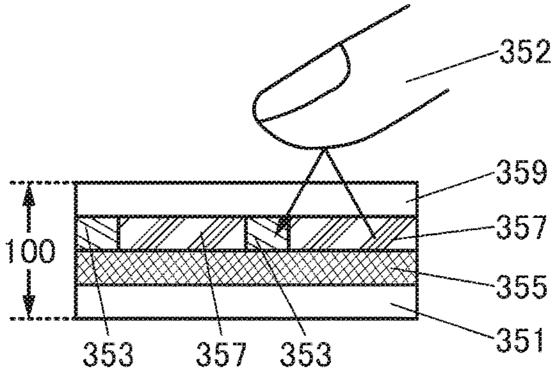
Figure 16G:
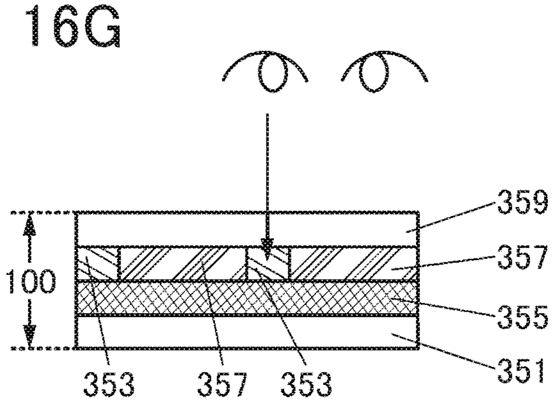

The display apparatus 100 illustrated in FIG. 16E to FIG. 16G includes a layer 353 including alight-receiving device, a functional layer 355, and a layer 357 including a light-emitting device, between a substrate 351 and a substrate 359.

The functional layer 355 includes a circuit for driving a light-receiving device and a circuit for driving a light-emitting device. A switch, a transistor, a capacitor, a resistor, a wiring, a terminal, and the like can be provided in the functional layer 355. Note that in the case where the light-emitting device and the light-receiving device are driven by a passive-matrix method, a structure not provided with a switch or a transistor may be employed.

For example, after light emitted from the light-emitting device in the layer 357 including the light-emitting device is reflected by a finger 352 touching the display apparatus 100 as illustrated in FIG. 16E, the light-receiving device in the layer 353 including the light-receiving device detects the reflected light. Thus, the touch of the finger 352 on the display apparatus 100 can be detected.

Alternatively, the display apparatus may have a function of detecting an object that is close to (not touching) the display apparatus as illustrated in FIG. 16F and FIG. 16G or capturing an image of such an object. FIG. 16F illustrates an example where a human finger is detected, and FIG. 16G illustrates an example where information on the periphery, surface, or inside of the human eye (e.g., the number of blinks, movement of an eyeball, and movement of an eyelid) is detected.

In the display apparatus of this embodiment, an image of the periphery of an eye, the surface of the eye, or the inside (fundus or the like) of the eye of a user of a wearable device can be captured with the use of the light-receiving device. Therefore, the wearable device can have a function of detecting one or more selected from a blink, movement of an iris, and movement of an eyelid of the user.

As described above, the pixel composed of the subpixels each including the light-emitting device can employ any of a variety of layouts in the display apparatus of one embodiment of the present invention. The display apparatus of one embodiment of the present invention can have a structure in which the pixel includes both a light-emitting device and a light-receiving device. Also in this case, any of a variety of layouts can be employed.

This embodiment can be combined with the other embodiments as appropriate.

Embodiment 3

In this embodiment, display apparatuses of embodiments of the present invention are described with reference to FIG. 17 to FIG. 27.

The display apparatus of this embodiment can be a high-resolution display apparatus. Accordingly, the display apparatus in this embodiment can be used for display portions of information terminals (wearable devices) such as watch-type and bracelet-type information terminals and display portions of wearable devices capable of being worn on a head, such as a VR device like a head-mounted display and a glasses-type AR device.

The display apparatus of this embodiment can be a high-definition display apparatus or a large-sized display apparatus. Accordingly, the display apparatus of this embodiment can be used for display portions of electronic devices such as a digital camera, a digital video camera, a digital photo frame, a mobile phone, a portable game console, a portable information terminal, and an audio reproducing device, in addition to display portions of electronic devices with a relatively large screen, such as a television device, a desktop or notebook personal computer, a monitor of a computer and the like, digital signage, and a large game machine such as a pachinko machine.

[Display Module]

Figure 17A:
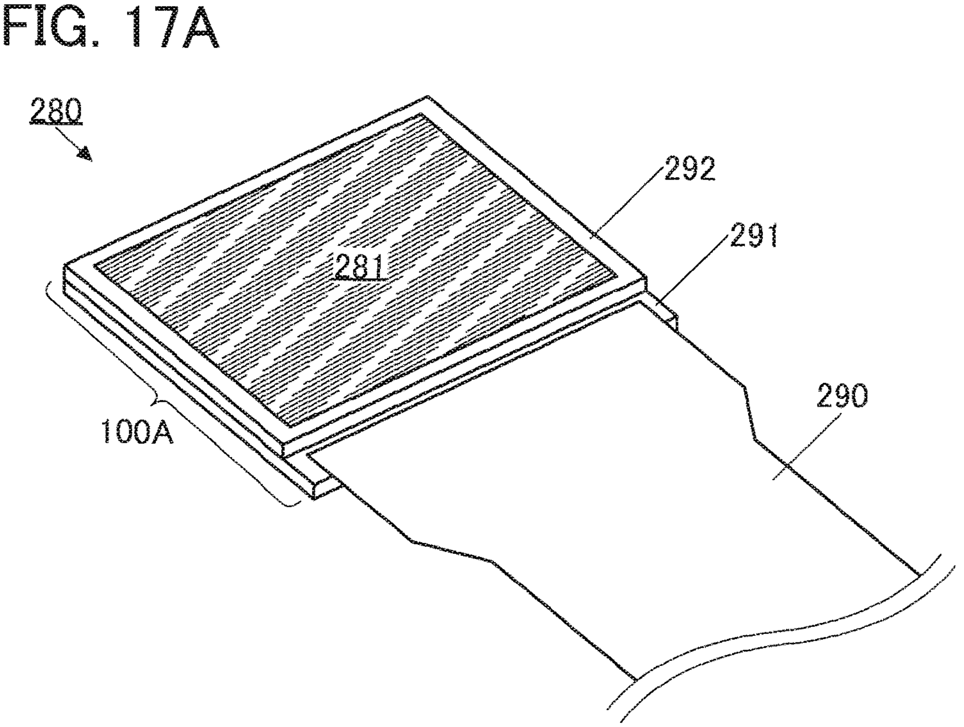
FIG. 17A and FIG. 17B are perspective views illustrating examples of a display apparatus.

FIG. 17A is a perspective view of a display module 280. The display module 280 includes a display apparatus 100A and an FPC 290. Note that the display apparatus included in the display module 280 is not limited to the display apparatus 100A and may be any of a display apparatus 100B to a display apparatus 100F described later.

The display module 280 includes a substrate 291 and a substrate 292. The display module 280 includes a display portion 281. The display portion 281 is a region of the display module 280 where an image is displayed, and is a region where light from pixels provided in a pixel portion 284 described later can be seen.

Figure 17B:
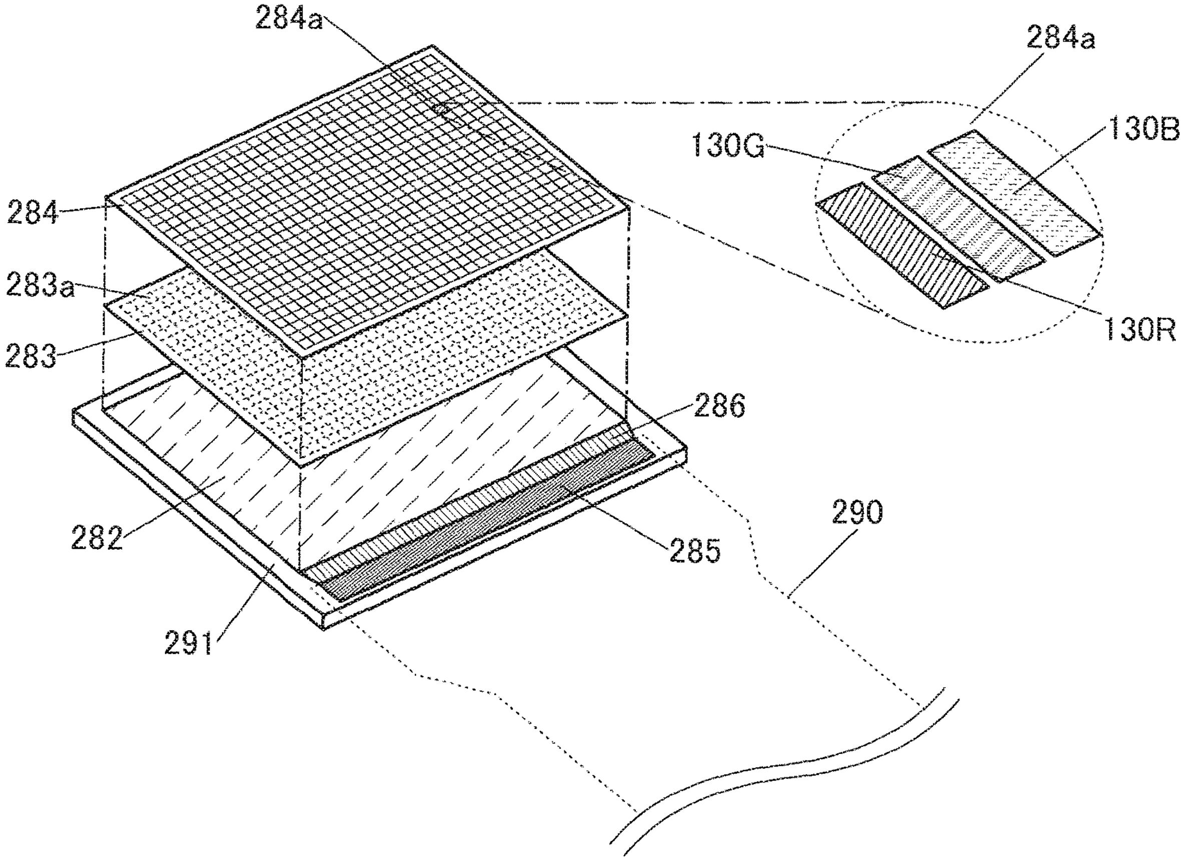

FIG. 17B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion over the substrate 291 which does not overlap with the pixel portion 284. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side of FIG. 17B. The pixel 284*a* includes the light-emitting device 130R that emits red light, the light-emitting device 130G that emits green light, and the light-emitting device 130B that emits blue light.

The pixel circuit portion 283 includes a plurality of pixel circuits 283*a* arranged periodically.

One pixel circuit 283*a* is a circuit that controls light emission of three light-emitting devices included in one pixel 284*a*. One pixel circuit 283*a* may be provided with three circuits each of which controls light emission of one light-emitting device. For example, the pixel circuit 283*a* can include at least one selection transistor, one current control transistor (driving transistor), and a capacitor for one light-emitting device. In this case, a gate signal is input to a gate of the selection transistor, and a source signal is input to a source of the selection transistor. With such a structure, an active-matrix display apparatus is achieved.

The circuit portion 282 includes a circuit for driving the pixel circuits 283*a* in the pixel circuit portion 283. For example, one or both of a gate line driver circuit and a source line driver circuit are preferably included. In addition, at least one of an arithmetic circuit, a memory circuit, a power supply circuit, and the like may be included.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; thus, the aperture ratio (the effective display area ratio) of the display portion 281 can be significantly high. For example, the aperture ratio of the display portion 281 can be higher than or equal to 40% and lower than 100%, preferably higher than or equal to 50% and lower than or equal to 95%, further preferably higher than or equal to 60% and lower than or equal to 95%. Furthermore, the pixels 284*a* can be arranged extremely densely and thus the display portion 281 can have an extremely high resolution. For example, the pixels 284*a* are preferably arranged in the display portion 281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 280 has an extremely high resolution, and thus can be suitably used for a VR device such as a head-mounted display or a glasses-type AR device. For example, even with a structure where the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be favorably used in a display portion of a wearable electronic device, such as a watch.

[Display Apparatus 100A]

Figure 18A:
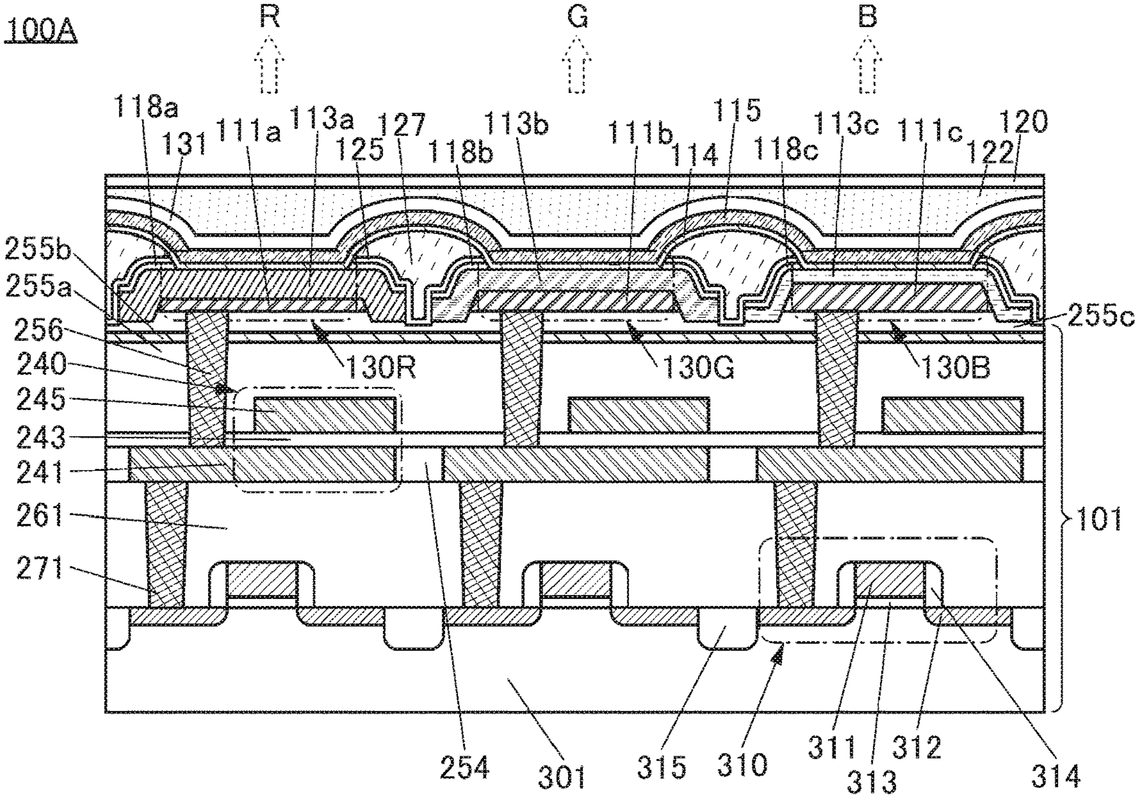
FIG. 18A and FIG. 18B are cross-sectional views illustrating examples of a display apparatus.

The display apparatus 100A illustrated in FIG. 18A includes a substrate 301, the light-emitting devices 130R, 130G and 130B, a capacitor 240, and a transistor 310. The light-emitting devices 130*a*, 130*b*, and 130*c* described in the above embodiment can be referred to for the light-emitting devices 130R, 130G, and 130B, respectively.

The substrate 301 corresponds to the substrate 291 in FIG. 17A and FIG. 17B. A stacked-layer structure including the substrate 301 and the components thereover up to an insulating layer 255*c* corresponds to the layer 101 including transistors in Embodiment 1. The transistor 310 is a transistor including a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover the side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255*a* is provided to cover the capacitor 240, the insulating layer 255*b* is provided over the insulating layer 255*a*, and the insulating layer 255*c* is provided over the insulating layer 255*b*.

As each of the insulating layer 255*a*, the insulating layer 255*b*, and the insulating layer 255*c*, a variety of inorganic insulating films such as an oxide insulating film, a nitride insulating film, an oxynitride insulating film, and a nitride oxide insulating film can be suitably used. As the insulating layer 255*a* and the insulating layer 255*c*, an oxide insulating film or an oxynitride insulating film, such as a silicon oxide film, a silicon oxynitride film, or an aluminum oxide film, is preferably used. As the insulating layer 255*b*, a nitride insulating film or a nitride oxide insulating film, such as a silicon nitride film or a silicon nitride oxide film, is preferably used. Specifically, it is preferable that a silicon oxide film be used as the insulating layer 255*a* and the insulating layer 255*c* and a silicon nitride film be used as the insulating layer 255*b*. The insulating layer 255*b* preferably has a function of an etching protective film. Although this embodiment shows an example where a depressed portion is provided in the insulating layer 255*c*, a depressed portion is not necessarily provided in the insulating layer 255*c*.

The light-emitting device 130R, the light-emitting device 130G, and the light-emitting device 130B are provided over the insulating layer 255*c*. FIG. 18A illustrates an example where the light-emitting device 130R, the light-emitting device 130G, and the light-emitting device 130B each have a structure similar to the stacked-layer structure illustrated in FIG. 1B.

Furthermore, since the layer 113*a*, the layer 113*b*, and the layer 113*c* are separated from each other in the display apparatus 100A, crosstalk generated between adjacent subpixels can be prevented while the display apparatus has high resolution. Accordingly, the display apparatus can have high resolution and high display quality.

An insulator is provided in a region between adjacent light-emitting devices. In FIG. 18A and the like, the insulating layer 125 and the insulating layer 127 over the insulating layer 125 are provided in the region.

A mask layer 118*a* is positioned over the layer 113*a* included in the light-emitting device 130R, a mask layer 118*b* is positioned over the layer 113*b* included in the light-emitting device 130G, and a mask layer 118*c* is positioned over the layer 113*c* included in the light-emitting device 130B.

The pixel electrode 111*a*, the pixel electrode 111*b*, and the pixel electrode 111*c* of the light-emitting device are each electrically connected to one of the source and the drain of the transistor 310 through a plug 256 embedded in the insulating layer 255*a*, the insulating layer 255*b*, and the insulating layer 255*c*, the conductive layer 241 embedded in the insulating layer 254, and the plug 271 embedded in the insulating layer 261. The level of the top surface of the insulating layer 255*c* is equal to or substantially equal to the level of the top surface of the plug 256. A variety of conductive materials can be used for the plugs.

Examples of a material that can be used for the plug 256 include metals such as aluminum, titanium, chromium, nickel, copper, yttrium, zirconium, molybdenum, gold, silver, platinum, magnesium, iron, cobalt, palladium, tantalum, or tungsten; an alloy containing any of these metal materials; and nitride of any of these metal materials. For the plug 256, a film containing any of these materials can be used in a single layer or as a stacked-layer structure. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, and a three-layer structure in which an aluminum film or a copper film is stacked over a molybdenum film or a molybdenum nitride film and a molybdenum film or a molybdenum nitride film is formed thereover can be given. Note that an oxide such as indium oxide, tin oxide, or zinc oxide may be used. Copper containing manganese is preferably used because it increases controllability of a shape by etching. For example, the pixel electrode may have a two-layer structure of a reflective electrode and a transparent electrode over the reflective electrode.

The protective layer 131 is provided over the light-emitting device 130R, the light-emitting device 130G, and the light-emitting device 130B. The substrate 120 is bonded to the protective layer 131 with the resin layer 122. Embodiment 1 can be referred to for details of the light-emitting devices and the components thereover up to the substrate 120. The substrate 120 corresponds to the substrate 292 in FIG. 17A.

An insulating layer covering a top end portion of the pixel electrode 111*a* is not provided between the pixel electrode 111*a* and the layer 113*a*. Furthermore, an insulating layer covering a top end portion of the pixel electrode 111*b* is not provided between the pixel electrode 111*b* and the layer 113*b*. This allows the interval between adjacent light-emitting devices to be extremely short. As a result, the display apparatus can have high resolution or high definition.

Although the display apparatus 100A includes the light-emitting devices 130R, 130G, and 130B in this example, the display apparatus of this embodiment may further include the light-receiving device.

Figure 18B:
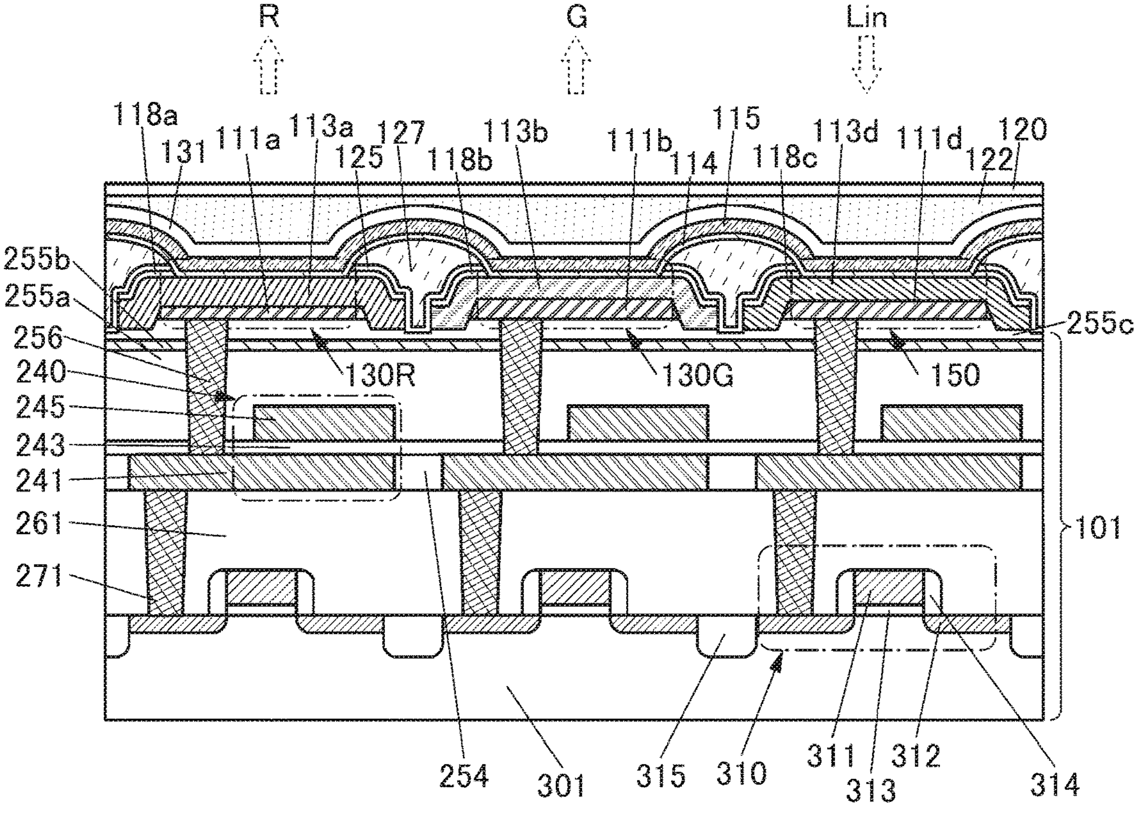

The display apparatus illustrated in FIG. 18B includes the light-emitting elements 130R and 130G and a light-receiving device 150. The light-receiving device 150 has a stack of a pixel electrode 111*d*, a fourth layer 113*d*, the common layer 114, and the common electrode 115. Embodiment 1 can be referred to for the details of components of the light-receiving device 150.

[Display Apparatus 100B]

Figure 19:
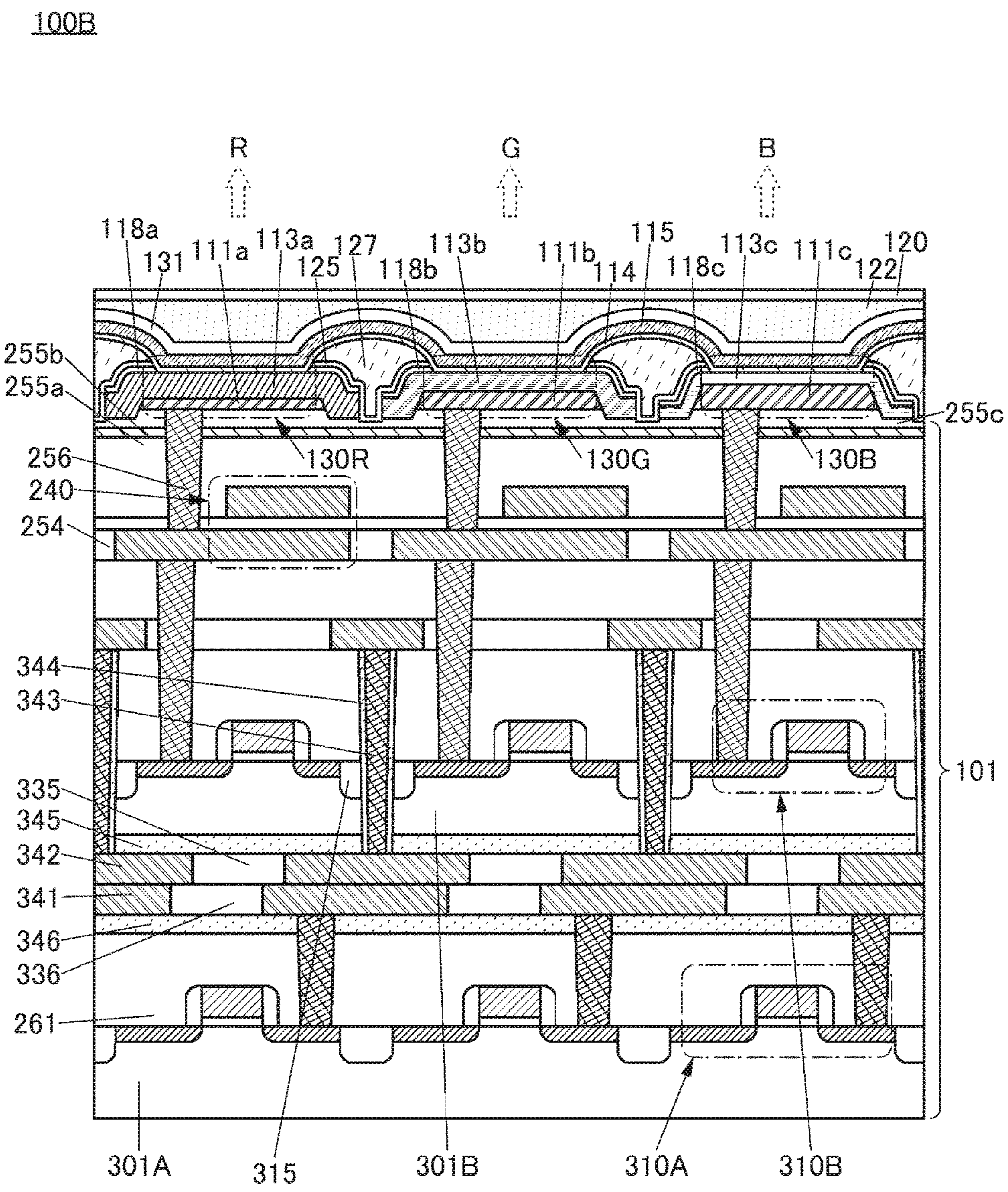
FIG. 19 is a cross-sectional view illustrating an example of a display apparatus.

The display apparatus 100B illustrated in FIG. 19 has a structure where a transistor 310A and a transistor 310B in each of which a channel is formed in a semiconductor substrate are stacked. Note that in the description of the display apparatus below, portions similar to those of the above-mentioned display apparatus are not described in some cases.

In the display apparatus 100B, a substrate 301B provided with the transistor 310B, the capacitor 240, and the light-emitting devices is bonded to a substrate 301A provided with the transistor 310A.

Here, an insulating layer 345 is preferably provided on the bottom surface of the substrate 301B. An insulating layer 346 is preferably provided over the insulating layer 261 provided over the substrate 301A. The insulating layers 345 and 346 are insulating layers functioning as protective layers and can inhibit diffusion of impurities into the substrate 301B and the substrate 301A. For the insulating layers 345 and 346, an inorganic insulating film that can be used for the protective layer 131 or an insulating layer 332 can be used.

The substrate 301B is provided with a plug 343 that penetrates the substrate 301B and the insulating layer 345. An insulating layer 344 is preferably provided to cover a side surface of the plug 343. The insulating layer 344 functions as a protective layer and can inhibit diffusion of impurities into the substrate 301B. For the insulating layer 344, an inorganic insulating film that can be used for the protective layer 131 can be used.

A conductive layer 342 is provided under the insulating layer 345 on the rear surface of the substrate 301B (the surface opposite to the substrate 120). The conductive layer 342 is preferably provided to be embedded in an insulating layer 335. The bottom surfaces of the conductive layer 342 and the insulating layer 335 are preferably planarized. Here, the conductive layer 342 is electrically connected to the plug 343.

Over the substrate 301A, a conductive layer 341 is provided over the insulating layer 346. The conductive layer 341 is preferably provided to be embedded in an insulating layer 336. The top surfaces of the conductive layer 341 and the insulating layer 336 are preferably planarized.

The conductive layer 341 and the conductive layer 342 are bonded to each other, whereby the substrate 301A and the substrate 301B are electrically connected to each other. Here, improving the flatness of a plane formed by the conductive layer 342 and the insulating layer 335 and a plane formed by the conductive layer 341 and the insulating layer 336 allows the conductive layer 341 and the conductive layer 342 to be bonded to each other favorably.

The conductive layer 341 and the conductive layer 342 are preferably formed using the same conductive material. For example, a metal film containing an element selected from Al, Cr, Cu, Ta, Ti, Mo, and W, a metal nitride film containing the above element as a component (a titanium nitride film, a molybdenum nitride film, or a tungsten nitride film), or the like can be used. Copper is particularly preferably used for the conductive layer 341 and the conductive layer 342. In that case, it is possible to employ Cu-to-Cu (copper-to-copper) direct bonding technique (a technique for achieving electrical continuity by connecting Cu (copper) pads.

[Display Apparatus 100C]

Figure 20:
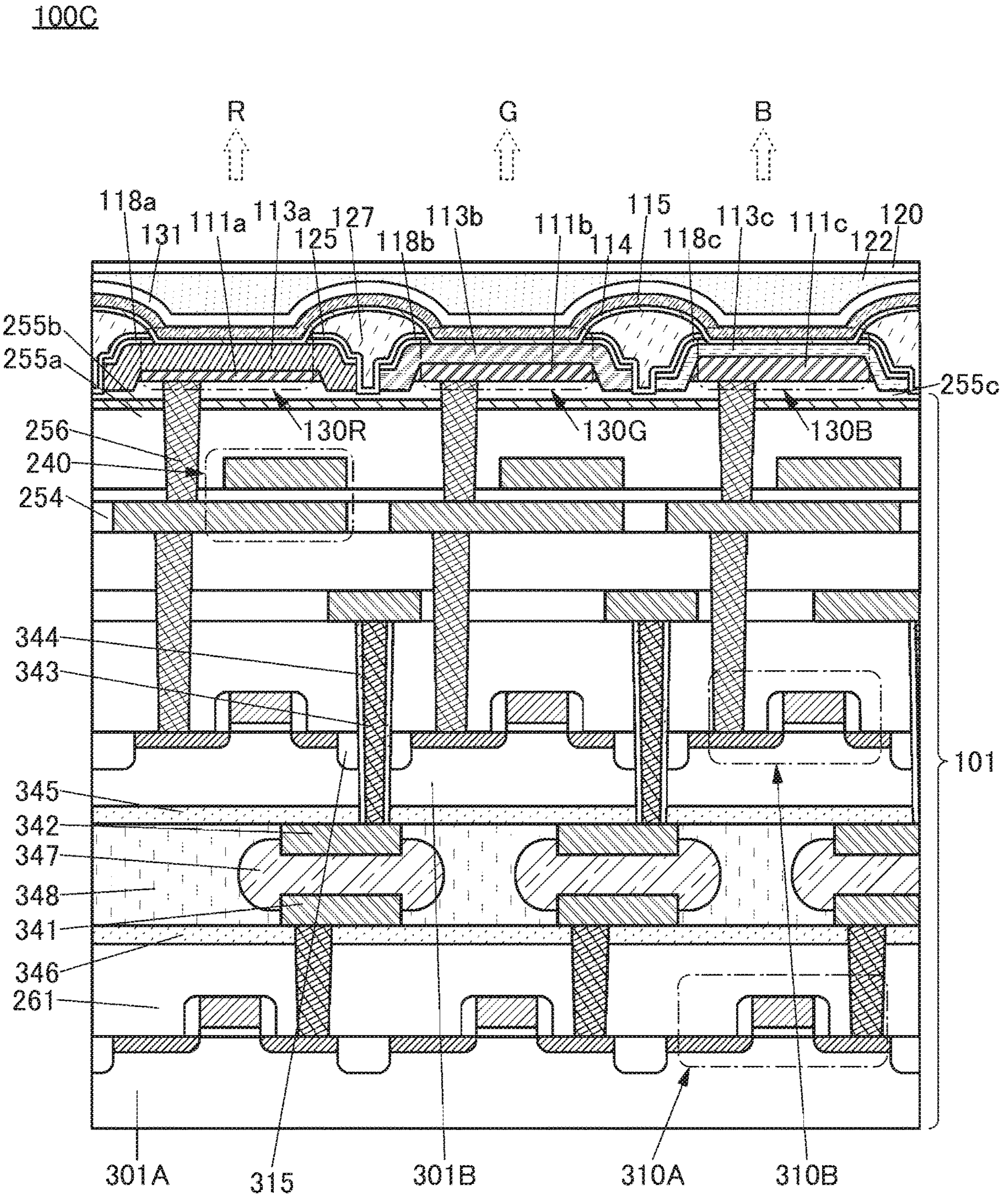
FIG. 20 is a cross-sectional view illustrating an example of a display apparatus.

The display apparatus 100C illustrated in FIG. 20 has a structure where the conductive layer 341 and the conductive layer 342 are bonded to each other through a bump 347.

As illustrated in FIG. 20, providing the bump 347 between the conductive layer 341 and the conductive layer 342 enables the conductive layer 341 and the conductive layer 342 to be electrically connected to each other. The bump 347 can be formed using a conductive material containing gold (Au), nickel (Ni), indium (In), tin (Sn), or the like, for example. As another example, solder may be used for the bump 347. An adhesive layer 348 may be provided between the insulating layer 345 and the insulating layer 346. In the case where the bump 347 is provided, the insulating layer 335 and the insulating layer 336 may be omitted.

[Display Apparatus 100D]

Figure 21:
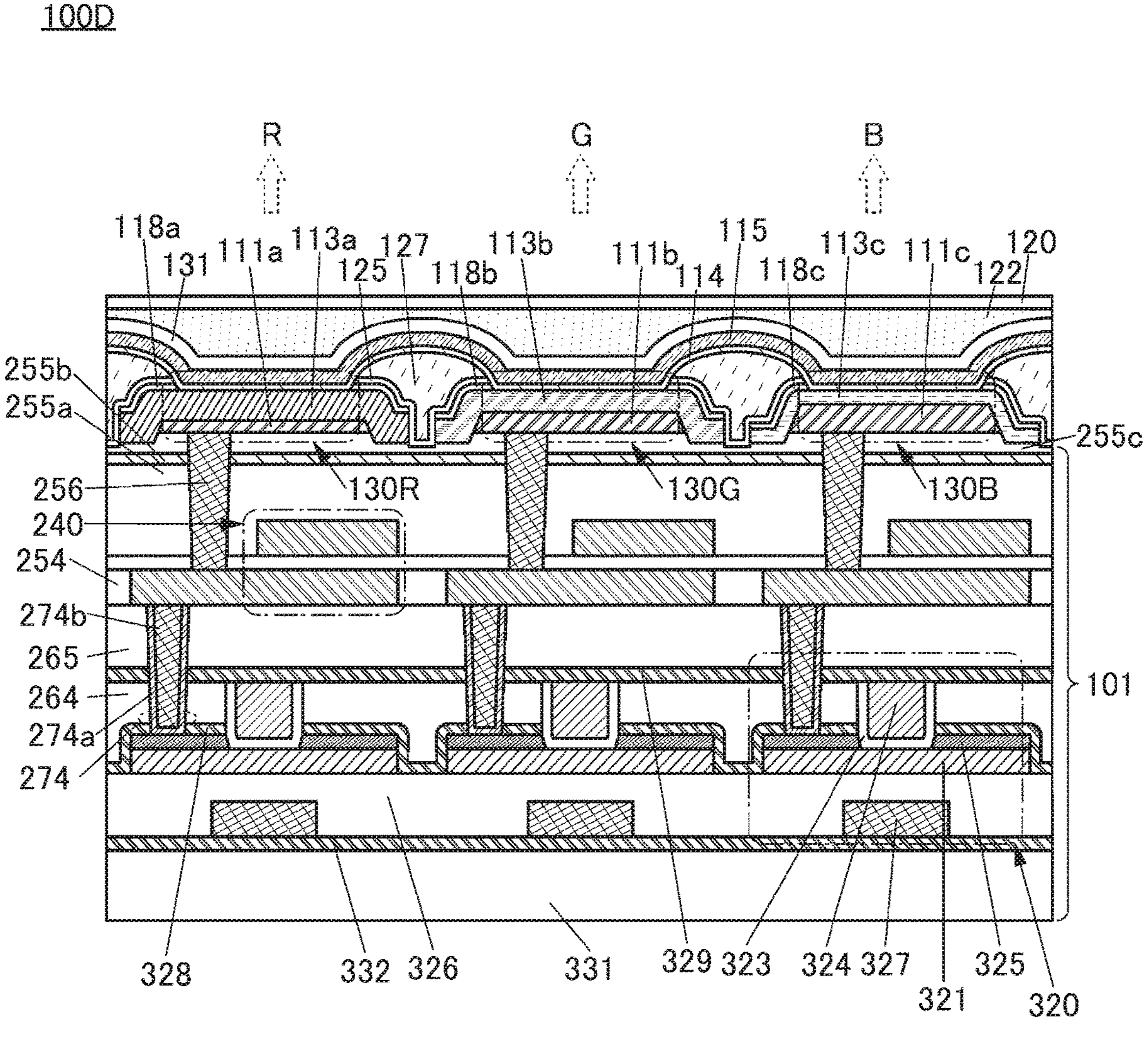
FIG. 21 is a cross-sectional view illustrating an example of a display apparatus.

The display apparatus 100D illustrated in FIG. 21 differs from the display apparatus 100A mainly in a structure of a transistor.

A transistor 320 is a transistor that contains a metal oxide (also referred to as an oxide semiconductor) in a semiconductor layer where a channel is formed (i.e., an OS transistor).

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 17A and FIG. 17B. A stacked-layer structure including the substrate 331 and components thereover up to the insulating layer 255*b* corresponds to the layer 101 including transistors in Embodiment 1. As the substrate 331, an insulating substrate or a semiconductor substrate can be used.

The insulating layer 332 is provided over the substrate 331. The insulating layer 332 functions as a barrier layer that prevents diffusion of impurities such as water and hydrogen from the substrate 331 into the transistor 320 and release of oxygen from the semiconductor layer 321 to the insulating layer 332 side. As the insulating layer 332, for example, a film through which hydrogen or oxygen is less likely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. The semiconductor layer 321 preferably includes a metal oxide (also referred to as an oxide semiconductor) film having semiconductor characteristics. The pair of conductive layers 325 are provided over and in contact with the semiconductor layer 321 and function as a source electrode and a drain electrode.

An insulating layer 328 is provided to cover the top and side surfaces of the pair of conductive layers 325, the side surface of the semiconductor layer 321, and the like, and an insulating layer 264 is provided over the insulating layer 328. The insulating layer 328 functions as a barrier layer that prevents diffusion of impurities such as water and hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with the side surfaces of the insulating layer 264, the insulating layer 328, and the conductive layer 325, and the top surface of the semiconductor layer 321, and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are subjected to planarization treatment so that their levels are equal to or substantially equal to each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water and hydrogen from the insulating layer 265 and the like into the transistor 320. As the insulating layer 329, an insulating film similar to the insulating layer 328 and the insulating layer 332 can be used.

A plug 274 electrically connected to one of the pair of conductive layers 325 is provided so as to be embedded in the insulating layer 265, the insulating layer 329, and the insulating layer 264. Here, the plug 274 preferably includes a conductive layer 274*a* that covers the side surface of an opening in the insulating layer 265, the insulating layer 329, the insulating layer 264, and the insulating layer 328 and part of the top surface of the conductive layer 325, and a conductive layer 274*b* in contact with the top surface of the conductive layer 274*a*. In this case, a conductive material through which hydrogen and oxygen are less likely to diffuse is preferably used for the conductive layer 274*a*.

[Display Apparatus 100E]

Figure 22:
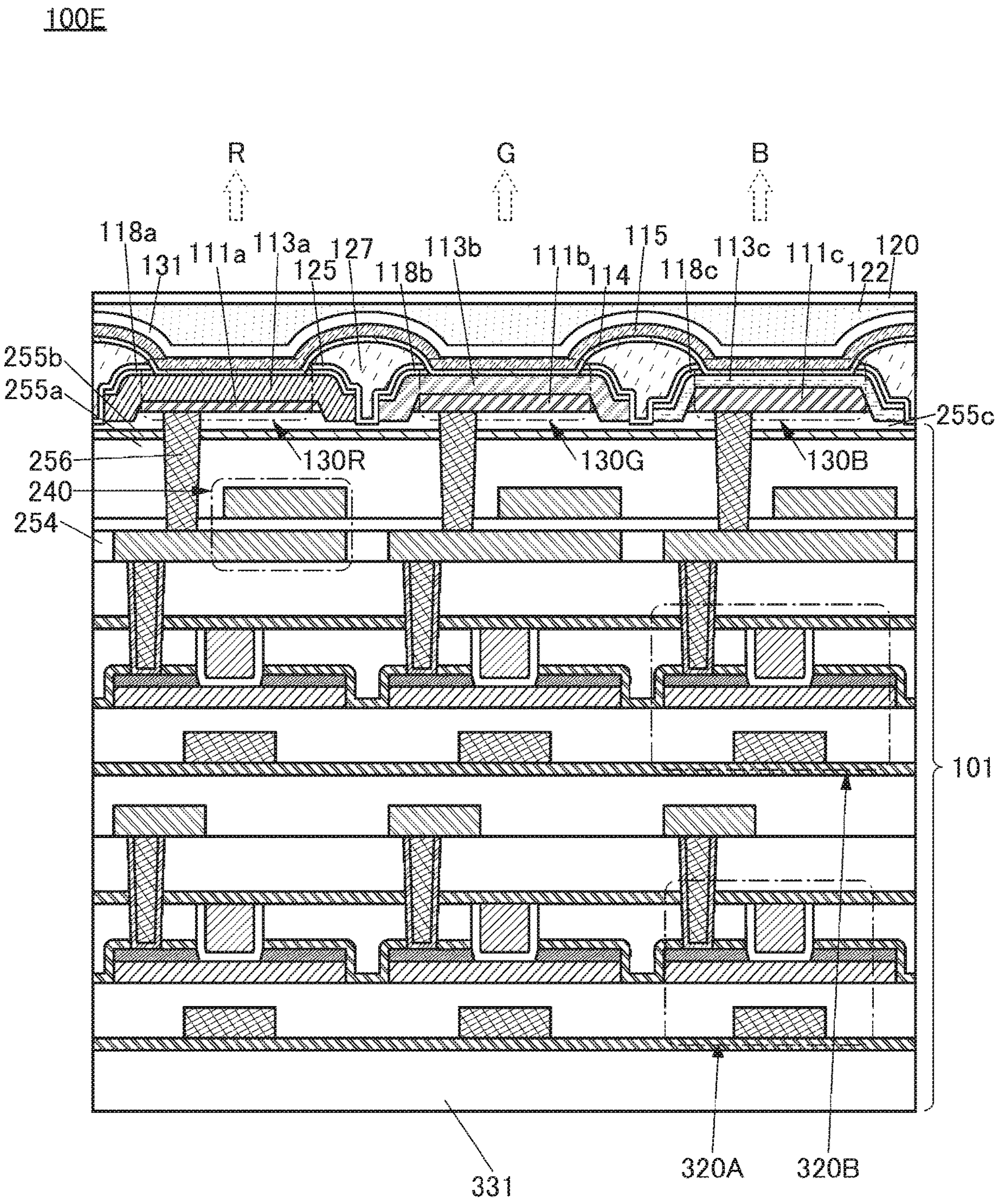
FIG. 22 is a cross-sectional view illustrating an example of a display apparatus.

The display apparatus 100E illustrated in FIG. 22 has a structure in which a transistor 320A and a transistor 320B each including an oxide semiconductor in a semiconductor where a channel is formed are stacked.

The description of the display apparatus 100D can be referred to for the transistor 320A, the transistor 320B, and the components around them.

Although the structure where two transistors including an oxide semiconductor are stacked is described, the present invention is not limited thereto. For example, three or more transistors may be stacked.

[Display Apparatus 100F]

Figure 23:
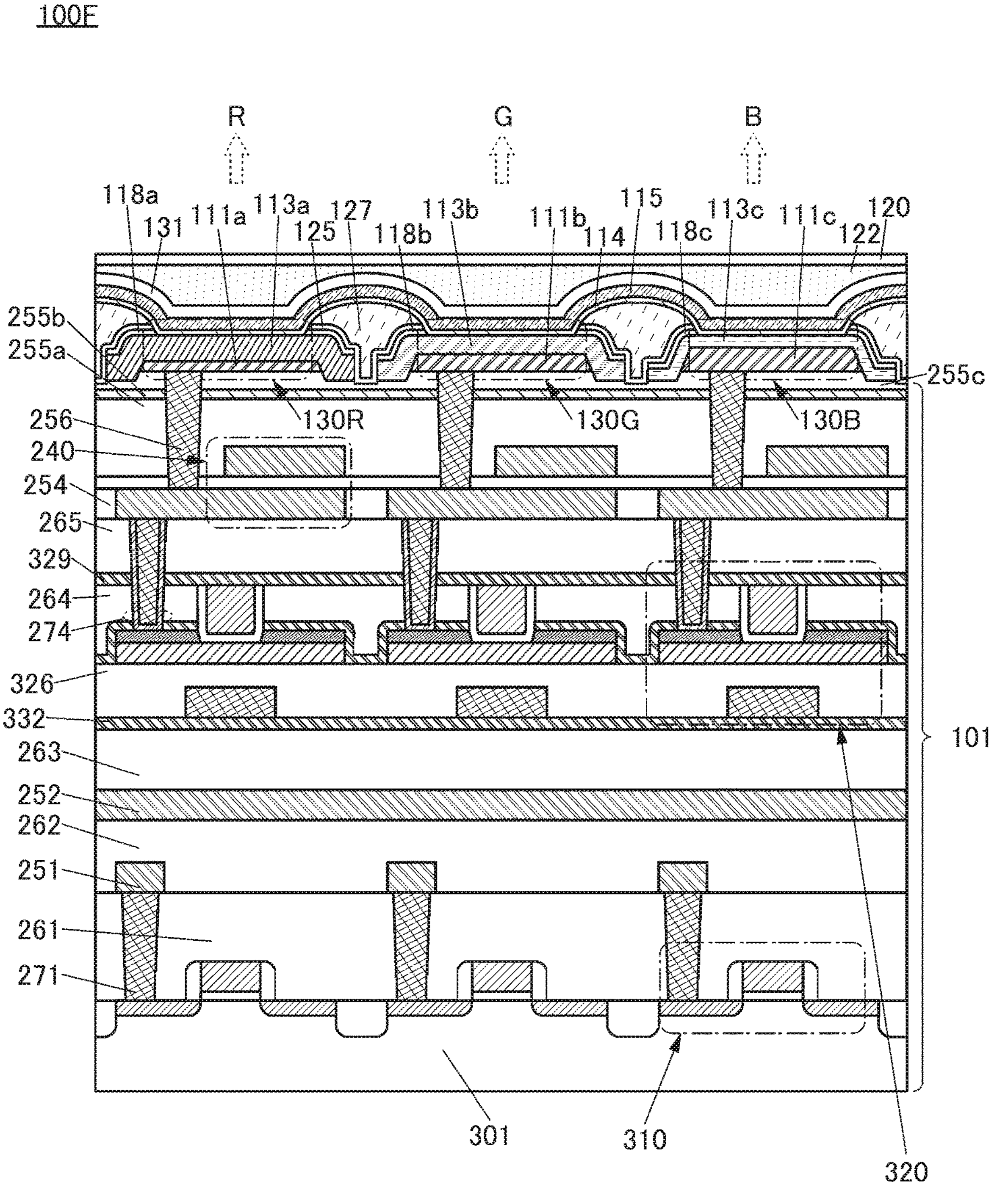
FIG. 23 is a cross-sectional view illustrating an example of a display apparatus.

The display apparatus 100F illustrated in FIG. 23 has a structure in which the transistor 310 whose channel is formed in the substrate 301 and the transistor 320 including a metal oxide in the semiconductor layer where the channel is formed are stacked.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit (a gate line driver circuit or a source line driver circuit) for driving the pixel circuit. The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting devices; thus, the display apparatus can be downsized as compared with the case where a driver circuit is provided around a display region.

[Display Apparatus 100G]

Figure 24:
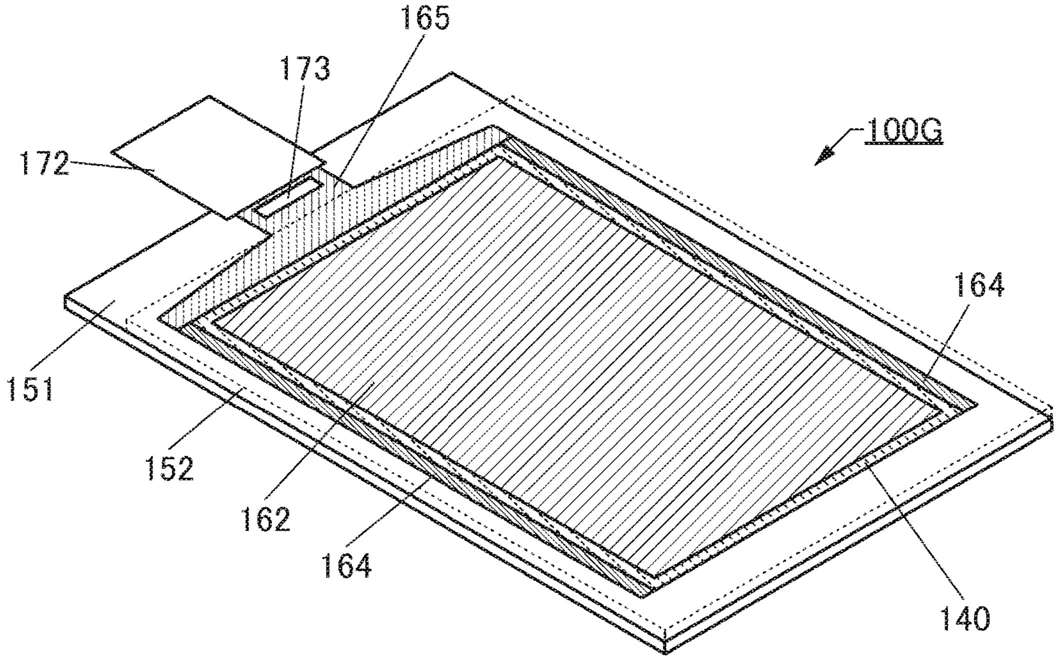
FIG. 24 is a perspective view illustrating an example of a display apparatus.

FIG. 24 is a perspective view of the display apparatus 100G, and FIG. 25A is a cross-sectional view of the display apparatus 100G.

In the display apparatus 100G, a substrate 152 and a substrate 151 are bonded to each other. In FIG. 24, the substrate 152 is denoted by a dashed line.

The display apparatus 100G includes a display portion 162, the connection portion 140, a circuit 164, a wiring 165, and the like. FIG. 24 illustrates an example where an IC 173 and an FPC 172 are mounted on the display apparatus 100G. Thus, the structure illustrated in FIG. 24 can be regarded as a display module including the display apparatus 100G, the IC (integrated circuit), and the FPC.

The connection portion 140 is provided outside the display portion 162. The connection portion 140 can be provided along one or more sides of the display portion 162. The number of connection portions 140 can be one or more. FIG. 24 illustrates an example where the connection portion 140 is provided to surround the four sides of the display portion. A common electrode of a light-emitting device is electrically connected to a conductive layer in the connection portion 140, so that a potential can be supplied to the common electrode.

As the circuit 164, a scan line driver circuit can be used, for example.

The wiring 165 has a function of supplying a signal and power to the display portion 162 and the circuits 164. The signal and power are input to the wiring 165 from the outside through the FPC 172 or from the IC 173.

FIG. 24 illustrates an example where the IC 173 is provided over the substrate 151 by a COG (Chip On Glass) method, a COF (Chip On Film) method, or the like. An IC including a scan line driver circuit, a signal line driver circuit, or the like can be used as the IC 173, for example.

Note that the display apparatus 100G and the display module are not necessarily provided with an IC. The IC may be mounted on the FPC by a COF method or the like.

FIG. 25A illustrates an example of cross sections of part of a region including the FPC 172, part of the circuit 164, part of the display portion 162, part of the connection portion 140, and part of a region including an end portion of the display apparatus 100G.

The display apparatus 100G illustrated in FIG. 25A includes a transistor 201, a transistor 205, the light-emitting device 130R that emits red light, the light-emitting device 130G that emits green light, the light-emitting device 130B that emits blue light, and the like between the substrate 151 and the substrate 152. The light-emitting devices 130*a*, 130*b*, and 130*c* described in the above embodiment can be referred to for the light-emitting devices 130R, 130G, and 130B, respectively.

The light-emitting devices 130R, 130G, and 130B each have the same structure as the stacked-layer structure illustrated in FIG. 1B except the structure of the pixel electrode. Embodiment 1 can be referred to for the details of the light-emitting devices.

Since the layer 113*a*, the layer 113*b*, and the layer 113*c* are separated from each other in the display apparatus 100G, crosstalk generated between adjacent subpixels can be prevented while the display apparatus 100G has high resolution. Accordingly, the display apparatus can have high resolution and high display quality.

The light-emitting device 130R includes a conductive layer 112*a*, a conductive layer 126*a* over the conductive layer 112*a*, and a conductive layer 129*a* over the conductive layer 126*a*. All of the conductive layers 112*a*, 126*a*, and 129*a* can be referred to as pixel electrodes, or one or two of them can be referred to as pixel electrodes.

The light-emitting device 130G includes the conductive layer 112*b*, the conductive layer 126*b* over the conductive layer 112*b*, and the conductive layer 129*b* over the conductive layer 126*b*.

The light-emitting device 130B includes a conductive layer 112*c*, a conductive layer 126*c* over the conductive layer 112*c*, and a conductive layer 129*c* over the conductive layer 126*c*.

The conductive layer 112*a* is connected to the conductive layer 222*b* included in the transistor 205 through an opening provided in the insulating layer 214. The end portion of the conductive layer 126*a* is positioned outward from the end portion of the conductive layer 112*a*. The end portion of the conductive layer 126*a* and the end portion of the conductive layer 129*a* are aligned or substantially aligned with each other. For example, a conductive layer functioning as a reflective electrode can be used as the conductive layer 112*a* and the conductive layer 126*a*, and a conductive layer functioning as a transparent electrode can be used as the conductive layer 129*a*.

Detailed description of the conductive layers 112*b*, 126*b*, and 129*b* of the light-emitting device 130G and the conductive layers 112*c*, 126*c*, and 129*c* of the light-emitting device 130B is omitted because these conductive layers are similar to the conductive layers 112*a*, 126*a*, and 129*a* of the light-emitting device 130R.

Depressed portions are formed in the conductive layers 112*a*, 112*b*, and 112*c* to cover the openings provided in the insulating layer 214. A layer 128 is embedded in each of the depressed portions.

The layer 128 has a function of filling the depressed portions of the conductive layers 112*a*, 112*b*, and 112*c*. The conductive layers 126*a*, 126*b*, and 126*c* electrically connected to the conductive layers 112*a*, 112*b*, and 112*c*, respectively, are provided over the conductive layers 112*a*, 112*b*, and 112*c* and the layer 128. Thus, regions overlapping with the depressed portions of the conductive layers 112*a*, 112*b*, and 112*c* can also be used as the light-emitting regions, increasing the aperture ratio of the pixels.

The layer 128 may be an insulating layer or a conductive layer. Any of a variety of inorganic insulating materials, organic insulating materials, and conductive materials can be used for the layer 128 as appropriate. In particular, the layer 128 is preferably formed using an insulating material.

An insulating layer containing an organic material can be suitably used for the layer 128. For the layer 128, an acrylic resin, a polyimide resin, an epoxy resin, a polyamide resin, a polyimide-amide resin, a siloxane resin, a benzocyclobutene-based resin, a phenol resin, a precursor of any of these resins, or the like can be used, for example. A photosensitive resin can also be used for the layer 128. As the photosensitive resin, a positive photosensitive material or a negative photosensitive material can be used.

When a photosensitive resin is used, the layer 128 can be formed through only light-exposure and development steps, reducing the influence of dry etching, wet etching, or the like on the surfaces of the conductive layers 112*a*, 112*b*, and 112*c*. When the layer 128 is formed using a negative photosensitive resin, the layer 128 can sometimes be formed using the same photomask (light-exposure mask) as the photomask used for forming the opening in the insulating layer 214.

The top and side surfaces of the conductive layer 126*a* and the top and side surfaces of the conductive layer 129*a* are covered with the layer 113*a*. Similarly, the top surface and side surfaces of the conductive layer 126*b* and the top and side surfaces of the conductive layer 129*b* are covered with the layer 113*b*. Moreover, the top and side surfaces of the conductive layer 126*c* and the top and side surfaces of the conductive layer 129*c* are covered with the layer 113*c*. Accordingly, regions provided with the conductive layers 126*a*, 126*b*, and 126*c* can be entirely used as the light-emitting regions of the light-emitting devices 130R, 130G, and 130B, increasing the aperture ratio of the pixels.

The side surfaces of the layer 113*a*, the layer 113*b*, and the layer 113*c* are covered with the insulating layers 125 and 127. The mask layer 118*a* is positioned between the layer 113*a* and the insulating layer 125. The mask layer 118*b* is positioned between the layer 113*b* and the insulating layer 125, and the mask layer 118*c* is positioned between the layer 113*c* and the insulating layer 125. The common layer 114 is provided over the layer 113*a*, the layer 113*b*, the layer 113*c*, and the insulating layers 125 and 127. The common electrode 115 is provided over the common layer 114. The common layer 114 and the common electrode 115 are each a continuous film shared by a plurality of light-emitting devices.

The protective layer 131 is provided over each of the light-emitting devices 130R, 130G, and 130B. The protective layer 131 covering the light-emitting device can inhibit an impurity such as water from entering the light-emitting device, and increase the reliability of the light-emitting device.

The protective layer 131 and the substrate 152 are bonded to each other with an adhesive layer 142. A solid sealing structure, a hollow sealing structure, or the like can be employed to seal the light-emitting devices. In FIG. 25A, a solid sealing structure is employed in which a space between the substrate 152 and the substrate 151 is filled with the adhesive layer 142. Alternatively, a hollow sealing structure in which the space is filled with an inert gas (e.g., nitrogen or argon) may be employed. Here, the adhesive layer 142 may be provided not to overlap with the light-emitting devices. The space may be filled with a resin other than the frame-shaped adhesive layer 142.

The conductive layer 123 is provided over the insulating layer 214 in the connection portion 140. An example is described in which the conductive layer 123 has a stacked-layer structure of a conductive film obtained by processing the same conductive film as the conductive layers 112*a*, 112*b*, and 112*c*; a conductive film obtained by processing the same conductive film as the conductive layers 126*a*, 126*b*, and 126*c*; and a conductive film obtained by processing the same conductive film as the conductive layers 129*a*, 129*b*, and 129*c*. The end portion of the conductive layer 123 is covered with the mask layer 118*a*, the insulating layer 125, and the insulating layer 127. The common layer 114 is provided over the conductive layer 123, and the common electrode 115 is provided over the common layer 114. The conductive layer 123 and the common electrode 115 are electrically connected to each other through the common layer 114. Note that the common layer 114 is not necessarily formed in the connection portion 140. In this case, the conductive layer 123 and the common electrode 115 are in direct contact with each other to be electrically connected to each other.

The display apparatus 100G has atop-emission structure. Light emitted from the light-emitting device is emitted toward the substrate 152. For the substrate 152, a material having a high property of transmitting visible light is preferably used. The pixel electrode contains a material that reflects visible light, and a counter electrode (the common electrode 115) contains a material that transmits visible light.

A stacked-layer structure including the substrate 151 and the components thereover up to the insulating layer 214 corresponds to the layer 101 including transistors in Embodiment 1.

The transistor 201 and the transistor 205 are formed over the substrate 151. These transistors can be fabricated using the same material in the same step.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more. A material through which impurities such as water and hydrogen do not easily diffuse is preferably used for at least one of the insulating layers covering the transistors. This allows the insulating layer to function as a barrier layer. Such a structure can effectively inhibit diffusion of impurities into the transistors from the outside and increase the reliability of a display apparatus.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating layer is suitable as the insulating layer 214 functioning as a planarization layer. Examples of materials that can be used for the organic insulating layer include an acrylic resin, a polyimide resin, an epoxy resin, a polyamide resin, a polyimide-amide resin, a siloxane resin, a benzocyclobutene-based resin, a phenol resin, and precursors of these resins. The insulating layer 214 may have a stacked-layer structure of an organic insulating layer and an inorganic insulating layer. The uppermost layer of the insulating layer 214 preferably has a function of an etching protective layer. Accordingly, a depressed portion can be prevented from being formed in the insulating layer 214 at the time of processing the conductive layer 112*a*, the conductive layer 126*a*, the conductive layer 129*a*, or the like. Alternatively, a depressed portion may be formed in the insulating layer 214 at the time of processing the conductive layer 112*a*, the conductive layer 126*a*, the conductive layer 129*a*, or the like.

Each of the transistor 201 and the transistor 205 includes a conductive layer 221 functioning as a gate, the insulating layer 211 functioning as a gate insulating layer, a conductive layer 222*a* and the conductive layer 222*b* functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, an inverted staggered transistor, or the like can be used. A top-gate or a bottom-gate transistor structure may be employed. Alternatively, gates may be provided above and below the semiconductor layer where a channel is formed.

The structure where the semiconductor layer where a channel is formed is provided between two gates is used for the transistor 201 and the transistor 205. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and either an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case degradation of the transistor characteristics can be inhibited.

The semiconductor layer of the transistor preferably includes a metal oxide (also referred to as an oxide semiconductor). That is, a transistor including a metal oxide in its channel formation region (hereinafter, also referred to as an OS transistor) is preferably used for the display apparatus of this embodiment.

As the oxide semiconductor having crystallinity, a CAAC (c-axis aligned crystalline)-OS, an nc (nanocrystalline)-OS, and the like can be given.

Alternatively, a transistor using silicon in its channel formation region (a Si transistor) may be used. As silicon, single crystal silicon, polycrystalline silicon, amorphous silicon, and the like can be given. In particular, a transistor containing low-temperature polysilicon (LTPS) in its semiconductor layer (hereinafter also referred to as an LTPS transistor) can be used. The LTPS transistor has high field-effect mobility and favorable frequency characteristics.

With the use of Si transistors such as LTPS transistors, a circuit required to be driven at a high frequency (e.g., a source driver circuit) can be formed on the same substrate as the display portion. Thus, external circuits mounted on the display apparatus can be simplified, and component cost and mounting cost can be reduced.

An OS transistor has extremely higher field-effect mobility than a transistor containing amorphous silicon. In addition, the OS transistor has an extremely low leakage current between a source and a drain in an off state (hereinafter, also referred to as off-state current), and charge accumulated in a capacitor that is connected in series to the transistor can be retained for a long period. Furthermore, power consumption of the display apparatus can be reduced with the use of an OS transistor.

The off-state current value per micrometer of channel width of the OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current value per micrometer of channel width of a Si transistor at room temperature is higher than or equal to 1 fA ($1\times10^{-15}$ A) and lower than or equal to 1 pA ($1\times10^{-12}$ A). In other words, the off-state current of an OS transistor is lower than that of a Si transistor by approximately ten orders of magnitude.

To increase the emission luminance of the light-emitting device included in the pixel circuit, the amount of current fed through the light-emitting device needs to be increased. For this, it is necessary to increase the source-drain voltage of a driving transistor included in the pixel circuit. Since an OS transistor has a higher withstand voltage between the source and the drain than a Si transistor, a high voltage can be applied between the source and the drain of the OS transistor. Accordingly, when an OS transistor is used as the driving transistor included in the pixel circuit, the amount of current flowing through the light-emitting device can be increased, so that the emission luminance of the light-emitting device can be increased.

When transistors operate in a saturation region, a change in source-drain current with respect to a change in gate-source voltage can be smaller in an OS transistor than in a Si transistor. Accordingly, when an OS transistor is used as the driving transistor in the pixel circuit, the amount of current flowing between the source and the drain can be set minutely by a change in gate-source voltage; hence, the amount of current flowing through the light-emitting device can be controlled. Accordingly, the number of gray levels in the pixel circuit can be increased.

Regarding saturation characteristics of a current flowing when transistors operate in a saturation region, even in the case where the source-drain voltage of an OS transistor increases gradually, a more stable current (saturation current) can be fed through the OS transistor than through a Si transistor. Thus, by using an OS transistor as the driving transistor, a stable current can be fed through light-emitting devices even when the current-voltage characteristics of the EL devices vary, for example. In other words, when the OS transistor operates in the saturation region, the source-drain current hardly changes with an increase in the source-drain voltage; hence, the emission luminance of the light-emitting device can be stable.

As described above, with the use of an OS transistor as a driving transistor included in the pixel circuit, it is possible to achieve "inhibition of black floating", "increase in emission luminance", "increase in gray level", "inhibition of variation in light-emitting devices", and the like.

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable that indium (In), gallium (Ga), and zinc (Zn) (also referred to as IGZO) be used for the semiconductor layer. Alternatively, it is preferable to use an oxide containing indium, tin, and zinc. Further alternatively, it is preferable to use an oxide containing indium, gallium, tin, and zinc. Alternatively, an oxide containing indium (In), aluminum (Al), and zinc (Zn) (also referred to as IAZO) is preferably used for the semiconductor layer. Alternatively, an oxide containing indium (In), aluminum (Al), gallium (Ga), and zinc (Zn) (also referred to as IAGZO) is preferably used for the semiconductor layer.

When an In-M-Zn oxide is used for the semiconductor layer, the atomic ratio of In is preferably higher than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=1:3:2 or a composition in the neighborhood thereof, In:M:Zn=1:3:4 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where Ga is greater than or equal to 1 and less than or equal to 3 and Zn is greater than or equal to 2 and less than or equal to 4 with In being 4. When the atomic ratio is described as In:Ga:Zn=5:1:6 or a composition in the neighborhood thereof, the case is included where Ga is greater than 0.1 and less than or equal to 2 and Zn is greater than or equal to 5 and less than or equal to 7 with In being 5. When the atomic ratio is described as In:Ga:Zn=1:1:1 or a composition in the neighborhood thereof, the case is included where Ga is greater than 0.1 and less than or equal to 2 and Zn is greater than 0.1 and less than or equal to 2 with In being 1.

The transistor included in the circuit 164 and the transistor included in the display portion 162 may have the same structure or different structures. One structure or two or more types of structures may be employed for a plurality of transistors included in the circuit 164. Similarly, one structure or two or more types of structures may be employed for a plurality of transistors included in the display portion 162.

All of the transistors included in the display portion 162 may be OS transistors or all of the transistors included in the display portion 162 may be Si transistors; alternatively, some of the transistors included in the display portion 162 may be OS transistors and the others may be Si transistors.

For example, when both an LTPS transistor and an OS transistor are used in the display portion 162, the display apparatus can have low power consumption and high drive capability. Note that a structure where an LTPS transistor and an OS transistor are used in combination is referred to as LTPO in some cases. Note that in a further suitable example, it is preferable that an OS transistor be used as, for example, a transistor functioning as a switch for controlling conduction and that non-conduction between wirings and an LTPS transistor be used as, for example, a transistor for controlling current.

For example, one of the transistors included in the display portion 162 functions as a transistor for controlling a current flowing through the light-emitting device and can be referred to as a driving transistor. One of a source and a drain of the driving transistor is electrically connected to the pixel electrode of the light-emitting device. An LTPS transistor is preferably used as the driving transistor. Accordingly, the amount of current flowing through the light-emitting device can be increased in the pixel circuit.

Another transistor included in the display portion 162 functions as a switch for controlling selection and non-selection of the pixel and can be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., 1 fps or less); thus, power consumption can be reduced by stopping the driver in displaying a still image.

As described above, the display apparatus of one embodiment of the present invention can have all of a high aperture ratio, high resolution, high display quality, and low power consumption.

Note that the display apparatus of one embodiment of the present invention has a structure including the OS transistor and the light-emitting device having an MML (metal maskless) structure. With this structure, the leakage current that might flow through the transistor and the leakage current that might flow between adjacent light-emitting devices (also referred to as lateral leakage current, side leakage current, or the like) can be extremely low. With the structure, a viewer can notice any one or more of the image crispness, the image sharpness, a high chroma, and a high contrast ratio in an image displayed on the display apparatus. When the leakage current that might flow through the transistor and the lateral leakage current that might flow between light-emitting devices are extremely low, display with little leakage of light at the time of black display (i.e., with few phenomena in which the black image looks whitish) (such display is also referred to as deep black display) can be achieved.

FIG. 25B and FIG. 25C illustrate other structure examples of transistors.

A transistor 209 and a transistor 210 each include the conductive layer 221 functioning as a gate, the insulating layer 211 functioning as a gate insulating layer, the semiconductor layer 231 including a channel formation region 231*i* and a pair of low-resistance regions 231*n*, the conductive layer 222*a* connected to one of the pair of low-resistance regions 231*n*, the conductive layer 222*b* connected to the other of the pair of the low-resistance regions 231*n*, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned at least between the conductive layer 223 and the channel formation region 231*i*. Furthermore, an insulating layer 218 covering the transistor may be provided.

FIG. 25B illustrates an example of the transistor 209 in which the insulating layer 225 covers the top and side surfaces of the semiconductor layer 231. The conductive layer 222*a* and the conductive layer 222*b* are connected to the low-resistance regions 231*n* through openings provided in the insulating layer 225 and the insulating layer 215. One of the conductive layer 222*a* and the conductive layer 222*b* functions as a source, and the other functions as a drain.

Meanwhile, in the transistor 210 illustrated in FIG. 25C, the insulating layer 225 overlaps with the channel formation region 231*i* of the semiconductor layer 231 and does not overlap with the low-resistance regions 231*n*. The structure illustrated in FIG. 25C can be formed by processing the insulating layer 225 with the conductive layer 223 as a mask, for example. In FIG. 25C, the insulating layer 215 is provided to cover the insulating layer 225 and the conductive layer 223, and the conductive layer 222*a* and the conductive layer 222*b* are connected to the low-resistance regions 231*n* through the openings in the insulating layer 215.

A connection portion 204 is provided in a region of the substrate 151 where the substrate 152 does not overlap. In the connection portion 204, the wiring 165 is electrically connected to the FPC 172 through a conductive layer 166 and a connection layer 242. An example is illustrated in which the conductive layer 166 has a stacked-layer structure of a conductive film obtained by processing the same conductive film as the conductive layers 112*a*, 112*b*, and 112*c*, a conductive film obtained by processing the same conductive film as the conductive layers 126*a*, 126*b*, and 126*c*, and a conductive film obtained by processing the same conductive film as the conductive layers 129*a*, 129*b*, and 129*c*. The conductive layer 166 is exposed on the top surface of the connection portion 204. Thus, the connection portion 204 and the FPC 172 can be electrically connected to each other through the connection layer 242.

A light-blocking layer 117 is preferably provided on a surface of the substrate 152 that faces the substrate 151. The light-blocking layer 117 can be provided between adjacent light-emitting devices, in the connection portion 140, and in the circuit 164, for example. A variety of optical members can be arranged on the outer surface of the substrate 152.

The material that can be used for the substrate 120 can be used for each of the substrate 151 and the substrate 152.

The material that can be used for the resin layer 122 can be used for the adhesive layer 142.

As the connection layer 242, an anisotropic conductive film (ACF), an anisotropic conductive paste (ACP), or the like can be used.

This embodiment can be combined with the other embodiments as appropriate.

Embodiment 4

In this embodiment, a structure example of a transistor that can be used in the display apparatus of one embodiment of the present invention will be described. Specifically, the case of using a transistor including silicon as a semiconductor where a channel is formed will be described.

One embodiment of the present invention is a display apparatus including a light-emitting device and a pixel circuit. For example, three kinds of light-emitting devices emitting light of red (R), green (G), and blue (B) are included, whereby a full-color display apparatus can be achieved.

Transistors containing silicon in their semiconductor layers where channels are formed are preferably used as all transistors included in the pixel circuit for driving the light-emitting device. As silicon, single crystal silicon, polycrystalline silicon, amorphous silicon, and the like can be given. In particular, a transistor containing low-temperature polysilicon (LTPS) in its semiconductor layer (hereinafter also referred to as an LTPS transistor) is preferably used. The LTPS transistor has high field-effect mobility and favorable frequency characteristics.

With the use of transistors containing silicon, such as LTPS transistors, a circuit required to be driven at a high frequency (e.g., a source driver circuit) can be formed on the same substrate as the display portion. Thus, external circuits mounted on the display apparatus can be simplified, whereby parts costs and mounting costs can be reduced.

It is preferable to use transistors including a metal oxide (hereinafter also referred to as an oxide semiconductor) in their semiconductor layers where channels are formed (such transistors are hereinafter also referred to as OS transistors) as at least one of the transistors included in the pixel circuit. An OS transistor has extremely higher field-effect mobility than a transistor using amorphous silicon. In addition, the OS transistor has an extremely low leakage current between a source and a drain in an off state (hereinafter, also referred to as off-state current), and charge accumulated in a capacitor that is connected in series to the transistor can be retained for a long period. Furthermore, power consumption of the display apparatus can be reduced with the use of an OS transistor.

When an LTPS transistor is used as one or more of the transistors included in the pixel circuit and an OS transistor is used as the rest, a display apparatus with low power consumption and high driving capability can be achieved. As a more preferable example, it is preferable to use an OS transistor as, for example, a transistor functioning as a switch for controlling electrical continuity between wirings and an LTPS transistor as, for example, a transistor for controlling current.

For example, one of the transistors included in the pixel circuit functions as a transistor for controlling current flowing through the light-emitting device and can be referred to as a driving transistor. One of a source and a drain of the driving transistor is electrically connected to the pixel electrode of the light-emitting device. An LTPS transistor is preferably used as the driving transistor. In this case, the amount of current flowing through the light-emitting device can be increased in the pixel circuit.

Another transistor included in the pixel circuit functions as a switch for controlling selection and non-selection of the pixel and can be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., 1 fps or less); thus, power consumption can be reduced by stopping the driver in displaying a still image.

More specific structure examples are described below with reference to drawings.

[Structure Example of Display Apparatus]

Figure 26A:
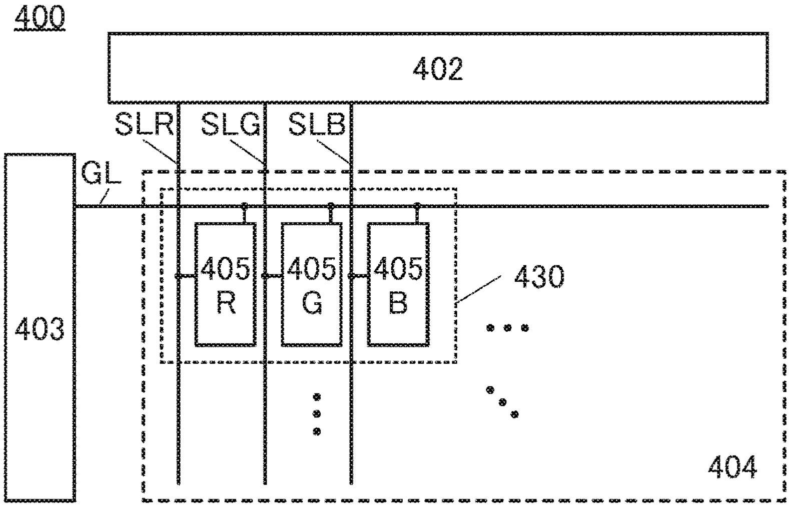
FIG. 26A is a block diagram illustrating an example of a display apparatus.

FIG. 26A illustrates a block diagram of a display apparatus 400. The display apparatus 400 includes a display portion 404, a driver circuit portion 402, a driver circuit portion 403, and the like.

The display portion 404 includes a plurality of pixels 430 arranged in a matrix. The pixels 430 each include a subpixel 405R, a subpixel 405G, and a subpixel 405B. The subpixel 405R, the subpixel 405G, and the subpixel 405B each include a light-emitting device functioning as a display device.

The pixel 430 is electrically connected to a wiring GL, a wiring SLR, a wiring SLG, and a wiring SLB. The wiring SLR, the wiring SLG, and the wiring SLB are electrically connected to the driver circuit portion 402. The wiring GL is electrically connected to the driver circuit portion 403. The driver circuit portion 402 functions as a source line driver circuit (also referred to as a source driver), and the driver circuit portion 403 functions as a gate line driver circuit (also referred to as a gate driver). The wiring GL functions as a gate line, and the wiring SLR, the wiring SLG, and the wiring SLB each function as a source line.

The subpixel 405R includes a light-emitting device emitting red light. The subpixel 405G includes a light-emitting device emitting green light. The subpixel 405B includes a light-emitting device emitting blue light. Thus, the display apparatus 400 can perform full-color display. Note that the pixel 430 may include a subpixel including a light-emitting device emitting light of another color. For example, the pixel 430 may include, in addition to the three subpixels, a subpixel including a light-emitting device emitting white light, a subpixel including a light-emitting device emitting yellow light, or the like.

The wiring GL is electrically connected to the subpixel 405R, the subpixel 405G, and the subpixel 405B arranged in a row direction (an extending direction of the wiring GL). The wiring SLR, the wiring SLG, and the wiring SLB are electrically connected to the subpixels 405R, the subpixels 405G, and the subpixels 405B (not illustrated) arranged in a column direction (an extending direction of the wiring SLR and the like), respectively.

[Structure Example of Pixel Circuit]

Figure 26B:
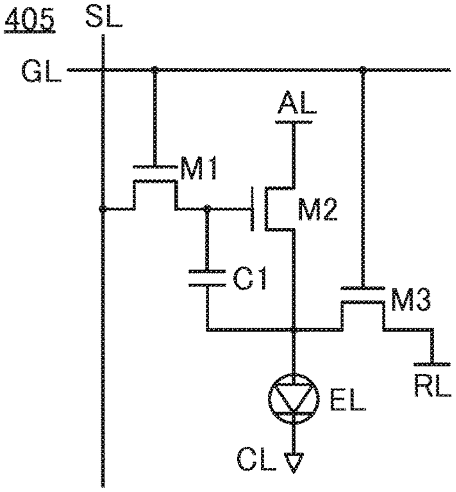
FIG. 26B to FIG. 26D are diagrams illustrating structure examples of a pixel circuit.

FIG. 26B illustrates an example of a circuit diagram of a pixel 405 that can be used as the subpixel 405R, the subpixel 405G, and the subpixel 405B. The pixel 405 includes a transistor M1, a transistor M2, a transistor M3, a capacitor C1, and a light-emitting device EL. The wiring GL and a wiring SL are electrically connected to the pixel 405. The wiring SL corresponds to any of the wiring SLR, the wiring SLG, and the wiring SLB illustrated in FIG. 26A.

A gate of the transistor M1 is electrically connected to the wiring GL, one of a source and a drain of the transistor M1 is electrically connected to the wiring SL, and the other thereof is electrically connected to one electrode of the capacitor C1 and a gate of the transistor M2. One of a source and a drain of the transistor M2 is electrically connected to a wiring AL, and the other of the source and the drain of the transistor M2 is electrically connected to one electrode of the light-emitting device EL, the other electrode of the capacitor C1, and one of a source and a drain of the transistor M3. A gate of the transistor M3 is electrically connected to the wiring GL, and the other of the source and the drain of the transistor M3 is electrically connected to a wiring RL. The other electrode of the light-emitting device EL is electrically connected to a wiring CL.

A data potential is supplied to the wiring SL. A selection signal is supplied to the wiring GL. The selection signal includes a potential for bringing a transistor into a conducting state and a potential for bringing a transistor into a non-conducting state.

A reset potential is supplied to the wiring RL. An anode potential is supplied to the wiring AL. A cathode potential is supplied to the wiring CL. In the pixel 405, the anode potential is a potential higher than the cathode potential. The reset potential supplied to the wiring RL can be set such that a potential difference between the reset potential and the cathode potential is lower than the threshold voltage of the light-emitting device EL. The reset potential can be a potential higher than the cathode potential, a potential equal to the cathode potential, or a potential lower than the cathode potential.

The transistor M1 and the transistor M3 each function as a switch. For example, the transistor M2 functions as a transistor for controlling current flowing through the light-emitting device EL. For example, it can be said that the transistor M1 functions as a selection transistor and the transistor M2 functions as a driving transistor.

Here, it is preferable to use LTPS transistors as all of the transistor M1 to the transistor M3. Alternatively, it is preferable to use OS transistors as the transistor M1 and the transistor M3 and to use an LTPS transistor as the transistor M2.

Alternatively, OS transistors may be used as all of the transistor M1 to the transistor M3. In this case, an LTPS transistor can be used as at least one of a plurality of transistors included in the driver circuit portion 402 and a plurality of transistors included in the driver circuit portion 403, and OS transistors can be used as the other transistors. For example, OS transistors can be used as the transistors provided in the display portion 404, and LTPS transistors can be used as the transistors provided in the driver circuit portion 402 and the driver circuit portion 403.

As the OS transistor, a transistor including an oxide semiconductor in its semiconductor layer where a channel is formed can be used. The semiconductor layer preferably contains indium, M (M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more selected from aluminum, gallium, yttrium, and tin. It is particularly preferable to use an oxide containing indium, gallium, and zinc (also referred to as IGZO) for the semiconductor layer of the OS transistor. Alternatively, it is preferable to use an oxide containing indium, tin, and zinc. Further alternatively, it is preferable to use an oxide containing indium, gallium, tin, and zinc.

A transistor using an oxide semiconductor having a wider band gap and a lower carrier density than silicon can achieve an extremely low off-state current. Thus, such a low off-state current enables long-term retention of electric charge accumulated in a capacitor that is connected to the transistor in series. Therefore, it is particularly preferable to use a transistor including an oxide semiconductor as the transistor M1 and the transistor M3 each of which is connected to the capacitor C1 in series. The use of the transistor including an oxide semiconductor as each of the transistor M1 and the transistor M3 can prevent leakage of charge retained in the capacitor C1 through the transistor M1 or the transistor M3. Furthermore, since charge retained in the capacitor C1 can be retained for a long time, a still image can be displayed for a long time without rewriting data in the pixel 405.

Note that although the transistor is illustrated as an n-channel transistor in FIG. 26B, a p-channel transistor can also be used.

The transistors included in the pixel 405 are preferably formed to be arranged over the same substrate.

Note that transistors each including a pair of gates overlapping with each other with a semiconductor layer therebetween can be used as the transistors included in the pixel 405.

In the transistor including a pair of gates, the same potential is supplied to the pair of gates electrically connected to each other, which brings advantage that the transistor can have a higher on-state current and improved saturation characteristics. A potential for controlling the threshold voltage of the transistor may be supplied to one of the pair of gates. Furthermore, when a constant potential is supplied to one of the pair of gates, the stability of the electrical characteristics of the transistor can be improved. For example, one of the gates of the transistor may be electrically connected to a wiring to which a constant potential is supplied or may be electrically connected to a source or a drain of the transistor.

Figure 26C:
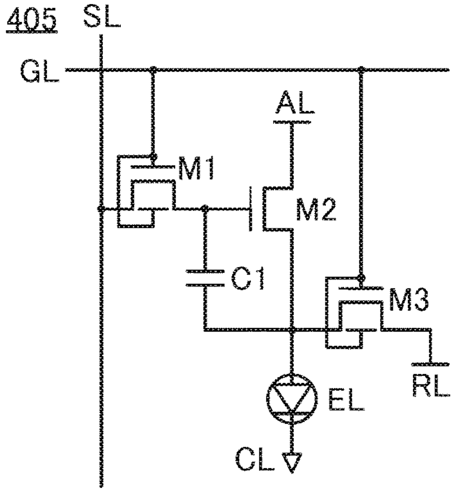

The pixel 405 illustrated in FIG. 26C is an example where a transistor including a pair of gates is used as each of the transistor M1 and the transistor M3. In each of the transistor M1 and the transistor M3, the pair of gates are electrically connected to each other. Such a structure can shorten the period in which data is written to the pixel 405.

Figure 26D:
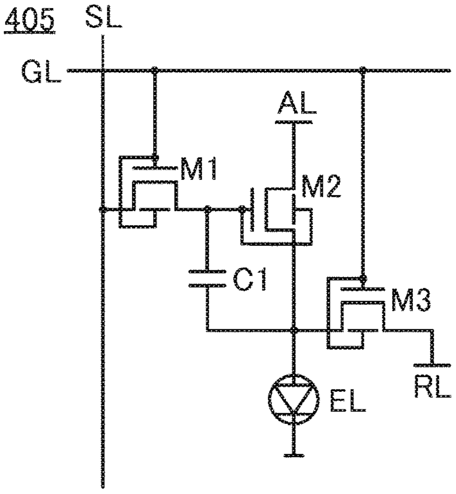

The pixel 405 illustrated in FIG. 26D is an example where a transistor including a pair of gates is used as the transistor M2 in addition to the transistor M1 and the transistor M3. A pair of gates of the transistor M2 are electrically connected to each other. When such a transistor is used as the transistor M2, the saturation characteristics are improved, whereby emission luminance of the light-emitting device EL can be controlled easily and the display quality can be increased.

[Structure Example of Transistor]

Cross-sectional structure examples of a transistor that can be used in the display apparatus described above are described below.

Structure Example 1

Figure 27A:
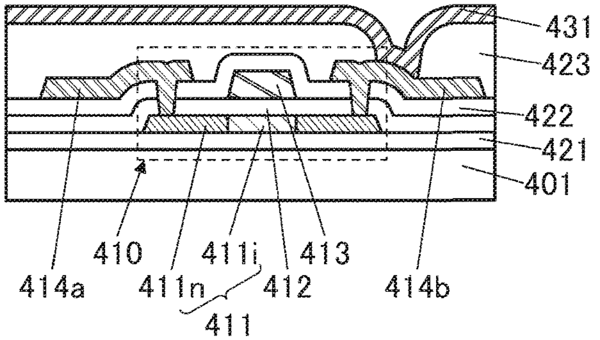
FIG. 27A to FIG. 27D are diagrams illustrating examples of transistors.

FIG. 27A is a cross-sectional view including a transistor 410.

The transistor 410 is provided over a substrate 401 and contains polycrystalline silicon in its semiconductor layer. For example, the transistor 410 corresponds to the transistor M2 in the pixel 405. In other words, FIG. 27A illustrates an example in which one of a source and a drain of the transistor 410 is electrically connected to a conductive layer 431 of the light-emitting device.

The transistor 410 includes a semiconductor layer 411, an insulating layer 412, a conductive layer 413, and the like. The semiconductor layer 411 includes a channel formation region 411*i* and low-resistance regions 411*n*. The semiconductor layer 411 contains silicon. The semiconductor layer 411 preferably contains polycrystalline silicon. Part of the insulating layer 412 functions as a gate insulating layer. Part of the conductive layer 413 functions as a gate electrode.

Note that the semiconductor layer 411 can include a metal oxide exhibiting semiconductor characteristics (also referred to as an oxide semiconductor). In this case, the transistor 410 can be referred to as an OS transistor.

The low-resistance region 411*n* is a region containing an impurity element. For example, in the case where the transistor 410 is an n-channel transistor, phosphorus, arsenic, or the like is added to the low-resistance region 411*n*. Meanwhile, in the case where the transistor 410 is a p-channel transistor, boron, aluminum, or the like is added to the low-resistance region 411*n*. In addition, in order to control the threshold voltage of the transistor 410, the above-described impurity may be added to the channel formation region 411*i*.

An insulating layer 421 is provided over the substrate 401. The semiconductor layer 411 is provided over the insulating layer 421. The insulating layer 412 is provided to cover the semiconductor layer 411 and the insulating layer 421. The conductive layer 413 is provided at a position that is over the insulating layer 412 and overlaps with the semiconductor layer 411.

An insulating layer 422 is provided to cover the conductive layer 413 and the insulating layer 412. A conductive layer 414*a* and a conductive layer 414*b* are provided over the insulating layer 422. The conductive layer 414*a* and the conductive layer 414*b* are each electrically connected to the low-resistance region 411*n* in the opening portion provided in the insulating layer 422 and the insulating layer 412. Part of the conductive layer 414*a* functions as one of a source electrode and a drain electrode and part of the conductive layer 414*b* functions as the other of the source electrode and the drain electrode. An insulating layer 423 is provided to cover the conductive layer 414*a*, and the conductive layer 414*b*, and the insulating layer 422.

The conductive layer 431 functioning as a pixel electrode is provided over the insulating layer 423. The conductive layer 431 is provided over the insulating layer 423 and is electrically connected to the conductive layer 414*b* through an opening provided in the insulating layer 423. Although not illustrated here, an EL layer and a common electrode can be stacked over the conductive layer 431.

Structure Example 2

Figure 27B:
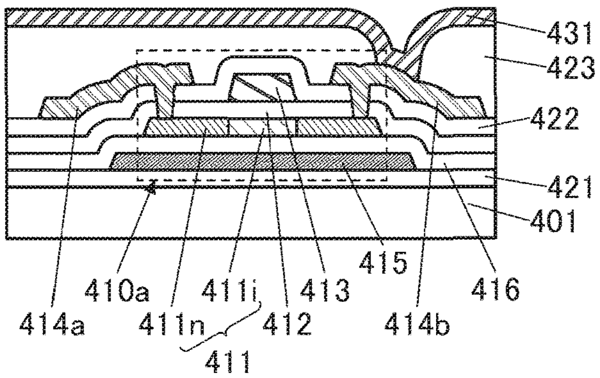

FIG. 27B illustrates a transistor 410*a* including a pair of gate electrodes. The transistor 410*a* illustrated in FIG. 27B is different from FIG. 27A mainly in including a conductive layer 415 and an insulating layer 416.

The conductive layer 415 is provided over the insulating layer 421. The insulating layer 416 is provided to cover the conductive layer 415 and the insulating layer 421. The semiconductor layer 411 is provided such that at least the channel formation region 411*i* overlaps with the conductive layer 415 with the insulating layer 416 therebetween.

In the transistor 410*a* illustrated in FIG. 27B, part of the conductive layer 413 functions as a first gate electrode, and part of the conductive layer 415 functions as a second gate electrode. At this time, part of the insulating layer 412 functions as a first gate insulating layer, and part of the insulating layer 416 functions as a second gate insulating layer.

Here, to electrically connect the first gate electrode to the second gate electrode, the conductive layer 413 is electrically connected to the conductive layer 415 through an opening portion provided in the insulating layer 412 and the insulating layer 416 in a region not illustrated. To electrically connect the second gate electrode to a source or a drain, the conductive layer 415 is electrically connected to the conductive layer 414*a* or the conductive layer 414*b* through an opening portion provided in the insulating layer 422, the insulating layer 412, and the insulating layer 416 in a region not illustrated.

In the case where LTPS transistors are used as all of the transistors included in the pixel 405, the transistor 410 exemplified in FIG. 27A or the transistor 410*a* exemplified in FIG. 27B can be used. In this case, the transistors 410*a* may be used as all of the transistors included in the pixels 405, the transistors 410 may be used as all of the transistors, or the transistors 410*a* and the transistors 410 may be used in combination.

Structure Example 3

Described below is an example of a structure including both a transistor containing silicon in its semiconductor layer and a transistor containing a metal oxide in its semiconductor layer.

Figure 27C:
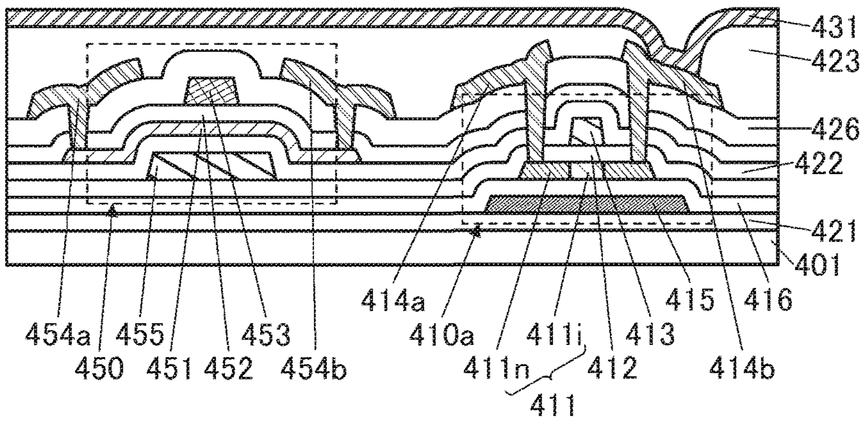

FIG. 27C is a schematic cross-sectional view including the transistor 410*a* and a transistor 450.

Structure example 1 described above can be referred to for the transistor 410*a*. Although an example using the transistor 410*a* is illustrated here, a structure including the transistor 410 and the transistor 450 or a structure including all the transistor 410, the transistor 410*a*, and the transistor 450 may alternatively be employed.

The transistor 450 is a transistor including metal oxide in its semiconductor layer. The structure in FIG. 27C illustrates an example in which the transistor 450 corresponds to the transistor M1 and the transistor 410*a* corresponds to the transistor M2 in the pixel 405. That is, FIG. 27C illustrates an example in which one of a source and a drain of the transistor 410*a* is electrically connected to the conductive layer 431.

Moreover, FIG. 27C illustrates an example in which the transistor 450 includes a pair of gates.

The transistor 450 includes a conductive layer 455, the insulating layer 422, a semiconductor layer 451, an insulating layer 452, a conductive layer 453, and the like. Part of the conductive layer 453 functions as a first gate of the transistor 450, and part of the conductive layer 455 functions as a second gate of the transistor 450. In this case, part of the insulating layer 452 functions as a first gate insulating layer of the transistor 450, and part of the insulating layer 422 functions as a second gate insulating layer of the transistor 450.

The conductive layer 455 is provided over the insulating layer 412. The insulating layer 422 is provided to cover the conductive layer 455. The semiconductor layer 451 is provided over the insulating layer 422. The insulating layer 452 is provided to cover the semiconductor layer 451 and the insulating layer 422. The conductive layer 453 is provided over the insulating layer 452 and includes a region overlapping with the semiconductor layer 451 and the conductive layer 455.

An insulating layer 426 is provided to cover the insulating layer 452 and the conductive layer 453. A conductive layer 454*a* and a conductive layer 454*b* are provided over the insulating layer 426. The conductive layer 454*a* and the conductive layer 454*b* are electrically connected to the semiconductor layer 451 in openings provided in the insulating layer 426 and the insulating layer 452. Part of the conductive layer 454*a* functions as one of a source electrode and a drain electrode and part of the conductive layer 454*b* functions as the other of the source electrode and the drain electrode. The insulating layer 423 is provided to cover the conductive layer 454*a*, the conductive layer 454*b*, and the insulating layer 426.

Here, the conductive layer 414*a* and the conductive layer 414*b* electrically connected to the transistor 410*a* are preferably formed by processing the same conductive film as the conductive layer 454*a* and the conductive layer 454*b*. In FIG. 27C, the conductive layer 414*a*, the conductive layer 414*b*, the conductive layer 454*a*, and the conductive layer 454*b* are formed on the same plane (i.e., in contact with the top surface of the insulating layer 426) and contain the same metal element. In this case, the conductive layer 414*a* and the conductive layer 414*b* are electrically connected to the low-resistance regions 411*n* through openings provided in the insulating layer 426, the insulating layer 452, the insulating layer 422, and the insulating layer 412. This is preferable because the manufacturing process can be simplified.

Moreover, the conductive layer 413 functioning as the first gate electrode of the transistor 410*a* and the conductive layer 455 functioning as the second gate electrode of the transistor 450 are preferably formed by processing the same conductive film. FIG. 27C illustrates a structure where the conductive layer 413 and the conductive layer 455 are formed on the same plane (i.e., in contact with the top surface of the insulating layer 412) and contain the same metal element. This is preferable because the fabrication process can be simplified.

Figure 27D:
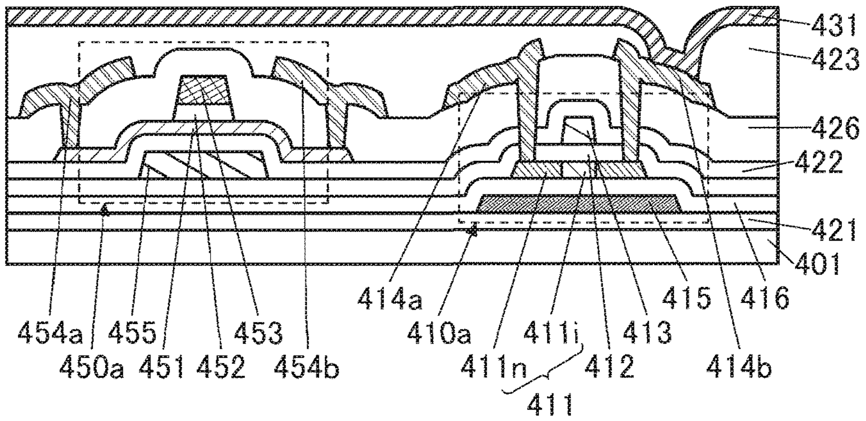

In the structure in FIG. 27C, the insulating layer 452 functioning as the first gate insulating layer of the transistor 450 covers an end portion of the semiconductor layer 451; however, the insulating layer 452 may be processed to have the same or substantially the same top surface shape as the conductive layer 453 as in the transistor 450*a* illustrated in FIG. 27D.

Note that in this specification and the like, the expression "top surface shapes are substantially the same" means that at least outlines of stacked layers partly overlap with each other. For example, the case of processing the upper layer and the lower layer with the use of the same mask pattern or mask patterns that are partly the same is included. However, in some cases, the outlines do not completely overlap with each other and the upper layer is positioned on an inner side of the lower layer or the upper layer is positioned on an outer side of the lower layer; such cases are also represented by the expression "top surface shapes are substantially the same".

Although the example in which the transistor 410*a* corresponds to the transistor M2 and is electrically connected to the pixel electrode is shown here, one embodiment of the present invention is not limited thereto. For example, a structure in which the transistor 450 or the transistor 450*a* corresponds to the transistor M2 may be employed. In that case, the transistor 410*a* corresponds to the transistor M1, the transistor M3, or another transistor.

This embodiment can be combined with the other embodiments as appropriate.

Embodiment 5

In this embodiment, a light-emitting device that can be used in the display apparatus of one embodiment of the present invention will be described.

Figure 28A:
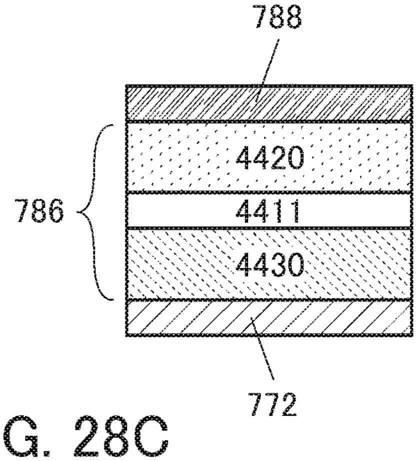
FIG. 28A to FIG. 28F are diagrams illustrating structure examples of a light-emitting device.

As illustrated in FIG. 28A, the light-emitting device includes an EL layer 786 between a pair of electrodes (a lower electrode 772 and an upper electrode 788). The EL layer 786 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between a pair of electrodes, can function as a single light-emitting unit, and the structure in FIG. 28A is referred to as a single structure in this specification.

Figure 28B:
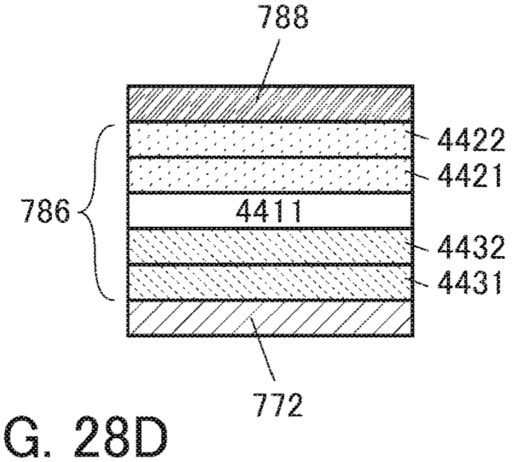

FIG. 28B is a variation example of the EL layer 786 included in the light-emitting device illustrated in FIG. 28A. Specifically, the light-emitting device illustrated in FIG. 28B includes a layer 4431 over the lower electrode 772, a layer 4432 over the layer 4431, the light-emitting layer 4411 over the layer 4432, a layer 4421 over the light-emitting layer 4411, a layer 4422 over the layer 4421, and the upper electrode 788 over the layer 4422. When the lower electrode 772 is an anode and the upper electrode 788 is a cathode, for example, the layer 4431 functions as a hole-injection layer, the layer 4432 functions as a hole-transport layer, the layer 4421 functions as an electron-transport layer, and the layer 4422 functions as an electron-injection layer. Alternatively, when the lower electrode 772 is a cathode and the upper electrode 788 is an anode, the layer 4431 functions as an electron-injection layer, the layer 4432 functions as an electron-transport layer, the layer 4421 functions as a hole-transport layer, and the layer 4422 functions as a hole-injection layer. With such a layer structure, carriers can be efficiently injected to the light-emitting layer 4411, and the efficiency of the recombination of carriers in the light-emitting layer 4411 can be enhanced.

Figure 28C:
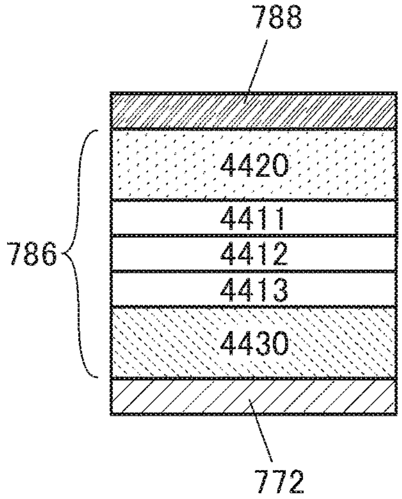
Figure 28D:
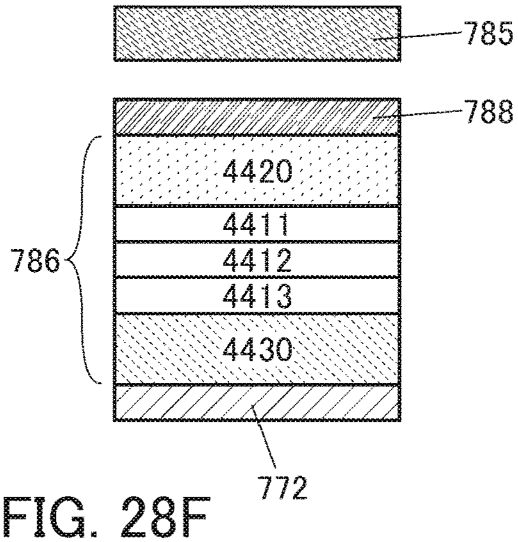

Note that the structure where a plurality of light-emitting layers (light-emitting layers 4411, 4412, and 4413) are provided between the layer 4420 and the layer 4430 as illustrated in FIG. 28C and FIG. 28D is also a variation of the single structure.

Figure 28E:
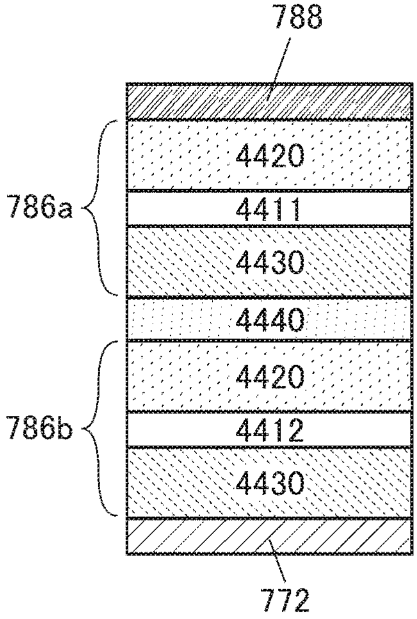
Figure 28F:
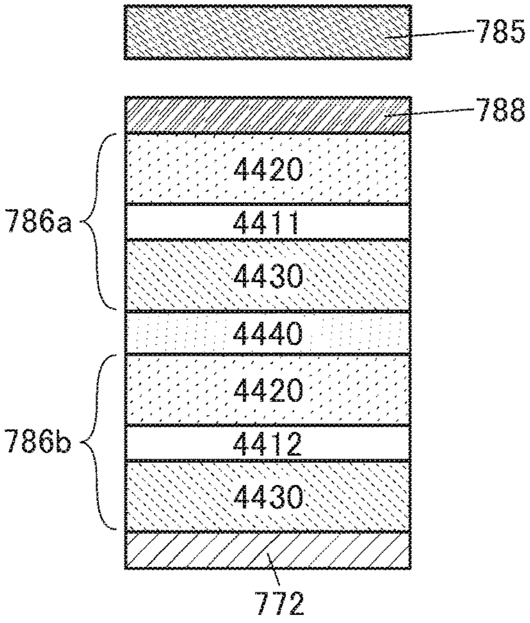

A structure in which a plurality of light-emitting units (an EL layer 786*a* and an EL layer 786*b*) are connected in series with a charge-generation layer 4440 therebetween as illustrated in FIG. 28E or FIG. 28F is referred to as a tandem structure in this specification. Note that a tandem structure may be referred to as a stack structure. The tandem structure enables a light-emitting device capable of high-luminance light emission.

In FIG. 28C and FIG. 28D, light-emitting materials that emit light of the same color, or moreover, the same light-emitting material may be used for the light-emitting layer 4411, the light-emitting layer 4412, and the light-emitting layer 4413. For example, a light-emitting material that emits blue light may be used for the light-emitting layer 4411, the light-emitting layer 4412, and the light-emitting layer 4413. A color conversion layer may be provided as a layer 785 illustrated in FIG. 28D.

Alternatively, light-emitting materials that emit light of different colors may be used for the light-emitting layer 4411, the light-emitting layer 4412, and the light-emitting layer 4413. White light emission can be obtained when the light-emitting layer 4411, the light-emitting layer 4412, and the light-emitting layer 4413 emit light of complementary colors. A color filter (also referred to as a coloring layer) may be provided as the layer 785 illustrated in FIG. 28D. When white light passes through a color filter, light of a desired color can be obtained.

In FIG. 28E and FIG. 28F, light-emitting materials that emit light of the same color, or moreover, the same light-emitting material may be used for the light-emitting layer 4411 and the light-emitting layer 4412. Alternatively, light-emitting materials that emit light of different colors may be used for the light-emitting layer 4411 and the light-emitting layer 4412. White light emission can be obtained when the light-emitting layer 4411 and the light-emitting layer 4412 emit light of complementary colors. FIG. 28F illustrates an example where the layer 785 is further provided. One or both of a color conversion layer and a color filter (coloring layer) can be used as the layer 785.

Note that also in FIG. 28C, FIG. 28D, FIG. 28E, and FIG. 28F, the layer 4420 and the layer 4430 may each have a stacked-layer structure of two or more layers as illustrated in FIG. 28B.

A structure in which light-emitting devices of different emission colors (e.g., blue (B), green (G), and red (R)) are separately formed is referred to as an SBS (Side By Side) structure in some cases.

The emission color of the light-emitting device can be red, green, blue, cyan, magenta, yellow, white, or the like depending on the material that constitutes the EL layer 786. Furthermore, the color purity can be further increased when the light-emitting device has a microcavity structure.

The light-emitting device that emits white light preferably contains two or more kinds of light-emitting substances in the light-emitting layer. To obtain white light emission, two or more light-emitting substances may be selected such that their emission colors are complementary colors. For example, when an emission color of a first light-emitting layer and an emission color of a second light-emitting layer are complementary colors, the light-emitting device can be configured to emit white light as a whole. The same applies to a light-emitting device including three or more light-emitting layers.

The light-emitting layer preferably contains two or more selected from light-emitting substances that emit light of red (R), green (G), blue (B), yellow (Y), orange (O), and the like. Alternatively, the light-emitting layer preferably contains two or more light-emitting substances that emit light containing two or more of spectral components of R, G, and B.

This embodiment can be combined with the other embodiments as appropriate.

Embodiment 6

In this embodiment, electronic devices of one embodiment of the present invention are described with reference to FIG. 29 to FIG. 31.

Electronic devices of this embodiment each include the display apparatus of one embodiment of the present invention in a display portion. The display apparatus according to one embodiment of the present invention can easily achieve higher definition and higher resolution and can achieve high display quality. Thus, the display apparatus of one embodiment of the present invention can be used for a display portion of a variety of electronic devices.

Examples of electronic devices include electronic devices with a relatively large screen, such as a television device, a desktop or laptop personal computer, a monitor of a computer or the like, digital signage, and a large game machine such as a pachinko machine; a digital camera; a digital video camera; a digital photo frame; a mobile phone; a portable game machine; a portable information terminal; and an audio reproducing device.

In particular, the display apparatus of one embodiment of the present invention can have a high resolution, and thus can be suitably used for an electronic device having a relatively small display portion. Examples of such an electronic device include a watch-type or a bracelet-type information terminal device (wearable device), and a wearable device worn on a head, such as a device for VR such as a head-mounted display, a glasses-type device for AR, and a device for MR.

The definition of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, a definition of 4K, 8K, or higher is preferable. The pixel density (resolution) of the display apparatus of one embodiment of the present invention is preferably 100 ppi or higher, further preferably 300 ppi or higher, further preferably 500 ppi or higher, further preferably 1000 ppi or higher, still further preferably 2000 ppi or higher, still further preferably 3000 ppi or higher, still further preferably 5000 ppi or higher, yet further preferably 7000 ppi or higher. With the use of such a display apparatus having one or both of high definition and high resolution, the electronic device can provide higher realistic sensation, sense of depth, and the like in personal use such as portable use and home use. There is no particular limitation on the screen ratio (aspect ratio) of the display apparatus of one embodiment of the present invention. For example, the display apparatus is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, odor, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of a wearable device that can be worn on a head are described with reference to FIG. 29A to FIG. 29D. These wearable devices have one or both of a function of displaying AR contents and a function of displaying VR contents. Note that these wearable devices may have a function of displaying SR or MR contents, in addition to AR and VR contents. The electronic device having a function of displaying contents of at least one of AR, VR, SR, MR, and the like enables the user to reach a higher level of immersion.

Figure 29A:
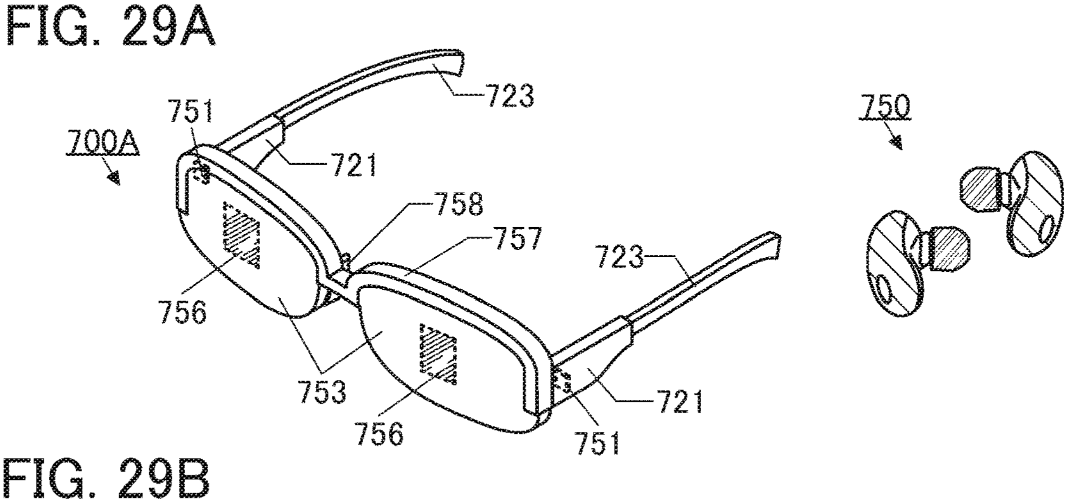
FIG. 29A to FIG. 29D are diagrams illustrating examples of electronic devices.
Figure 29B:
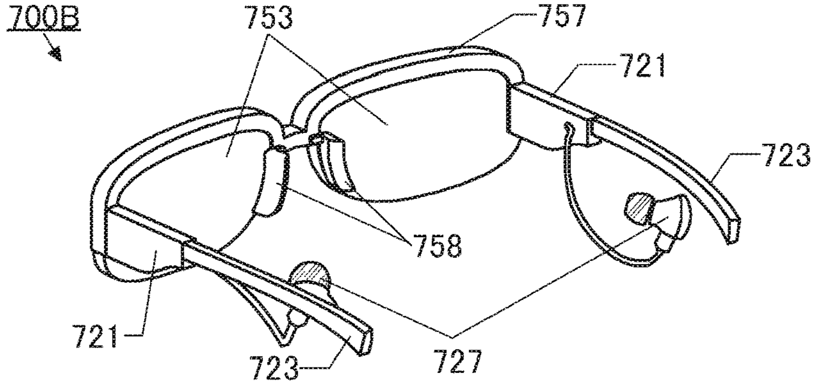

An electronic device 700A illustrated in FIG. 29A and an electronic device 700B illustrated in FIG. 29B each include a pair of display apparatuses 751, a pair of housings 721, a communication portion (not illustrated), a pair of mounting portions 723, a control portion (not illustrated), an image capturing portion (not illustrated), a pair of optical members 753, a frame 757, and a pair of nose pads 758.

The display apparatus of one embodiment of the present invention can be used for the display apparatuses 751. Thus, the electronic devices are capable of performing ultrahigh-resolution display.

The electronic device 700A and the electronic device 700B can each project images displayed on the display apparatuses 751 onto display regions 756 of the optical members 753. Since the optical members 753 have a light-transmitting property, a user can see images displayed on the display regions, which are superimposed on transmission images seen through the optical members 753. Accordingly, the electronic device 700A and the electronic device 700B are electronic devices capable of AR display.

In the electronic device 700A and the electronic device 700B, a camera capable of capturing images of the front side may be provided as the image capturing portion. Furthermore, when the electronic device 700A and the electronic device 700B are provided with an acceleration sensor such as a gyroscope sensor, the orientation of the user's head can be sensed and an image corresponding to the orientation can be displayed on the display regions 756.

The communication portion includes a wireless communication device, and a video signal and the like can be supplied by the wireless communication device. Instead of or in addition to the wireless communication device, a connector that can be connected to a cable for supplying a video signal and a power supply potential may be provided.

The electronic device 700A and the electronic device 700B are provided with a battery so that they can be charged wirelessly and/or by wire.

A touch sensor module may be provided in the housing 721. The touch sensor module has a function of detecting a touch on the outer surface of the housing 721. Detecting a tap operation, a slide operation, or the like by the user with the touch sensor module enables various types of processing. For example, a video can be paused or restarted by a tap operation, and can be fast-forwarded or fast-reversed by a slide operation. When the touch sensor module is provided in each of the two housings 721, the range of the operation can be increased.

Various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

In the case of using an optical touch sensor, a photoelectric conversion device (also referred to as a photoelectric conversion element) can be used as a light-receiving device (also referred to as a light-receiving element). One or both of an inorganic semiconductor and an organic semiconductor can be used for an active layer of the photoelectric conversion device.

Figure 29C:
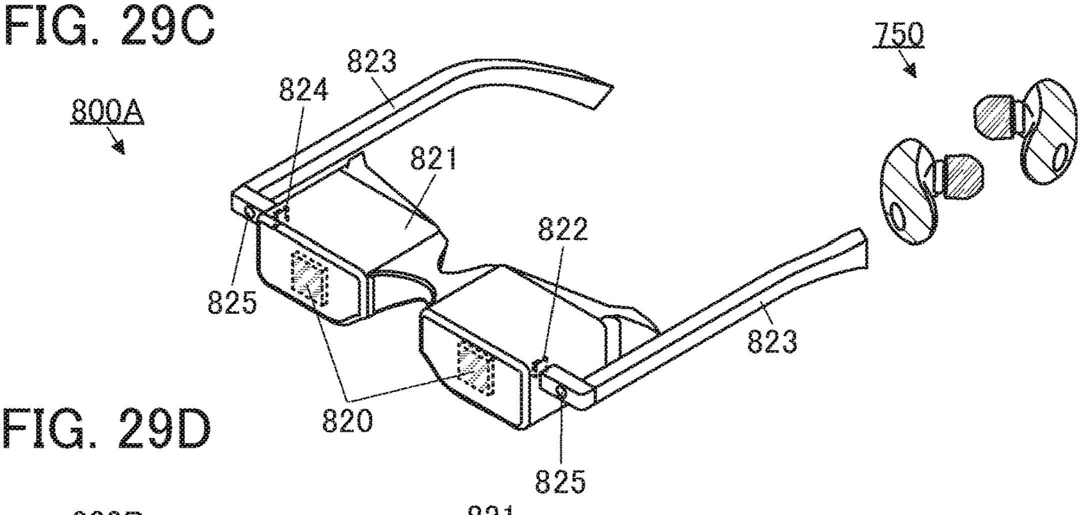
Figure 29D:
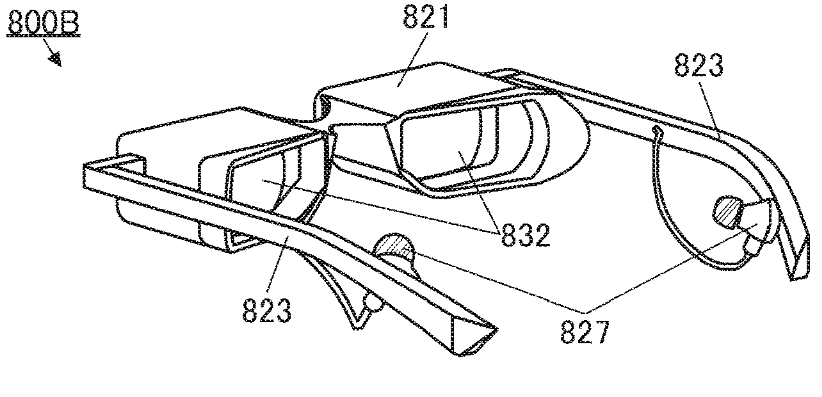

An electronic device 800A illustrated in FIG. 29C and an electronic device 800B illustrated in FIG. 29D each include a pair of display portions 820, a housing 821, a communication portion 822, a pair of wearing portions 823, a control portion 824, a pair of image capturing portions 825, and a pair of lenses 832.

The display apparatus of one embodiment of the present invention can be used in the display portions 820. Thus, the electronic devices are capable of performing ultrahigh-resolution display. Such electronic devices provide an enhanced sense of immersion to the user.

The display portions 820 are positioned inside the housing 821 so as to be seen through the lenses 832. When the pair of display portions 820 display different images, three-dimensional display using parallax can be performed.

The electronic device 800A and the electronic device 800B can be regarded as electronic devices for VR. The user who wears the electronic device 800A or the electronic device 800B can see images displayed on the display portions 820 through the lenses 832.

The electronic device 800A and the electronic device 800B preferably include a mechanism for adjusting the lateral positions of the lenses 832 and the display portions 820 so that the lenses 832 and the display portions 820 are positioned optimally in accordance with the positions of the user's eyes. Moreover, the electronic device 800A and the electronic device 800B preferably include a mechanism for adjusting focus by changing the distance between the lenses 832 and the display portions 820.

The electronic device 800A or the electronic device 800B can be mounted on the user's head with the mounting portions 823. FIG. 29C or the like illustrates an example where the mounting portion 823 has a shape like a temple (also referred to as a joint or the like) of glasses; however, one embodiment of the present invention is not limited thereto. The mounting portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to support a plurality of fields of view, such as a telescope field of view and a wide field of view.

Although an example where the image capturing portions 825 are provided is shown here, a range sensor capable of measuring a distance between the user and an object (hereinafter also referred to as a sensing portion) just needs to be provided. In other words, the image capturing portion 825 is one embodiment of the sensing portion. As the sensing portion, an image sensor or a distance image sensor such as LIDAR (Light Detection and Ranging) can be used, for example. By using images obtained by the camera and images obtained by the range image sensor, more information can be obtained and a gesture operation with higher accuracy is possible.

The electronic device 800A may include a vibration mechanism that functions as bone-conduction earphones. For example, any one or more of the display portion 820, the housing 821, and the mounting portion 823 can employ a structure including the vibration mechanism. Thus, without additionally requiring an audio device such as headphones, earphones, or a speaker, the user can enjoy video and sound only by wearing the electronic device 800A.

The electronic device 800A and the electronic device 800B may each include an input terminal. To the input terminal, a cable for supplying a video signal from a video output device or the like, power for charging the battery provided in the electronic device, and the like can be connected.

The electronic device of one embodiment of the present invention may have a function of performing wireless communication with earphones 750. The earphones 750 include a communication portion (not illustrated) and has a wireless communication function. The earphones 750 can receive information (e.g., audio data) from the electronic device with the wireless communication function. For example, the electronic device 700A in FIG. 29A has a function of transmitting information to the earphones 750 with the wireless communication function. As another example, the electronic device 800A illustrated in FIG. 29C has a function of transmitting information to the earphones 750 with the wireless communication function.

The electronic device may include an earphone portion. The electronic device 700B in FIG. 29B includes earphone portions 727. For example, the earphone portion 727 and the control portion can be connected to each other by wire. Part of a wiring that connects the earphone portion 727 and the control portion may be positioned inside the housing 721 or the mounting portion 723.

Similarly, the electronic device 800B illustrated in FIG. 29D includes earphone portions 827. For example, the earphone portion 827 and the control portion 824 are connected to each other by wire. Part of a wiring that connects the earphone portion 827 and the control portion 824 may be positioned inside the housing 821 or the mounting portion 823. Alternatively, the earphone portions 827 and the mounting portions 823 may include magnets. This is preferable because the earphone portions 827 can be fixed to the mounting portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of what is called a headset by including the audio input mechanism.

As described above, both the glasses-type device (e.g., the electronic device 700A and the electronic device 700B) and the goggles-type device (e.g., the electronic device 800A and the electronic device 800B) are preferable as the electronic device of one embodiment of the present invention.

The electronic device of one embodiment of the present invention can transmit information to earphones by wire or wirelessly.

Figure 30A:
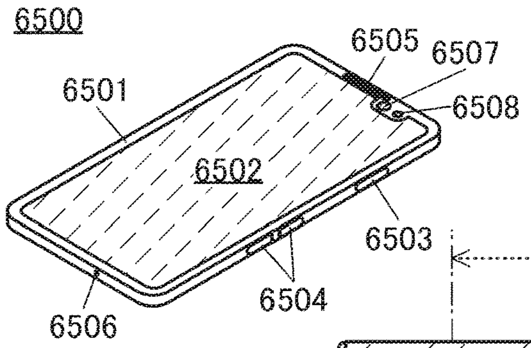
FIG. 30A to FIG. 30F are diagrams illustrating examples of electronic devices.

An electronic device 6500 illustrated in FIG. 30A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used for the display portion 6502.

Figure 30B:
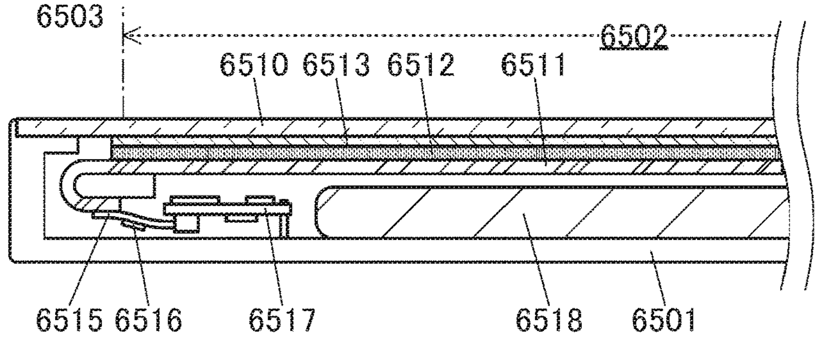

FIG. 30B is a schematic cross-sectional view including an end portion of the housing 6501 on the microphone 6506 side.

A protection member 6510 having a light-transmitting property is provided on a display surface side of the housing 6501, and a display apparatus 6511, an optical member 6512, a touch sensor panel 6513, a printed circuit board 6517, a battery 6518, and the like are provided in a space surrounded by the housing 6501 and the protection member 6510.

The display apparatus 6511, the optical member 6512, and the touch sensor panel 6513 are fixed to the protection member 6510 with an adhesive layer (not illustrated).

Part of the display apparatus 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display apparatus 6511. Thus, an extremely lightweight electronic device can be achieved. Since the display apparatus 6511 is extremely thin, the battery 6518 with high capacity can be mounted without an increase in the thickness of the electronic device. Moreover, part of the display apparatus 6511 is folded back so that a connection portion with the FPC 6515 is provided on the back side of a pixel portion, whereby an electronic device with a narrow bezel can be achieved.

Figure 30C:
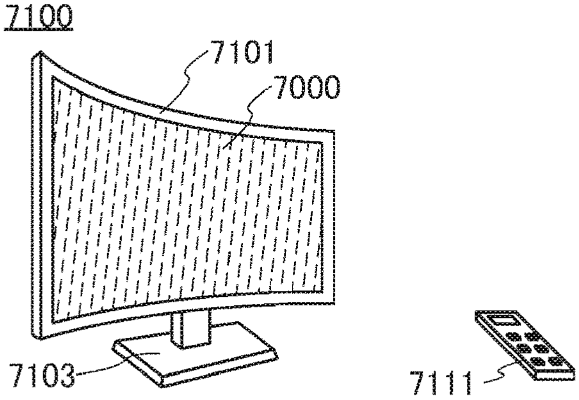

FIG. 30C illustrates an example of a television device. In a television device 7100, a display portion 7000 is incorporated in a housing 7101. Here, the housing 7101 is supported by a stand 7103.

The display apparatus of one embodiment of the present invention can be used for the display portion 7000.

Operation of the television device 7100 illustrated in FIG. 30C can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be controlled and videos displayed on the display portion 7000 can be operated.

Note that the television device 7100 has a structure in which a receiver, a modem, and the like are provided. A general television broadcast can be received with the receiver. When the television device is connected to a communication network by wire or wirelessly via the modem, one-way (from a transmitter to a receiver) or two-way (between a transmitter and a receiver or between receivers, for example) data communication can be performed.

Figure 30D:
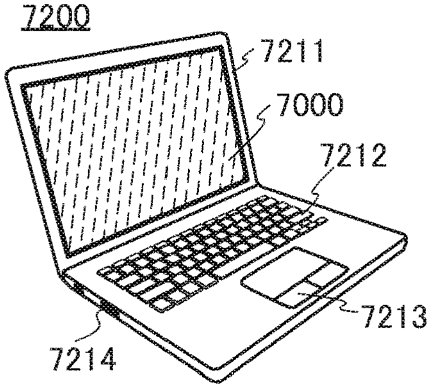

FIG. 30D illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display apparatus of one embodiment of the present invention can be used for the display portion 7000.

Figure 30E:
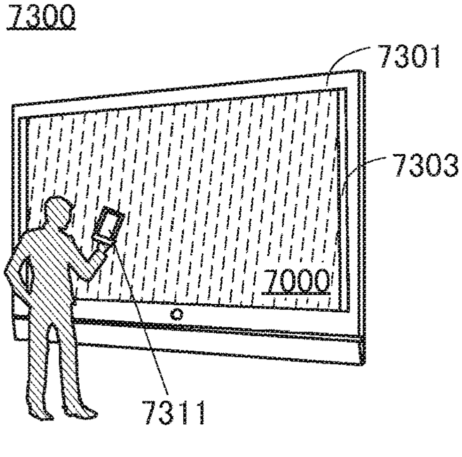
Figure 30F:
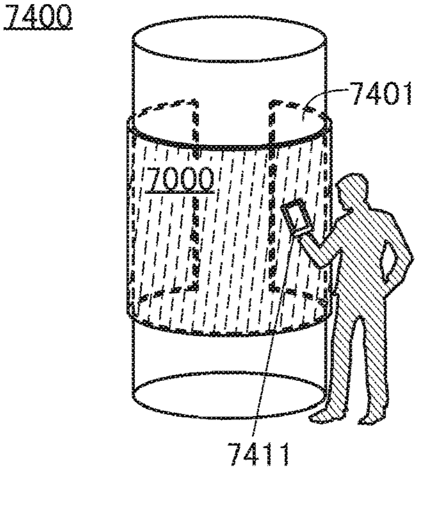

FIG. 30E and FIG. 30F illustrate examples of digital signage.

Digital signage 7300 illustrated in FIG. 30E includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 30F is digital signage 7400 attached to a cylindrical pillar 7401. The digital signage 7400 includes the display portion 7000 provided along a curved surface of the pillar 7401.

The display apparatus of one embodiment of the present invention can be used for the display portion 7000 illustrated in each of FIG. 30E and FIG. 30F.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 30E and FIG. 30F, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices illustrated in FIG. 31A to FIG. 31G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 31A to FIG. 31G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. In addition, the electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 31A to FIG. 31G are described below.

Figure 31A:
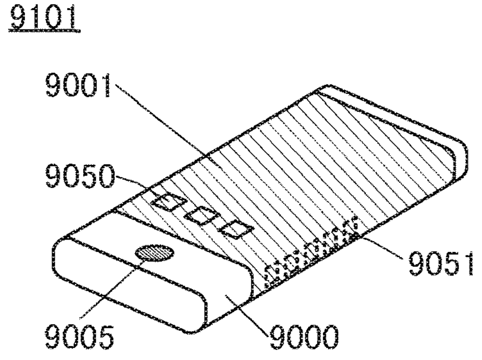
FIG. 31A to FIG. 31G are diagrams illustrating examples of electronic devices.

FIG. 31A is a perspective view illustrating a portable information terminal 9101. The portable information terminal 9101 can be used as a smartphone, for example. Note that the portable information terminal 9101 may include the speaker 9003, the connection terminal 9006, the sensor 9007, or the like. The portable information terminal 9101 can display characters and image information on its plurality of surfaces. FIG. 31A illustrates an example where three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 31B:
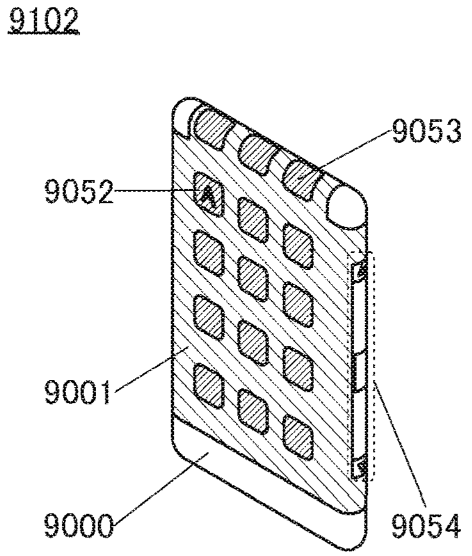

FIG. 31B is a perspective view illustrating a portable information terminal 9102. The portable information terminal 9102 has a function of displaying information on three or more surfaces of the display portion 9001. Here, an example is illustrated in which information 9052, information 9053, and information 9054 are displayed on different surfaces. For example, a user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 31C:
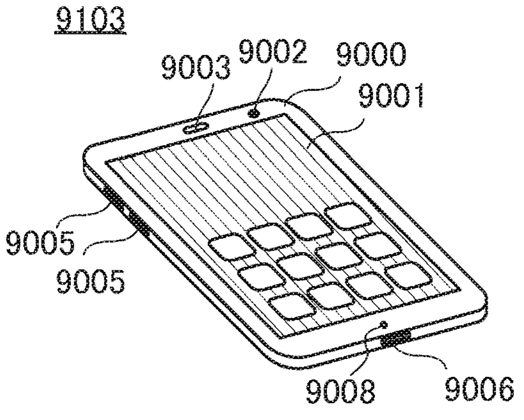

FIG. 31C is a perspective view illustrating a tablet terminal 9103. The tablet terminal 9103 is capable of executing a variety of applications such as mobile phone calls, e-mailing, viewing and editing texts, music reproduction, Internet communication, and a computer game, for example. The tablet terminal 9103 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 31D:
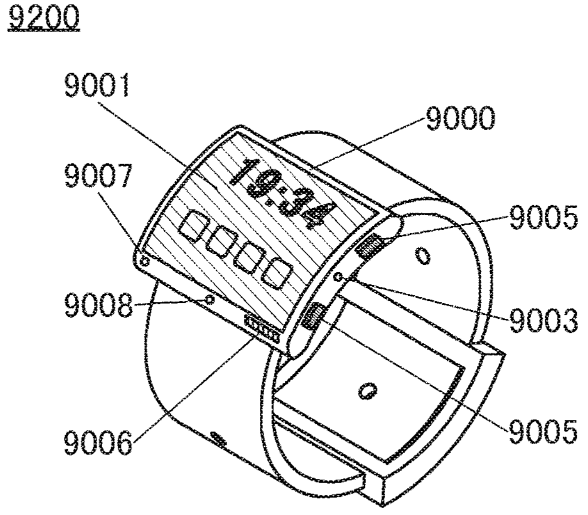

FIG. 31D is a perspective view illustrating a watch-type portable information terminal 9200. For example, the portable information terminal 9200 can be used as a Smartwatch (registered trademark). The display surface of the display portion 9001 is curved, and display can be performed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 31E:
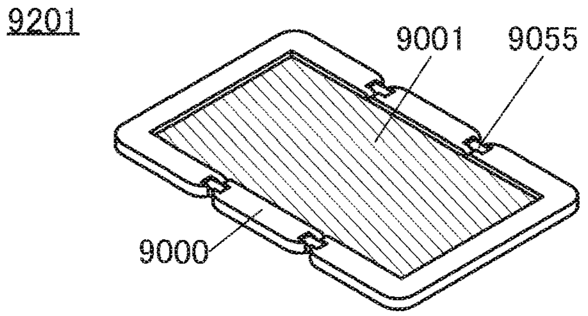
Figure 31F:
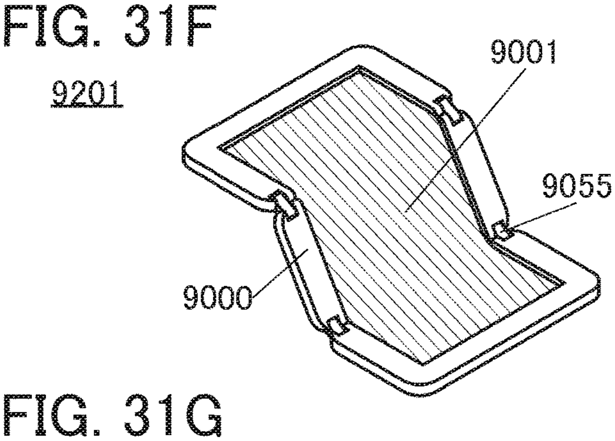
Figure 31G:
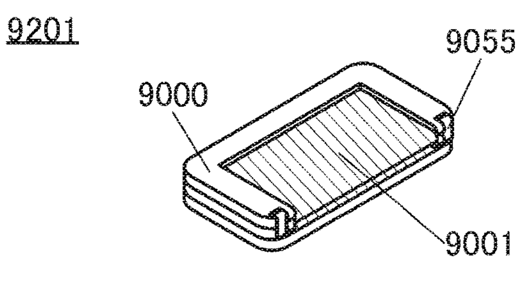

FIG. 31E to FIG. 31G are perspective views illustrating a foldable portable information terminal 9201. FIG. 31E is a perspective view of an opened state of the portable information terminal 9201, FIG. 31G is a perspective view of a folded state thereof, and FIG. 31F is a perspective view of a state in the middle of change from one of FIG. 31E and FIG. 31G to the other. The portable information terminal 9201 is highly portable in the folded state and is highly browsable in the opened state because of a seamless large display region. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

This embodiment can be combined with the other embodiments as appropriate.

REFERENCE NUMERALS

91*a*: thickness, 91*b*: thickness, 91*c*: thickness, 92*a*: thickness, 92*b*: thickness, 92*c*: thickness, 93: thickness, 94: thickness, 95*a*: distance, 95*b*: distance, 95*c*: distance,

96*a*: distance, 96*b*: distance, 96*c*: distance, 100: display apparatus, 100A: display apparatus, 100B: display apparatus, 100C: display apparatus, 100D: display apparatus, 100E: display apparatus, 100F: display apparatus, 100G: display apparatus, 101: layer, 110: pixel, 110*a*: subpixel, 110*b*: subpixel, 110*c*: subpixel, 110*d*: subpixel, 111: pixel electrode, 111*a*: pixel electrode, 111*b*: pixel electrode, 111*c*: pixel electrode, 111*d*: pixel electrode, 112*a*: conductive layer, 112*b*: conductive layer, 112*c*: conductive layer, 113: layer, 113*a*: layer, 113A: layer, 113*b*: layer, 113B: layer, 113*c*: layer, 113C: layer, 113*d*: layer, 114: common layer, 115: common electrode, 117: light-blocking layer, 118: mask layer, 118*a*: mask layer, 118A: mask layer, 118*b*: mask layer, 118B: mask layer, 118*c*: mask layer, 118C: mask layer, 119*a*: mask layer, 119A: mask layer, 119*b*: mask layer, 119B: mask layer, 119C: mask layer, 120: substrate, 122: resin layer, 123: conductive layer, 124*a*: pixel, 124*b*: pixel, 125: insulating layer, 125A: insulating film, 126*a*: conductive layer, 126*b*: conductive layer, 126*c*: conductive layer, 127: insulating layer, 127*a*: insulating layer, 128: layer, 129*a*: conductive layer, 129*b*: conductive layer, 129*c*: conductive layer, 130: light-emitting device, 130*a*: light-emitting device, 130*b*: light-emitting device, 130B: light-emitting device, 130*c*: light-emitting device, 130G: light-emitting device, 130R: light-emitting device, 131: protective layer, 139: region, 140: connection portion, 142: adhesive layer, 150: light-receiving device, 151: substrate, 152: substrate, 162: display portion, 164: circuit, 165: wiring, 166: conductive layer, 172: FPC, 173: IC, 190*a*: resist mask, 190*b*: resist mask, 190*c*: resist mask, 190*g*: mask, 198: conductive layer, 198_1: conductive layer, 198_2: conductive layer, 198_2*f*: conductive film, 198_3: conductive layer, 198*a*: conductive layer, 198*b*: conductive layer, 198*c*: conductive layer, 199: conductive layer, 201: transistor, 204: connection portion, 205: transistor, 209: transistor, 210: transistor, 211: insulating layer, 213: insulating layer, 214: insulating layer, 215: insulating layer, 218: insulating layer, 221: conductive layer, 222*a*: conductive layer, 222*b*: conductive layer, 223: conductive layer, 225: insulating layer, 231: semiconductor layer, 231*i*: channel formation region, 231*n*: low-resistance region, 240: capacitor, 241: conductive layer, 242: connection layer, 243: insulating layer, 245: conductive layer, 251: conductive layer, 252: conductive layer, 254: insulating layer, 255*a*: insulating layer, 255*b*: insulating layer, 255*c*: insulating layer, 256: plug, 261: insulating layer, 262: insulating layer, 263: insulating layer, 264: insulating layer, 265: insulating layer, 271: plug, 274: plug, 274*a*: conductive layer, 274*b*: conductive layer, 280: display module, 281: display portion, 282: circuit portion, 283: pixel circuit portion, 283*a*: pixel circuit, 284: pixel portion, 284*a*: pixel, 285: terminal portion, 286: wiring portion, 290: FPC, 291: substrate, 292: substrate, 301: substrate, 301A: substrate, 301B: substrate, 310: transistor, 310A: transistor, 310B: transistor, 311: conductive layer, 312: low-resistance region, 313: insulating layer, 314: insulating layer, 315: element isolation layer, 320: transistor, 320A: transistor, 320B: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 335: insulating layer, 336: insulating layer, 341: conductive layer, 342: conductive layer, 343: plug, 344: insulating layer, 345: insulating layer, 346: insulating layer, 347: bump, 348: adhesive layer, 351: substrate, 352: finger, 353: layer, 355: functional layer, 357: layer, 359: substrate, 400: display apparatus, 401: substrate, 402: driver circuit portion, 403: driver circuit portion, 404: display portion, 405: pixel, 405B: subpixel, 405G: subpixel, 405R: subpixel, 410: transistor, 410*a*: transistor, 411: semiconductor layer, 411*i*: channel formation region, 411*n*: low-resistance region, 412: insulating layer, 413: conductive layer, 414*a*: conductive layer, 414*b*: conductive layer, 415: conductive layer, 416: insulating layer, 421: insulating layer, 422: insulating layer, 423: insulating layer, 426: insulating layer, 430: pixel, 431: conductive layer, 450: transistor, 450*a*: transistor, 451: semiconductor layer, 452: insulating layer, 453: conductive layer, 454*a*: conductive layer, 454*b*: conductive layer, 455: conductive layer, 700A: electronic device, 700B: electronic device, 721: housing, 723: mounting portion, 727: earphone portion, 750: earphone, 751: display apparatus, 753: optical member, 756: display region, 757: frame, 758: nose pad, 772: lower electrode, 785: layer, 786: EL layer, 786*a*: EL layer, 786*b*: EL layer, 788: upper electrode, 800A: electronic device, 800B: electronic device, 820: display portion, 821: housing, 822: communication portion, 823: mounting portion, 824: control portion, 825: image capturing portion, 827: earphone portion, 832: lens, 4411: light-emitting layer, 4412: light-emitting layer, 4413: light-emitting layer, 4420: layer, 4421: layer, 4422: layer, 4430: layer, 4431: layer, 4432: layer, 4440: charge-generation layer, 6500: electronic device, 6501: housing, 6502: display portion, 6503: power button, 6504: button, 6505: speaker, 6506: microphone, 6507: camera, 6508: light source, 6510: protection member, 6511: display apparatus, 6512: optical member, 6513: touch sensor panel, 6515: FPC, 6516: IC, 6517: printed board, 6518: battery, 7000: display portion, 7100: television device, 7101: housing, 7103: stand, 7111: remote controller, 7200: notebook personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9002: camera, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9103: tablet terminal, 9200: portable information terminal, 9201: portable information terminal

The invention claimed is:

1. A display apparatus comprising a first light-emitting device, a second light-emitting device, a first insulating layer, and a first resin layer, wherein the first light-emitting device comprises a first pixel electrode, a first EL layer over the first pixel electrode, and a common electrode over the first EL layer, wherein the first insulating layer is covered with the common electrode, wherein the second light-emitting device comprises a second pixel electrode, a second EL layer over the second pixel electrode, and the common electrode over the second EL layer, wherein the first insulating layer is in contact with a side surface of the first EL layer and a side surface of the second EL layer, wherein the first resin layer is provided over the first insulating layer, wherein the first resin layer is provided between the first light-emitting device and the second light-emitting device, and wherein a thickness of the first pixel electrode is smaller than a thickness of the second pixel electrode, and wherein a thickness of the first EL layer is larger than a thickness of the second EL layer.

2. The display apparatus according to claim 1, wherein a total thickness of the first pixel electrode and the first EL layer is denoted by t1, wherein a total thickness of the second pixel electrode and the second EL layer is denoted by t2, and wherein a difference between the t1 and the t2 is less than or equal to 100 nm.

3. The display apparatus according to claim 1, wherein the first light-emitting device exhibits red, and wherein the second light-emitting device exhibits green.

4. The display apparatus according to claim 1, wherein the first light-emitting device exhibits green, and wherein the second light-emitting device exhibits blue.

5. The display apparatus according to claim 1, wherein the first EL layer comprises a first layer and a common layer over the first layer, wherein the second EL layer comprises a second layer and the common layer over the second layer, wherein the common layer comprises a material having a high electron-injection property, wherein the common layer is in contact with a top surface of the first layer, a top surface of the second layer, and a top surface of the first resin layer, and wherein the common electrode is in contact with a top surface of the common layer.

6. A display apparatus comprising a first light-emitting device, a second light-emitting device placed adjacent to the first light-emitting device, a third light-emitting device placed adjacent to the second light-emitting device, a first insulating layer, and a first resin layer, wherein the first light-emitting device comprises a first pixel electrode, a first EL layer over the first pixel electrode, and a common electrode over the first EL layer and the first insulating layer, wherein the second light-emitting device comprises a second pixel electrode, a second EL layer over the second pixel electrode, and the common electrode over the second EL layer and the first insulating layer, wherein the third light-emitting device comprises a third pixel electrode, a third EL layer over the third pixel electrode, and the common electrode over the third EL layer and the first insulating layer, wherein the first insulating layer comprises a first region in contact with a side surface of the first EL layer and a side surface of the second EL layer and a second region in contact with the side surface of the second EL layer and a side surface of the third EL layer, wherein the first resin layer comprises a third region over the first region in the first insulating layer and a fourth region over the second region in the first insulating layer, wherein the third region is provided between the first light-emitting device and the second light-emitting device, wherein the fourth region is provided between the second light-emitting device and the third light-emitting device, wherein a thickness of the second pixel electrode is larger than a thickness of the first pixel electrode and smaller than a thickness of the third pixel electrode, and wherein a thickness of the second EL layer is smaller than the thickness of the first EL layer and larger than a thickness of the third EL layer.

7. The display apparatus according to claim 6, wherein a total thickness of the first pixel electrode and the first EL layer is denoted by t1, wherein a total thickness of the second pixel electrode and the second EL layer is denoted by t2, wherein a total thickness of the third pixel electrode and the third EL layer is denoted by t3, wherein a difference between t1 and t2 is less than or equal to 100 nm, and wherein a difference between t1 and t3 is less than or equal to 100 nm.

8. The display apparatus according to claim 6, wherein the first light-emitting device emits red light, wherein the second light-emitting device emits green light, and wherein the third light-emitting device emits blue light.

9. The display apparatus according to claim 6, wherein the first EL layer comprises a first layer and a common layer over the first layer, wherein the second EL layer comprises a second layer and the common layer over the second layer, wherein the third EL layer comprises a third layer and the common layer over the second layer, wherein the common layer comprises a material having a high electron-injection property, wherein the common layer is in contact with a top surface of the first layer, a top surface of the second layer, a top surface of the third layer, a top surface of the third region, and a top surface of the fourth region, and wherein the common electrode is in contact with a top surface of the common layer.

10. A display apparatus comprising a first light-emitting device, a second light-emitting device placed adjacent to the first light-emitting device, a third light-emitting device placed adjacent to the second light-emitting device, a first insulating layer, a second insulating layer, a first resin layer, and a second resin layer, wherein the first light-emitting device comprises a first pixel electrode, a first EL layer over the first pixel electrode, and a common electrode over the first EL layer, the first insulating layer, and the second insulating layer, wherein the second light-emitting device comprises a second pixel electrode, a second EL layer over the second pixel electrode, and the common electrode over the second EL layer, the first insulating layer, and the second insulating layer, wherein the third light-emitting device comprises a third pixel electrode, a third EL layer over the third pixel electrode, and the common electrode over the third EL layer, the first insulating layer, and the second insulating layer, wherein the first insulating layer is provided between the first light-emitting device and the second light-emitting device, wherein the second insulating layer is provided between the second light-emitting device and the third light-emitting device, wherein the first resin layer is provided over the first insulating layer,
wherein the first resin layer is provided between the first light-emitting device and the second light-emitting device,
wherein the second resin layer is provided over the second insulating layer,
wherein the second resin layer is provided between the second light-emitting device and the third light-emitting device,
wherein a thickness of the second pixel electrode is larger than a thickness of the first pixel electrode and smaller than a thickness of the third pixel electrode, and
wherein a thickness of the second EL layer is smaller than the thickness of the first EL layer and larger than a thickness of the third EL layer.

11. The display apparatus according to claim 10,
wherein a total thickness of the first pixel electrode and the first EL layer is denoted by t1,
wherein a total thickness of the second pixel electrode and the second EL layer is denoted by t2,
wherein a total thickness of the third pixel electrode and the third EL layer is denoted by t3,
wherein a difference between t1 and t2 is less than or equal to 100 nm, and
wherein a difference between t1 and t3 is less than or equal to 100 nm.

12. The display apparatus according to claim 10,
wherein the first light-emitting device emits red light,
wherein the second light-emitting device emits green light, and
wherein the third light-emitting device emits blue light.

13. The display apparatus according to claim 10,
wherein the first EL layer comprises a first layer and a common layer over the first layer,
wherein the second EL layer comprises a second layer and the common layer over the second layer,
wherein the third EL layer comprises a third layer and the common layer over the second layer,
wherein the common layer comprises a material having a high electron-injection property,
wherein the common layer is in contact with a top surface of the first resin layer, a top surface of the second resin layer, a top surface of the first layer, a top surface of the second layer, a top surface of the third layer, and
wherein the common electrode is in contact with a top surface of the common layer.

* * * * *